US011830726B2

(12) United States Patent
Randhawa et al.

(10) Patent No.: US 11,830,726 B2
(45) Date of Patent: Nov. 28, 2023

(54) SUBNANOMETER-LEVEL LIGHT-BASED SUBSTRATE CLEANING MECHANISM

(71) Applicant: Planar Semiconductor Corporation Pte. Ltd., Singapore (SG)

(72) Inventors: Rubinder S. Randhawa, Fremont, CA (US); Harry Christov, Campbell, CA (US)

(73) Assignee: Planar Semiconductor Corporation Pte. Ltd., Singapore (SG)

( * ) Notice: Subject to any disclaimer, the term of this patent is extended or adjusted under 35 U.S.C. 154(b) by 25 days.

(21) Appl. No.: 17/350,869

(22) Filed: Jun. 17, 2021

(65) Prior Publication Data

US 2021/0313173 A1   Oct. 7, 2021

Related U.S. Application Data

(62) Division of application No. 16/478,432, filed as application No. PCT/US2018/016860 on Feb. 5, 2018, now Pat. No. 11,069,521.

(Continued)

(51) Int. Cl.
*H01L 21/02*   (2006.01)
*B08B 7/00*    (2006.01)
(Continued)

(52) U.S. Cl.
CPC ...... *H01L 21/02098* (2013.01); *B08B 7/0035* (2013.01); *B08B 7/0042* (2013.01); *H01L 21/67115* (2013.01); *H01L 21/68764* (2013.01)

(58) Field of Classification Search
CPC ......... H01L 21/67115; H01L 21/68764; H01L 21/68728; H01L 21/6719
See application file for complete search history.

(56) References Cited

U.S. PATENT DOCUMENTS 3,849,906 A * 11/1974 Hansen ............... F26B 21/004
  34/229
5,531,857 A * 7/1996 Engelsberg ........ B23K 26/1436
  134/1

(Continued)

FOREIGN PATENT DOCUMENTS

CN       1679143 A   10/2005
CN     101405091 A    4/2009
(Continued)

OTHER PUBLICATIONS

"U.S. Appl. No. 16/478,337, Non Final Office Action dated Aug. 20, 20", 13 pgs.

(Continued)

*Primary Examiner* — Thien S Tran
(74) *Attorney, Agent, or Firm* — Schwegman, Lundberg & Woessner, P.A.

(57) ABSTRACT

Various embodiments comprise apparatuses and related methods for cleaning a substrate. In one embodiment, an apparatus includes a substrate holder to hold and rotate the substrate at various speeds. An optional inner shield and an optional outer shield, when in a closed position, surround the substrate holder during operation of the apparatus. Each of the inner shield and the outer shield can operate independently in at least one of rotational speed and direction from the other shield. At least one of a front-side laser and a back-side laser are arranged to clean one or both sides of the substrate and edges of the substrate substantially concurrently or independently by impinging a light onto at least one surface of the substrate. A gas flow, combined with a high rotational-speed of the shields and substrate, assists in removing effluents from the substrate. Additional apparatuses and methods of forming the apparatuses are disclosed.

23 Claims, 27 Drawing Sheets

Related U.S. Application Data

(60) Provisional application No. 62/518,311, filed on Jun. 12, 2017, provisional application No. 62/455,425, filed on Feb. 6, 2017.

(51) Int. Cl.
  *H01L 21/67* (2006.01)
  *H01L 21/687* (2006.01)

(56) References Cited

U.S. PATENT DOCUMENTS

| | | | |
|---|---|---|---|
| 6,225,235 | B1 | 5/2001 | Kunze-Concewitz |
| 6,507,031 | B1 | 1/2003 | Jinbo et al. |
| 6,516,816 | B1 | 2/2003 | Husain et al. |
| 10,892,172 | B2 | 1/2021 | Randhawa et al. |
| 2003/0079762 | A1 | 5/2003 | Husain et al. |
| 2003/0106881 | A1 | 6/2003 | Lee et al. |
| 2004/0020520 | A1 | 2/2004 | Kim et al. |
| 2004/0224508 | A1 | 11/2004 | Engel et al. |
| 2005/0026455 | A1 | 2/2005 | Hamada et al. |
| 2005/0170653 | A1* | 8/2005 | Horiuchi ............ H01L 21/02074 257/E21.585 |
| 2006/0042666 | A1 | 3/2006 | Tsujimura |
| 2006/0174920 | A1 | 8/2006 | Randhawa |
| 2007/0246081 | A1 | 10/2007 | Lu et al. |
| 2008/0252865 | A1* | 10/2008 | Nagasaka ............ G03F 7/7085 355/30 |
| 2009/0032062 | A1 | 2/2009 | Randhawa et al. |
| 2009/0038637 | A1* | 2/2009 | LeClaire ............... B08B 7/0042 134/1 |
| 2009/0075060 | A1 | 3/2009 | Miller et al. |
| 2009/0250079 | A1 | 10/2009 | Yoshihara et al. |
| 2011/0083696 | A1* | 4/2011 | Nasr ..................... B08B 7/0035 134/1.1 |
| 2011/0139759 | A1 | 6/2011 | Millman, Jr. et al. |
| 2014/0154099 | A1 | 6/2014 | Sivaramakrishnan et al. |
| 2014/0367898 | A1 | 12/2014 | Hebert et al. |
| 2015/0059642 | A1 | 3/2015 | Furuya |
| 2019/0371629 | A1 | 12/2019 | Randhawa et al. |
| 2019/0378729 | A1 | 12/2019 | Randhawa et al. |
| 2020/0219722 | A1 | 7/2020 | Randhawa et al. |

FOREIGN PATENT DOCUMENTS

| | | |
|---|---|---|
| CN | 101540268 B | 12/2012 |
| CN | 110603628 A | 12/2019 |
| CN | 110603629 A | 12/2019 |
| CN | 110622290 A | 12/2019 |
| JP | H04119524 A | 4/1992 |
| JP | 07192996 A | 7/1995 |
| JP | H07192996 A | 7/1995 |
| JP | H1064864 A | 3/1998 |
| JP | H10189499 A | 7/1998 |
| JP | 10242098 A * | 9/1998 |
| JP | 10242098 A | 9/1998 |
| JP | H10242098 A | 9/1998 |
| JP | H1126410 A | 1/1999 |
| JP | 2000124181 A | 4/2000 |
| JP | 2001127033 A | 5/2001 |
| JP | 2007335868 A | 12/2007 |
| JP | 2009147061 A | 7/2009 |
| JP | 2014504004 A | 2/2014 |
| JP | 2020-505793 A | 2/2020 |
| KR | 100749543 B1 | 8/2007 |
| KR | 100757848 B1 | 9/2007 |
| KR | 100787996 B1 | 12/2007 |
| TW | 201624532 | 7/2016 |
| TW | 201841235 A | 11/2018 |
| TW | 201842609 A | 12/2018 |
| TW | I760430 B | 4/2022 |
| WO | WO-2004061926 A1 | 7/2004 |
| WO | WO-2009075060 A1 | 6/2009 |
| WO | 2018144446 | 8/2018 |
| WO | 2018145001 | 8/2018 |
| WO | 2018145070 | 8/2018 |
| WO | WO-2018144446 A1 | 8/2018 |
| WO | WO-2018145001 A1 | 8/2018 |
| WO | WO-2018145070 | 8/2018 |

OTHER PUBLICATIONS

"U.S. Appl. No. 16/478,337, Notice of Allowance dated Dec. 24, 20", 14 pgs.

"U.S. Appl. No. 16/478,337, Preliminary Amendment filed Jul. 16, 2019", 9 pgs.

"U.S. Appl. No. 16/478,337, Response filed Jul. 16, 2020 to Restriction Requirement dated Mar. 16, 2020", 9 pgs.

"U.S. Appl. No. 16/478,337, Response filed Nov. 20, 2020 to Non Final Office Action dated Aug. 20, 2020", 15 pgs.

"U.S. Appl. No. 16/478,337, Restriction Requirement dated Mar. 16, 2020", 9 pgs.

"U.S. Appl. No. 16/478,407, Non Final Office Action dated Apr. 22, 2020", 17 pgs.

"U.S. Appl. No. 16/478,407, Notice of Allowability dated Dec. 17, 2020", 5 pgs.

"U.S. Appl. No. 16/478,407, Notice of Allowance dated Sep. 3, 2020", 8 pgs.

"U.S. Appl. No. 16/478,407, Notice of Non-Compliant Amendment dated Feb. 27, 2020", 4 pgs.

"U.S. Appl. No. 16/478,407, Preliminary Amendment filed Jul. 16, 2019", 10 pgs.

"U.S. Appl. No. 16/478,407, Response filed Mar. 4, 2020 to Notice of Non-Compliant Amendment dated Feb. 27, 2020", 12 pgs.

"U.S. Appl. No. 16/478,407, Response filed Aug. 24, 2020 to Non Final Office Action dated Apr. 22, 2020", 19 pgs.

"U.S. Appl. No. 16/478,432, Examiner Interview Summary dated Mar. 11, 2021", 2 pgs.

"U.S. Appl. No. 16/478,432, Final Office Action dated Jan. 8, 2021", 11 pgs.

"U.S. Appl. No. 16/478,432, Non Final Office Action dated Sep. 25, 2020", 17 pgs.

"U.S. Appl. No. 16/478,432, Notice of Allowance dated Mar. 23, 2021", 8 pgs.

"U.S. Appl. No. 16/478,432, Preliminary Amendment filed Jul. 16, 2019", 8 pgs.

"U.S. Appl. No. 16/478,432, Response filed Mar. 8, 2021 to Final Office Action dated Jan. 8, 2021", 12 pgs.

"U.S. Appl. No. 16/478,432, Response filed Sep. 17, 2020 to Restriction Requirement dated May 18, 2020", 7 pgs.

"U.S. Appl. No. 16/478,432, Response filed Dec. 28, 2020 to Non Final Office Action dated Sep. 25, 2020", 16 pgs.

"U.S. Appl. No. 16/478,432, Restriction Requirement dated May 18, 2020", 6 pgs.

"Chinese Application Serial No. 201880023871.1, Office Action dated Jul. 23, 2020", with English translation, 10 pages.

"Chinese Application Serial No. 201880023871.1, Response filed May 16, 2021 to Office Action dated Mar. 1, 2021", with English claims, 9 pages.

"Chinese Application Serial No. 201880023871.1, Response filed Dec. 6, 2020 to Office Action dated Jul. 23, 2020", w/ English claims, 15 pgs.

"European Application Serial No. 18747990.2, Extended European Search Report dated Oct. 23, 2020", 7 pgs.

"European Application Serial No. 18747990.2, Response to Communication pursuant to Rules 161(2) and 162 EPC filed Apr. 16, 2020", 12 pgs.

"European Application Serial No. 18748256.7, Extended European Search Report dated Oct. 27, 2020", 7 pgs.

"European Application Serial No. 18748256.7, Response to Communication pursuant to Rules 161(2) and 162 EPC filed Apr. 16, 2020", 13 pgs.

"European Application Serial No. 18748631.1, Extended European Search Report dated Oct. 27, 2020", 8 pgs.

"European Application Serial No. 18748631.1, Response filed May 19, 2021 to Extended European Search Report dated Oct. 27, 2020", 13 pages.

(56) References Cited

OTHER PUBLICATIONS

"European Application Serial No. 18748631.1, Response to Communication pursuant to Rules 161(2) and 162 EPC filed Apr. 16, 2020", 11 pgs.
"International Application Serial No. PCT/US2018/015924, International Preliminary Report on Patentability dated May 31, 2019", 6 pgs.
"International Application Serial No. PCT/US2018/015924, International Search Report dated May 11, 2018", 3 pgs.
"International Application Serial No. PCT/US2018/015924, Written Opinion dated Mar. 27, 2019", 4 pgs.
"International Application Serial No. PCT/US2018/015924, Written Opinion dated May 11, 2018", 8 pgs.
"International Application Serial No. PCT/US2018/016860, International Preliminary Report on Patentability dated May 31, 2019", 6 pgs.
"International Application Serial No. PCT/US2018/016860, International Search Report dated May 14, 2018", 3 pgs.
"International Application Serial No. PCT/US2018/016860, Written Opinion dated May 14, 2018", 9 pgs.
"International Application Serial No. PCT/US2018/017014, International Preliminary Report on Patentability dated May 31, 2019", 6 pgs.
"International Application Serial No. PCT/US2018/017014, International Search Report dated May 18, 2018", 3 pgs.
"International Application Serial No. PCT/US2018/017014, Written Opinion dated Mar. 28, 2019", 4 pgs.
"International Application Serial No. PCT/US2018/017014, Written Opinion dated May 18, 2018", 10 pgs.
"Japanese Application Serial No. 2019-554554, Notification of Reasons for Refusal dated Feb. 17, 2020", W/ English Translation, 6 pgs.
"Japanese Application Serial No. 2019-554554, Response filed Aug. 17, 2020 to Notification of Reasons for Refusal dated Feb. 17, 2020", with English claims, 9 pages.
"Japanese Application Serial No. 2019-563322, Notification of Reasons for Refusal dated Feb. 17, 2020", W/ English Translation, 6 pgs.
"Japanese Application Serial No. 2019-563322, Response filed Aug. 17, 2020 to Notification of Reasons for Refusal dated Feb. 17, 2020", with English claims, 11 pages.
"Japanese Application Serial No. 2019-563336, Notification of Reasons for Refusal dated Oct. 26, 2020", with English translation, 11 pages.
"Korean Application Serial No. 10-2019-7026006, Notice of Preliminary Rejection dated Mar. 17, 2020", with English translation, 4 pages.
"Korean Application Serial No. 10-2019-7026006, Response filed Sep. 25, 2020 to Notice of Preliminary Rejection dated Mar. 17, 2020", with English claims, 18 pages.
"Korean Application Serial No. 10-2019-7026025, Notice of Preliminary Rejection dated Mar. 17, 2020", with English translation, 5 pages.
"Taiwanese Application Serial No. 107104052, First Office Action dated Nov. 3, 2021", with Concise Statement of Relevance, 13 pages.
"Taiwanese Application Serial No. 107104036, Response filed Jan. 26, 2022 to First Office Action dated Oct. 25, 2021", with English claims, 73 pages.
"Taiwanese Application Serial No. 107104052, Response filed Jan. 28, 2022 to First Office Action dated Nov. 3, 2021", with English claims, 88 pages.
"Chinese Application Serial No. 201880023871.1, Office Action dated Mar. 1, 2021", with English translation, 10 pages.
"Japanese Application Serial No. 2019-563336, Response filed Apr. 26, 2021 to Notification of Reasons for Refusal dated Oct. 26, 2020", with English claims, 17 pages.
"European Application Serial No. 18747990.2, Response filed May 20, 2021 to Extended European Search Report dated Oct. 23, 2020", 14 pgs.
"European Application Serial No. 18748256.7, Response filed May 21, 2021 to Extended European Search Report dated Oct. 27, 2020", 14 pgs.
"Taiwanese Application Serial No. 107104053, First Office Action dated Jul. 19, 2021", with English translation, 6 pages.
"Chinese Application Serial No. 201880023871.1, Decision of Rejection dated Aug. 16, 2021", with machine English translation, 8 pages.
"Taiwanese Application Serial No. 107104053, Response filed Oct. 15, 2021 to First Office Action dated Jul. 19, 2021", with English claims, 71 pages.
"Taiwanese Application Serial No. 107104036, First Office Action dated Oct. 25, 2021", with machine English translation, 19 pages.
"Chinese Application Serial No. 201880023268.3, Office Action dated Oct. 14, 2022", (w/ English Translation), 9 pgs.
"Chinese Application Serial No. 201880023301.2, Office Action dated Oct. 26, 2022", (w/ English Translation), 6 pgs.

* cited by examiner

SUBNANOMETER-LEVEL LIGHT-BASED SUBSTRATE CLEANING MECHANISM

CLAIM OF PRIORITY

This patent application is a divisional of U.S. patent application Ser. No. 16/478,432, filed 16 Jul. 2019, which is a U.S. national stage application filed under 35 U.S.C. § 371 from International Application No. PCT/US2018/016860, filed 5 Feb. 2018, and published as WO 2018/145991 9 Aug. 2018, which claims priority to U.S. Provisional Application Ser. No. 62/455,425, entitled, "SUBSTRATE CLEANING AND DRYING MECHANISM," filed 6 Feb. 2017; and U.S. Provisional Application Ser. No. 62/518,311, filed 12 Jun. 2017, and entitled, "NANOMETER-LEVEL LASER-BASED SUBSTRATE CLEANING MECHANISM," the disclosures of which are each incorporated herein by reference in their entireties.

TECHNICAL FIELD

The disclosed subject matter relates to, for example, semiconductor manufacturing and allied industries. In particular, the disclosed subject matter relates to a method for precision cleaning of flat objects using a laser or other light source.

More specifically, the disclosed subject matter relates to a method of precision cleaning of flat objects, such as semiconductor wafers or other substrates. in a single-chamber apparatus equipped with one or more lasers for cleaning and with means for flowing an ultra-clean gas (e.g., nitrogen) to assist in evacuating effluents from nearby the substrate and within the chamber while rotating the substrate. Note that, as used herein, effluents refer to various gases, contaminants, films, particles, and so on that are cleaned and released from a substrate.

BACKGROUND

Cleaning of surfaces of wafers and other substrates is one of the most important steps in the fabrication of semiconductor microelectronic devices. It is well known to a person of ordinary skill in the art that the presence of chemical contaminants and particles of impurities may significantly reduce the yield of fabricated products and noticeably affect the performance and reliability of the produced semiconductor or related devices (e.g., an integrated circuit).

In view of the present trend in the semiconductor and allied industries, which goes far beyond characteristic features of a device, having, for example, sub-micron or nanometer-level sizes, effective techniques for cleaning substrates initially and after various deposition and patterning operations, are becoming increasingly important. Since designed features and design rules for producing the features have become increasingly small, there exists an extreme sensitivity of semiconductor surfaces to the presence of contaminants. For example, total metallic impurities on a substrate (e.g., silicon wafer) should be far less than $10^{10}$ atoms per $cm^2$. The presence of particles larger than 0.1 μm in size should be much less than approximately 0.1 per $cm^2$. In addition, organic contaminants, particulates, and/or other impurities may be present on the substrate. These requirements are not currently being addressed by the prior art.

SUMMARY

Figure 1:
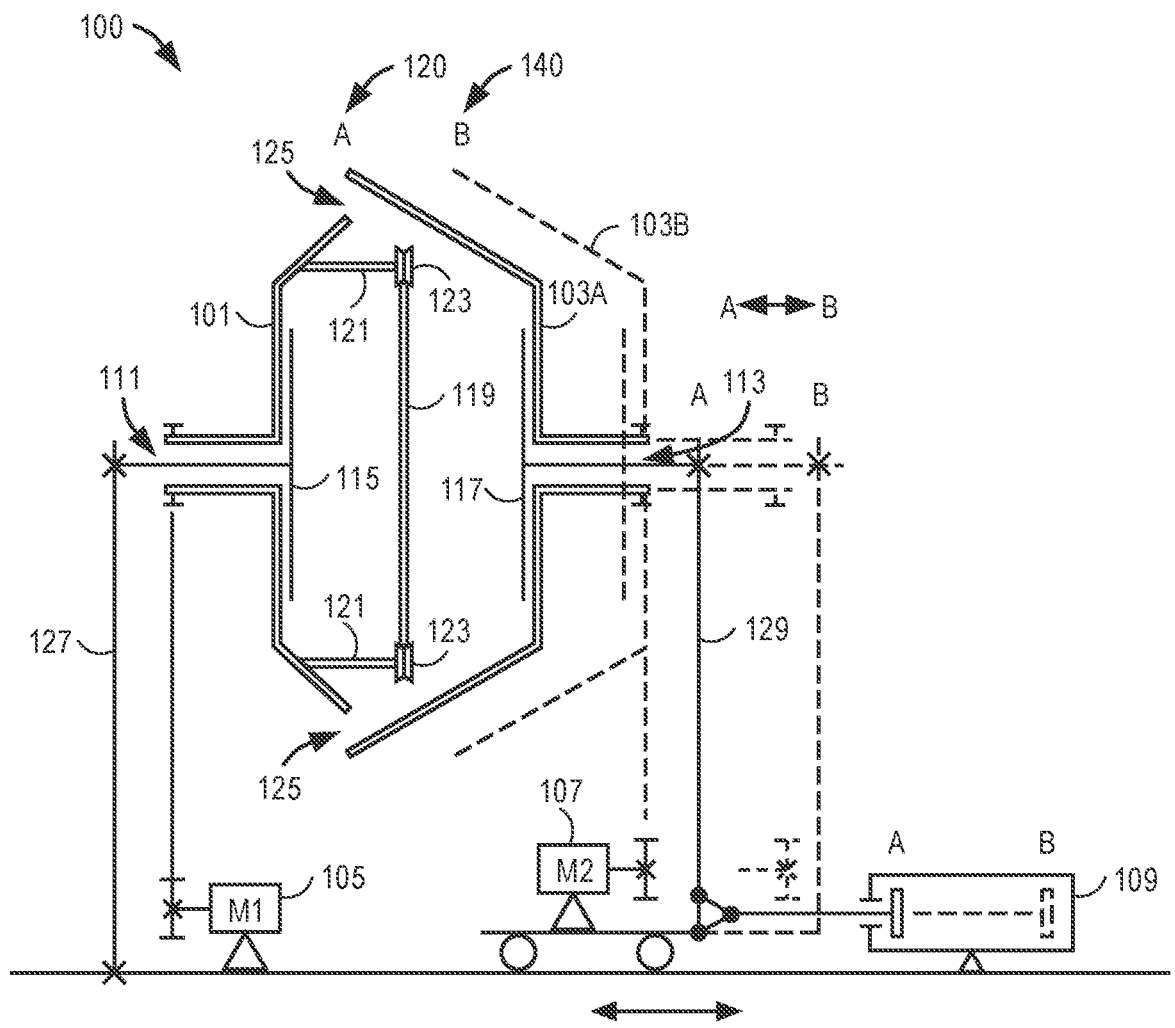
FIG. 1 is a diagram showing a simplified overview of an example of a substrate cleaning chamber mechanism of the disclosed subject matter.

The description that follows includes illustrative apparatuses (devices, structures, systems, and the like) and methods (e.g., processes, sequences, techniques, and technologies) that embody at least portions of the disclosed subject matter. In the following description, for purposes of explanation, numerous specific details are set forth in order to provide an understanding of various embodiments of the subject matter. After reading and understanding this disclosure, it will be evident to those of ordinary skill in the art however, that various embodiments of the subject matter may be practiced without these specific details. Further, well-known apparatuses and methods have not been shown in detail so as not to obscure the description of various embodiments. Moreover, as understood by a person of ordinary skill in the art, relative terms that may be employed herein (for example, top, bottom, upper, lower, over, under, etc.) are used merely to convey the general concepts disclosed and should not be considered as absolute terms.

During the cleaning operations within a substrate cleaning chamber, one challenge is to remove excess effluents rapidly to enable completion of substrate cleaning operations. (Note that, as used herein, effluents refer to various gases, contaminants, films, particles, and so on that are either a part of the cleaning procedure or cleaned and released from a substrate. The term "effluents," therefore, does not necessarily refer to liquids.) A substrate cleaning chamber of the disclosed subject matter selectably cleans one or both faces (sides) of the substrate, as well as the edge(s) of the substrate simultaneously or sequentially. Although the substrate is shown in a vertical orientation in the referenced figures, a skilled artisan, upon reading and understanding the disclosure provided herein, will recognize that the substrate may be oriented horizontally or in any other orientation between horizontal and vertical.

During various ones of the cleaning operations, the substrate is rotating (spinning, for example, either substantially vertically or substantially horizontally) within the chamber. Additionally, various embodiments are disclosed of, for example, center evacuation and side evacuation rotatable shields (optional) to assist in removal of effluents removed from the substrate by the cleaning operation. In various embodiments, turbine disks may be attached to one or more of the rotatable shields. In various embodiments, the turbine disks may be independently rotatable. The turbine disks assist in evacuating gases and other effluents from the cleaning chamber to assist in more rapidly completing the cleaning operations of the substrate. The disclosed subject matter also describes various embodiments of optional exhaust channels that may be utilized separately or in combination with one another. Various embodiments of gas (e.g., ultra-pure nitrogen) dispense mechanisms inside the cleaning chamber are also disclosed.

As described in more detail below, in various embodiments the substrate cleaning chamber is a closed system having an inner shell and an outer shell. The outer shell opens and closes to load and unload a substrate (e.g., by an end-effector of a robot), either vertically or horizontally, for subsequent cleaning operations.

The outer shell, when closed, produces a gas-tight seal that prevents any of the process gases and effluents (gases, contaminants, films, particles, etc.) from escaping outside the outer shell enclosure. The inner shell includes the substrate holding mechanism and two optional rotatable shields that are independently controllable for rotational speed and direction. One shield is coupled to a first rotating motor and may also be coupled to the substrate holding mechanism (and substrate) while the second shield has a separate, independent motor. In specific exemplary embodiments, there are one or more turbine disks attached to the rotatable shields. The turbine disks may be configured with slots placed at various points and angles calculated to provide increased effluent-removal efficiency.

In various embodiments, a gas (e.g., nitrogen although other ultra-pure gases may be used in addition to or in place of the nitrogen) is dispensed via a plurality of different devices. In one example, a mushroom design allows for a low pressure, high flow of gas. In another example, an array of gas outlets in a gas inlet tube produces a knife-edge shower of the gas in the inner chamber. In other embodiments, both devices are combined.

At the start of an exemplary cleaning operation, the substrate is rotated, slowly at first, to facilitate the cleaning of the substrate via the one or more lasers incident substantially simultaneously on the frontside, backside, and edge(s) of the substrate. During this cleaning operation, one or more laser powers (e.g., $W/m^2$), emitted energies (Joules), or one or more wavelengths, can be used depending upon the type of contaminant to be removed from the substrate. Although other types of light sources are described herein (e.g., an excimer lamp or light source), the term laser will be employed throughout simply as an aid in understanding the disclosed subject matter.

Disclosed herein are embodiments in which an atmospheric process cleaning chamber that accomplishes contact-less cleaning of substrates using, for example, an excimer laser source. In other embodiments, the process cleaning chamber is operated at some level of vacuum. Various types and wavelengths of lasers are discussed herein or will be evident to the person of ordinary skill in the art upon reading and understanding the disclosure provided herein.

In general, the integrated cleaning process chamber described herein is usable on various types, sizes, and shapes of substrates. A substrate is delivered into the chamber via a robot that holds the substrate from the edges only; the substrate is held in the chamber from the edges only via, for example, three points. The substrate is rotated while a beam emitted from a laser (e.g., an excimer laser or other light source) is projected onto the substrate. As described in more detail below, in one embodiment, the beam produced by the laser is emitted from a specially designed aperture. The aperture creates a substantially flat beam output that covers the full radius or diameter of the substrate.

In other embodiments, the laser beam is scanned across either the radius or diameter of the substrate. In either case, the substrate is rotated while the beam is stationary (consequently, the laser need only be projected or scanned across the radius of the substrate). The rotation of the substrate ensures that the entire surface (e.g., face) of the substrate is exposed to the laser beam. The laser beam imparts a selected predetermined energy to the surface or surfaces of the substrate (e.g., front or back surfaces individually or both surfaces concurrently) to excite the nano-contaminants (e.g., films, particulates, organic matter, etc.) on the substrate surface and reduces or eliminates various bonds (molecular, adhesive, etc.) to release the nano-contaminants from the substrate.

In various embodiments, a separate laser may be directed, either independently, simultaneously, or subsequently, at the edges of the substrate to clean the edges as well as the surfaces. These nano-contaminants are then carried away by a flow of ultrapure nitrogen gas away from the substrate and to the chamber exhaust. The substrate is then removed by the robot using the edge gripper. More complete details are described below An amount of energy imparted to the surface or surfaces of the substrate is controllable via a special power supply of the laser module (not shown). The selection of the excimer laser wavelength is at least partially dependent upon the type of contaminants to be removed. However, the range of wavelengths may be selected to be, for example, from 172 nm to 348 nm. In other embodiments, a range of wavelengths may be selected to be, for example, from 150 nm to 190 nm. In other embodiments, one or more additional wavelengths may be selected. The type of laser selected for the process may be a cold laser or an excimer laser that adds little if any temperature variation to the substrate. However, lasers such as thermal lasers can be also manipulated to produce the desired cleaning effect.

The laser light can be either projected as a continuous beam or it can be pulsed via, for example, an automatic shutter system to control the energy imparted to the substrate. As described in more detail herein, the main components of the laser-cleaning process chamber include the outer shells, substrate sensing mechanism, substrate holding mechanism, variable beam aperture plate (or scanning mechanism), gas inlet, and exhaust system. As noted above, the substrate rotates at a programmable speed or speeds during the laser-cleaning cycle. The substrate is rotated at programmable speeds during the cleaning cycle and the result is a dry substrate without any nano-particles or contaminants left on its surface.

While the laser-cleaning system is a standalone system or process, it can be combined with the Planar pulse hydro-jet system to first clean the substrate using the pulsed hydro-jet process and then moving to the laser clean chamber for the removal of the ultra-nano particles from the substrate surface (or vice-versa). Such a hydro-jet system is described in U.S. Provisional Patent Application No. 62/455,425 which is incorporated herein by reference in its entirety. However, since there are no chemicals or liquids dispensed on the substrate during the laser-cleaning process, the need for large and small rotating shields, described herein, is reduced or eliminated.

In various embodiments, a cover plate for the motor hub has a slit or aperture formed therein to allow the laser beam to pass therethrough either a flat line projection of the beam or a scanned laser beam onto either the radius or the diameter of the substrate. Multiple slits/apertures can be added to provide multiple flat line or scanning projections onto the substrate covering the radii, diameter, or any specific area of the substrate as desired.

Additionally, if desired for a particular cleaning operation, the aperture can be opened and closed automatically via a movable slit system to provide a pulsed laser beam incident on the surface or surfaces of the substrate. Once the substrate is positioned onto the holding arms and pins, the laser is turned on to project the desired beam onto the substrate surface. Substantially concurrently, the substrate is rotated at the desired speed to enable the entire surface of the substrate exposed to the laser energy. In one specific exemplary experiment, a laser energy of 5 eV at 5 to 10 seconds was sufficient to remove nano-contaminants from both surfaces of the substrate.

As described in more detail below, one purpose of a described nitrogen dispense system is to introduce ultrapure nitrogen at the end of the laser-clean cycle in a laminar flow over the surface or surfaces of the substrate to facilitate the removal of the nano-contaminants (e.g., referred to herein as effluents) as they are removed from the surface due to the laser energy. (Additionally, excimer sources often utilize a nitrogen source for operation.) The laminar nitrogen flow carries the removed nano-contaminants to the chamber exhaust in the bottom of the chamber. The main exhaust manifold at the bottom of the chamber is hooked into the exhaust system of the facility in which the chamber is located with, for example, a pneumatically-actuated normally-closed valve. When the nitrogen laminar flow is turned on after the laser cycle, the pneumatic valve is opened to allow house exhaust to produce the required exhaust flow. The amount of nitrogen flow and exhaust can be programmed as desired for a predetermined cleaning recipe.

In various exemplary embodiments, an amount of photon energy incident on the substrate can be controlled. For example, a pulsed beam would impart lower energy depending upon the pulses per second versus a constant-output beam on to the substrate surface. On the other hand, a constant-output beam can be used for tough residue cleaning that requires higher photon energy. In applications requiring a higher photon energy, the beam can also be focused to, for example, a diffraction-limited focus point, thereby concentrating the energy of the laser into a spot that is then either scanned or otherwise moved (e.g., via rotation of the substrate) across the surface or surfaces of the substrate. For example, in an exemplary application, a particular wavelength excimer laser beam is directed at the targeted surface, depending upon the gas used in the excimer laser lamp (e.g., Xenon, KrF, etc.), a particular wavelength is created that further breaks down, for example, organic molecular bonds of organic contamination as in the case of photoresist residue.

One purpose of offering a variable beam aperture is to ensure that the substrate cleaning tool can address specific areas of the substrate, for example, to remove the particles from the edge of the substrate only. In some exemplary embodiments, the edge of the substrate of the substrate may be physically blocked while pulsing or focusing the beam on the remaining surface or surfaces of the substrate.

In specific exemplary embodiments, a typical range of excimer laser may be from about 172 nm to 248 nm, or higher. For example, a krypton-fluoride excimer laser with a wavelength of 248 nm may produce a photon energy of 5 eV, which may be optimum for the removal of a variety of general contaminants from the substrate surface. A xenon gas excimer laser on the other hand may produce a photon energy of 7 eV that is enough to break organic molecular bonds to remove a variety of organic residues from the substrate surface and from deep vias.

In various embodiments, and as shown and described in more detail below with reference to FIGS. 27A and 27B, optics may be employed to shape the excimer laser onto the substrate surface for the targeted removal of the contaminants. Typical shaping of the laser beam can be obtained by, for example, using a combination of aspherical cylindrical lenses. In specific exemplary embodiments, the aspherical lenses selected for this invention may be comprised of calcium fluoride and magnesium fluoride lenses due to their increased transmission of UV light in the range of 172 nm to 248 nm as compared with typical optical glass materials (e.g., BK-7 or other borosilicate glass materials). In various embodiments, the optics may be used to scan the beam across the surface or surfaces of the substrate (e.g., a set of optics on either side of the substrate), focus the beam, or project a flat beam across the radius or diameter of the substrate. The person of ordinary skill in the art, such as an optical engineer, would understand various ways of shaping the beams, as well as the materials to be used in the optical elements, for use in the laser-based cleaning process chamber described herein.

Also, in other specific exemplary embodiments, the laser-based cleaning process chamber can be atmospheric for general contamination removal or can be configured as a vacuum chamber for particular applications, such as resist ashing and residue removal. Therefore, in some embodiments, the laser-based cleaning process chamber may be operated at atmospheric pressure. In other embodiments, the laser-based cleaning process chamber may be operated at some level of vacuum. The actual level of vacuum will be dependent on a number of factors such as a cleanliness level (e.g., removal of particular particle sized down to some characteristic dimension), a desired removal-level of organic contaminants, a required throughput of the cleaning process (e.g., a pump-down to a high-level of vacuum takes more time than to pump-down to a lower-level of vacuum), etc.). These factors are all understandable and determinable to a person of ordinary skill in the art upon reading and understanding the disclosure provided herein.

In example embodiments, an ultraviolet (UV) light source or an excimer laser beam may then be pulsed onto the substrate while the substrate is rotated slowly at programmable speed. The pulsed beam may be shaped via special optics (calcium or magnesium fluoride aspherical cylindrical lenses) as described herein to deliver photon energy onto the targeted area of the substrate.

The rotation of the substrate ensures that the entire surface or surfaces of the substrate are exposed to the excimer laser pulses. The photon energy breaks down, for example, the molecular bonds of the contamination, particles, films, organic material, etc. adhering to the substrate and are carried away by the flow of ultrapure nitrogen flowing in a laminar flow over the substrate. The dry, cleaned substrate is then removed from the process chamber by the edge-gripper of a robot and placed in a substrate carrier or cassette.

For resist strip and residue removal processes, the substrate can be moved to a pulsed hydro-jet chamber, discussed herein by reference, that is in-line with the laser-based cleaning chamber for a further wet clean of the substrate if desired. A variety of recipes that combine wet and dry cleaning can be optimized to clean substrates. The types of contaminants that can be targeted and removed include, for example, organics, inorganics, metal, and residues from vias.

Where shields are employed (albeit not necessary in all embodiments described herein), a shield rotary drive mechanism is coupled with a first of the shields (which may have one of the turbine disks attached to it). As the first shield rotates, the substrate coupled to the shield rotary drive mechanism, also rotates at the same speed. As described above, the second, opposing shield is coupled to a separate, independent motor and also rotates. However, since the second shield has a separate motor, the speed and direction of the second shield is independent of the first shield, and consequently, is also independent of a rotational speed of the substrate. As both shields rotate during the cleaning operation, with one or more lasers (described in more detail below) incident on the substrate, the various effluents associated with the cleaning procedure of coming from the rotating substrate are evacuated through the rotatable shields due to a centrifugal-force effect.

The curvature of the shield is designed such that the effluents move towards an edge (either an inner edge or an outer edge, depending on a particular embodiment) of the shields and is evacuated (removed) from the inner chamber. A rotational speed of the rotatable shields can be increased to increase effluent evacuation. During this cleaning operation, a high purity gas (e.g., ultra-pure nitrogen) is introduced into the chamber by at least one of the gas-dispersion devices. At the end of the cleaning operation, radiation emanating from the one or more lasers is stopped. A rotational speed of the rotatable shields, and consequently the speed of the substrate, is accelerated to a higher speed to further facilitate the effluent removal process.

As will be understandable to a person of ordinary skill in the art, the high rotational speed of the shields creates a pressure differential between the substrate and a volume proximate the substrate facilitating evacuation (removal) of effluents released from the substrate, as well as other gases, away from the rotating substrate. The high rotational speed of the substrate, coupled with the gas flow and rotation of the shields, removes all or substantially all effluents from the proximity of the substrate thereby leaving a clean substrate. One or more secondary gas flow devices create a gas barrier to prevent or substantially reduce particulate migration into the inner (process) chamber from the outer chamber. During the cleaning operations, the speed of the optional rotatable shields can be manipulated to effect a volumetric removal of the various effluents produced or used by the cleaning process to aid in producing a clean, or substantially clean (e.g., at the molecular level), substrate at the end of the cleaning process.

The disclosed subject matter is applicable to other fields such as cleaning of optical substrates, bio-tech substrates used for gene sequencing and drug discovery, flat panel displays, substrates used in the manufacture of space optics, optical recording substrates, as well as a variety of other substrate types known in various arts. Overall, the principals of the disclosed subject matter will substantially be the same in some aspects wherein the substrate will be held and rotated at variable, programmable speeds during cleaning. Moreover, as the person of ordinary skill in the art will understand upon reading and understanding the disclosure provided herein, the term "or" may be construed in an inclusive or exclusive sense unless otherwise explicitly noted or operationally defined.

DETAILED DESCRIPTION

With reference now to FIG. 1, a simplified overview of a substrate cleaning chamber 100 is shown. Overall, the substrate cleaning chamber 100 is shown to include an (optional) first rotatable shield 101 and an (optional) second rotatable shield in a first position 103A, proximate to the first rotatable shield 101, and in a second position 103B that is moved laterally away from, and therefore distal to, the first rotatable shield 101. As explained in more detail herein, the first rotatable shield 101 and the second rotatable shield capture and redirect effluents released from a substrate, as well as various process gases, away from a substrate 119. One of the two rotatable shields is configured to move from an operating position 120 (indicated as position "A" on FIG. 1) and a load position 140 (indicated as position "B" in FIG. 1) to allow the substrate 119 to be mounted in and removed from the substrate cleaning chamber 100. An actuator mechanism 109 moves the second rotatable shield 103A, 103B from the operating position 120 to and from the load position 140. In embodiments where the rotating shield are not employed, the substrate holder mechanism may be coupled directly to an inside wall of the chamber or otherwise coupled directly to the motor supplying the motion.

In one embodiment, an angle of the first rotatable shield 101 and the second rotatable shield 103 (relative to normal of a location of the substrate 119) may be from about 3° to about 15°. In other embodiments, the angle may be from about 1° to about 3°. In other embodiments, the angle may from about 15° to about 45° or more. In embodiments, the angle may not be a continuous straight angle but may be comprised of various straight portions, with each of the straight portions having different angles (e.g., increasing in angle as edges of the rotatable shields approach the openings 125). In still other embodiments, the edges of the rotatable shields may be curved (e.g., see FIG. 4), where the curvature has either a constant radius or variable radii. Additionally, the skilled artisan will recognize that a steeper angle (e.g., 15° rather than 5°) or greater radius of curvature may provide for more efficient effluent removal from the chamber. However, the greater angle or greater radius of curvature will also increase a physical overall height of the chamber. Therefore, the skilled artisan will recognize how to achieve a balance between steepness or angle/greater radius of curvature versus a reasonable size of the chamber based on reading and understanding the disclosure provided herein. Each of the embodiments may be accomplished by machining, stamping, deep drawing, or otherwise forming the shields by techniques known in the art.

In various embodiments, a larger of the shields (the second rotatable shield 103 in the example of FIG. 1) extends over the smaller shield. Although not shown, at least one or both of the rotatable shields may be formed to have a labyrinth lip (not shown but understandable to a skilled artisan) at an outermost edge (e.g., near the openings 125) to form a mechanical seal to remove most or all portions of effluent, thereby preventing or substantially eliminating any effluent from falling back, or being attracted back (e.g., by electrostatic forces) into an interior portion of the chamber containing the substrate (see, e.g., FIG. 15). Consequently, a profile of the outermost edge may be formed such that the effluent portions cannot collect above, near, or otherwise proximate the substrate, thereby preventing effluents from re-adhering to the substrate.

The actuator mechanism 109 may be pneumatically activated, hydraulically activated, magnetically activated, electrically activated, or by other means or by a combination of means as understood by the skilled artisan. The actuator mechanism may also include various types of position sensors (e.g., electrical, optical, etc.) to indicate whether the second rotatable shield 103A, 103B is in the operating position 120 or the load position 140. In various embodiments, the position sensors (not shown) may be located in other locations outside of or in addition to being placed within the actuator mechanism 109.

As noted in FIG. 1, the substrate 119 is held in, for example, a substantially vertical or a substantially horizontal position during cleaning. In some embodiments, the position is maintained within a range of approximately ±0.1 degree to approximately ±1 degree from a vertical or a horizontal plane. In some embodiments, the position is maintained within approximately ±2 degrees. In other embodiments, the position is maintained within approximately ±5 degrees. In still other embodiments, the position is maintained within approximately ±10 degrees. The substantially vertical or substantially horizontal positioning of the substrate 119 allows for simultaneous frontside and backside cleaning (as well as edge cleaning), as well as an increased and more thorough cleaning of the substrate 119 from both sides (and an edge or edges depending upon a shape of the substrate (e.g., circular versus square)) simultaneously. The substrate 119 may be, for example, a patterned or unpatterned circular semiconductor wafer that is, for example, a wafer 100 mm to 450 mm in diameter, a square quartz-photomask that is, for example, 125 mm or 150 mm per side, or any of a variety of other substrates known and used in the semiconductor and allied industries such as flat-panel display substrates and magnetic and optical disk substrates.

Although FIG. 1 indicates that the second rotatable shield 103A, 103B (generally also referred to collectively as the second rotatable shield 103 herein) is the shield that moves for substrate exchange, a person of ordinary skill in the art would understand, upon reading and understanding the disclosure provided herein, that, in other embodiments, the first rotatable shield 101 moves toward and away from the second shield 103. In still other embodiments, both the first shield 101 and the second shield 103 can be configured to move laterally toward and away from each other. Therefore, for brevity of notation throughout the disclosure contained herein, the second shield 103 will be indicated as the movable shield.

Further, although the first rotatable shield 101 is shown in FIG. 1 to be smaller than the second rotatable shield 103, and therefore being capable of being circumscribed by the second rotatable shield in the first position 103A, the skilled artisan will recognize that the second rotatable shield 103 can be configured to be smaller than, and therefore be circumscribed by the first rotatable shield 101, when the two shield are proximate one another (in the operating position 120).

With continued reference to FIG. 1, a first-side array or one or more lasers 115 and a second-side array of one or more lasers 117 are shown, coupled to a first-side gas supply line 127 and a second-side gas supply line 129, respectively. The one or more laser beams are configured, during a cleaning operation of the substrate cleaning chamber 100, to direct one or more gases onto each face as well as the edges of the substrate 119.

As described in more detail below, each of the first-side array of one or more lasers 115 and the second-side array of one or more lasers 117, include at least one emitted laser beam (of various configuration as described herein). In various embodiments, the at least one emitted laser beam may also be configured to be pulsed, potentially increasing the cleaning efficiency in certain operations.

FIG. 1 also shows a first-side gas inlet 111 and a second-side gas inlet 113 arranged to allow a clean gas, such as filtered clean, dry air (CDA), nitrogen, argon, or a number of other filtered or high purity/ultra-clean gases to be introduced into the substrate cleaning chamber 100 during an effluent removal operation of the substrate 119. Various embodiments of the cleaning operation are described in more detail below.

When the substrate cleaning chamber 100 is in the load position 140 (position "B"), an end effector (not shown) from a robot can pick the substrate 119 from a substrate carrier (e.g., a front-opening unified pod (FOUP) for carrying and transporting 300 mm semiconductor wafers) to be placed and held by a number of finger-end caps 123, each attached to a number of finger arms 121. The finger arms 121 are in turn mechanically coupled to the first rotatable shield 101. Depending on various physical parameters and geometries of the substrate 119, there can be three or more finger arm 121 and finger-end cap 123 combinations. For example, in the case where the substrate 119 is a circular substrate, there may be three finger arm 121 and finger-end cap 123 combinations. In the case where the substrate 119 is square, rectangular, or otherwise polygonal, there may be four or more finger arm 121 and finger-end cap 123 combinations. The skilled artisan will recognize how to modify the number of finger arm 121 and finger-end cap 123 combinations for a given substrate 119 size and shape.

The finger arm 121 may be fabricated from a number of materials, depending on a particular application of the substrate cleaning chamber 100. For example, the finger arm 121 may comprise various metals such as aluminum (Al) or stainless steel (e.g., a 316L alloy) or other metal alloys, ceramics such as aluminum oxide ($Al_2O_3$) or carbide, or various types of plastics. Additionally, depending on a choice of the finger arm material, the substrate being cleaned, and the industry in which the chamber is being utilized, the material comprising the finger arm 121 may be coated with various types of material including, for example, perfluoroalkoxy (PFA), fluorinated ethylene propylene copolymer (FEP), a copolymer of ethylene and tetrafluoroethylene (ETFE), polytetrafluoroethylene (PTFE), and other single or multi-layer coatings known in the relevant art.

The finger-end caps 123 may be fabricated from a number of materials that have some flexibility such as various plastics (e.g., an acetal homopolymer or acetyl resin, such as Delrin®, various other types of polyoxymethylene-(POM) based plastics, or other thermoplastic materials and various synthetic polymers). The skilled artisan will recognize a number of other materials (e.g., aluminum or other coated metals, metal alloys, and ceramics) may be suitable at least partially depending on a material from which the substrate is formed.

At least one of the finger arm 121 and finger-end cap 123 combinations is movable to allow the substrate 119 to be readily mounted in the substrate cleaning chamber 100. For example, the finger arm 121/finger-end cap 123 combination may be angled away from a substrate holding position to allow the end effector from the robot to readily position (e.g., insert for clamping) or remove the substrate 119. One embodiment of a movable finger arm 121/finger-end cap 123 combination is described in detail below with reference to FIG. 8 et seq. A positioning indicator (not shown but known in the art such as a laser-based, mechanical-based, optical-based, magnetic-proximity based, or other substrate proper-loading indicator) ensures proper alignment of the substrate 119.

In the case of a circular substrate, the substrate is held by three slender finger arms (only two of which are shown in FIG. 1). In this example, the finger arms are spaced about 120 degrees apart. One of the finger arms, in the approximately 12:00 o'clock position, has an actuator linked to it (described in more detail, below) while the other two arms are rigid with no actuation. The finger caps 123, one on each finger arm 121, may be shaped like rollers (even though, in embodiments, the finger caps 123 are non-rotatably mounted to a respective finger arm 121) with, for example, a V-groove or a U-groove into which the substrate is placed during cleaning operations. A profile of the groove is designed such that it ensures that the substrate can self-align when placed in the grooves by an end-effector or a robot (described in more detail, below). A profile of the groove is designed such that it ensures that the substrate can self-align when placed in the grooves by an end-effector of a robot (described in more detail, below).

As described in more detail with reference to FIG. 8, below, when the robot brings the substrate into the opened chamber, the actuator-linked finger arm (e.g., programmed, in some embodiments, to stop at the 12:00 o'clock position so as to not interfere with a path of an end effector of the robot) is actuated via an air cylinder (not shown in FIG. 1) and cam mechanism. As the air cylinder pushes against a metal plate, the cam operates the arm to open upwards, allowing for the robot to bring the substrate into the chamber and situate the substrate into a groove on at least one (or two in the case of a circular substrate) finger arm 121 and finger-end cap 123 combination. Once the substrate is positioned within the groove, or grooves, of the one or more finger-end caps, the air cylinder retracts thereby operating the cam mechanism again, closing the actuator-linked finger arm and clamping the substrate. During this time, a substrate-present sensor (discussed with reference to FIG. 5, below) ensures that the substrate is sitting properly in the grooves. As noted above, if the substrate is not properly positioned (e.g., the substrate is tilted), the system goes into an error mode until the substrate is removed and repositioned properly by the robot via a recovery and reposition mode, programmed into the system as understandable by a skilled artisan.

With continued reference to FIG. 1, a first motor 105 and a second motor 107 are arranged to rotate the first rotatable shield 101 and the second rotatable shield 103, respectively. The first motor 105 and the second motor 107 may be rotary actuators of various types (e.g., electrical, pneumatic, hydraulic, etc.) or other rotational actuator-mechanism known in the art.

During a substrate cleaning operation, since the substrate 119 is, in this embodiment, mechanically coupled to the first rotatable shield 101 (or directly to a rotatable mechanism of the shields are not used as described above), the substrate 119 may be rotated relative to both the first-side array of one or more lasers 115 and the second-side array of one or more lasers 117 by the first motor 105. Independently, the second rotatable shield 103, at the operating position 120, may be rotated by the second motor 107. In various embodiments, the first motor 105 and the second motor 107 may rotate the respective shields in the same direction or in opposite directions, or both directions in different timeframes. The first motor 105 and the second motor 107 may also rotate the respective shields at either the same rotational speed or different rotational, programmable speeds, or both, in different timeframes.

During a substrate effluent removal operation, the second rotatable shield 103 remains at the operating position 120. The first motor 105 and the second motor 107 may rotate the respective shields in the same direction or in opposite directions, or both directions in different timeframes. The first motor 105 and the second motor 107 may also rotate the respective shields at either the same rotational speed or different rotational speeds, or both, in different timeframes. As described in more detail below, the rotational speeds can also be varied depending upon a particular operation or varied during a particular operation.

During the cleaning operation, centrifugal forces on the substrate 119 caused by the rotational motion, in combination with gases introduced into the substrate cleaning chamber 100 through the first-side gas inlet 111 and the second-side gas inlet 113, along with gravitational forces (in either a vertical (e.g., both faces) or horizontal position (e.g., bottom face)), help clean the substrate 119 much more rapidly than is currently known by various substrate cleaning mechanisms of the prior art. Various effluents produced by the cleaning procedure or released from the substrate by the cleaning procedure and into the substrate cleaning chamber 100 during the various cleaning cycle or cleaning cycles are evacuated from the chamber through the openings 125 formed between the first rotatable shield 101 and the second rotatable shield 103 in the operating position 120.

Figure 2:
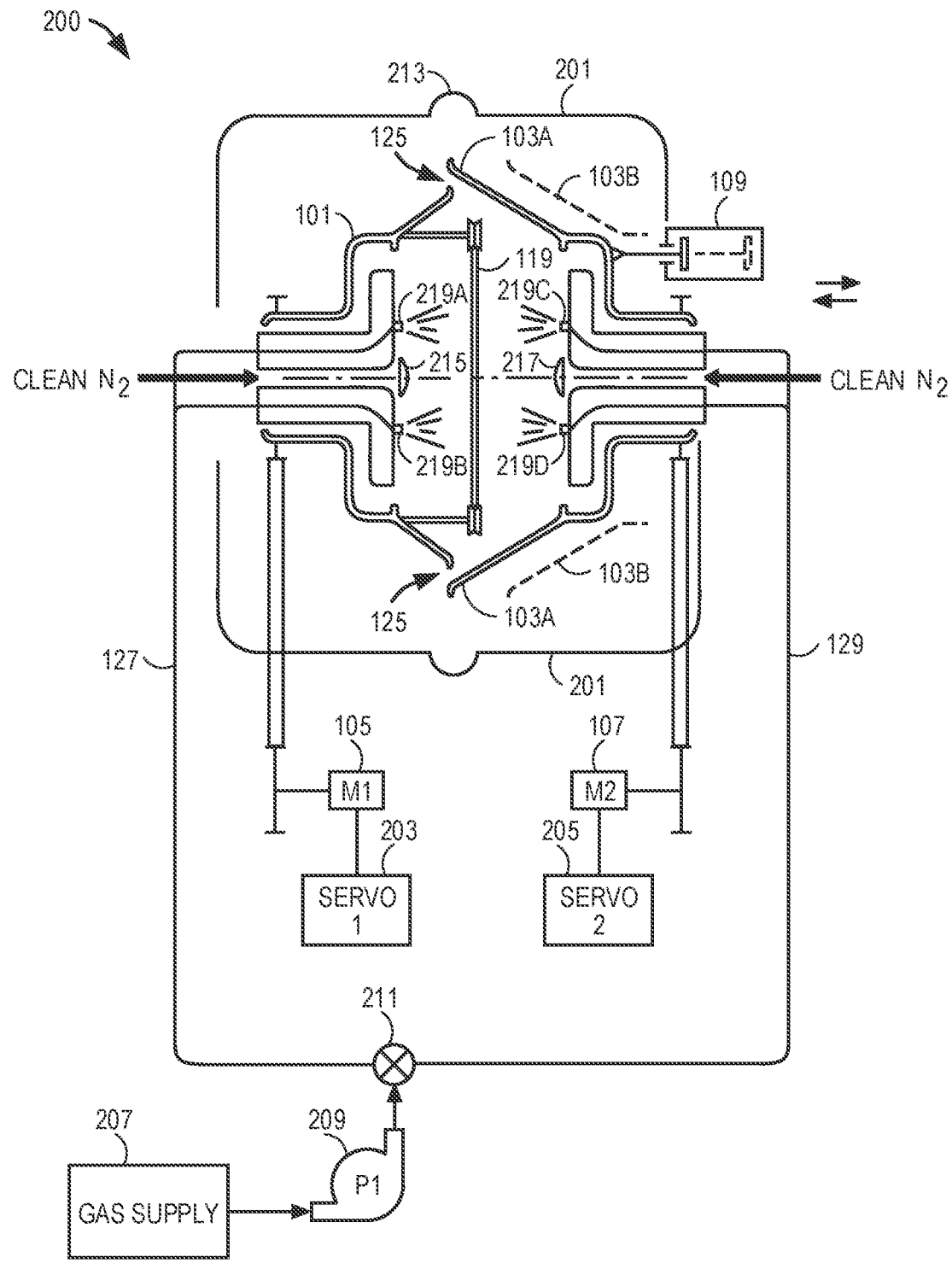
FIG. 2 is a diagram showing an outer chamber plus additional details of the substrate cleaning chamber mechanism of FIG. 1.

Referring now to FIG. 2, an outer chamber 200 plus additional details of the substrate cleaning chamber 100 of FIG. 1 are shown. FIG. 2 is shown to include an outer chamber 201, a first servomechanism 203 electrically, optically, or mechanically coupled to the first motor 105 and a second servomechanism 205 electrically, optically, or mechanically coupled to the second motor 107, one or more gas supply sources 207 for (e.g., a Dewar or simply plumbed to the gas supply of the fabrication facility) containing one or more high-purity gases (only one is shown), including, for example, high-purity nitrogen, used to assist in cleaning the substrate 119, one or more gas pumps 209 (if needed, only one of which is shown), and a pump control mechanism 211.

The outer chamber 201 can be made of a variety of materials and can be coated, inside or outside, with one or more materials as needed or required for various industries. The materials and coatings are described above with reference to FIG. 1.

The first servomechanism 203 and the second servomechanism 205 may be any number of mechanisms known in the control engineering field. Generally, a servomechanism employs error-sensing devices or feedback schemes to verify the action of another device, such as a rotational device. With reference to FIG. 2, the first servomechanism 203 and the second servomechanism 205 control the first motor 105 and the second motor 107, respectively. The servomechanisms therefore help to control speed, acceleration, and direction of the motors.

The gas pump 209 can be any of a variety of pumping-mechanisms designed to move and transmit various types of gases from the reservoir 207 to the first-side array of one or more lasers 115 and the second-side array of one or more lasers 117 (see FIG. 1). The pumping mechanisms can include a variety of other types of pumps known in the art.

As shown, the first-side array of one or more lasers 115 each include at least one or more lasers 219A, 219B and the second-side array of one or more lasers 117 includes a second plurality of one or more lasers 219C, 219D. Although more than one laser is shown on each side, the skilled artisan will recognize that only a single laser need be employed since the laser can be spread over the face of the substrate by means as described herein. The one or more laser beams are designed to fully cover, perhaps with some overlap between adjacent lasers, both faces of the substrate 119 as well as at least a portion of edge(s) of the substrate 119. Although only a total of four lasers 219A, 219B, 219C, 219D are shown, the skilled artisan will recognize, upon reading and understanding the disclosure provided herein, that fewer or more lasers may be used to produce a desired number of laser beams for a given application and geometry of the substrate 119.

FIG. 2 is also shown to include a first-side gas dispersion mechanism 215 and a second-side gas dispersion mechanism 217. The dispersion mechanisms are used to disperse and redirect any incoming gas through the first-side gas inlet 111 and the second-side gas inlet 113 (see FIG. 1) during, for example, an effluent removal operation.

In one embodiment, the gas dispersion mechanisms 215, 217 may be configured in a spaced-apart relationship (e.g., by perhaps about 1 mm to about 5 mm or various other distances subsumed within this range) from the respective array of one or more lasers to deflect and disperse incoming gases from impinging on opposing faces of the substrate 119. In other embodiments, the gas dispersion mechanisms may be configured with an array of apertures or orifices around the periphery of the dispersion mechanism to direct the incoming gases in a plane substantially parallel to faces of the substrate 119. In other embodiments, the gas dispersion mechanisms may be configured to incorporate both a spaced-apart relationship from the respective array of one or more lasers and also incorporate an array of apertures or orifices. The skilled artisan, upon reading and understanding the disclosure provided herein, can envision other forms that the dispersion mechanisms may take, which are intended to be within the scope of the present disclosure. Overall, the dispersion mechanisms, described in more detail below, assist in evacuation of effluents released from the substrate, as well as other process gases, from the substrate cleaning chamber 100 to the outer chamber 201.

The outer chamber 201 may include an optional exhaust channel 213 to collect effluents evacuated from the substrate cleaning chamber 100. The exhaust channel 213 and its function are described in more detail below.

Figure 3:
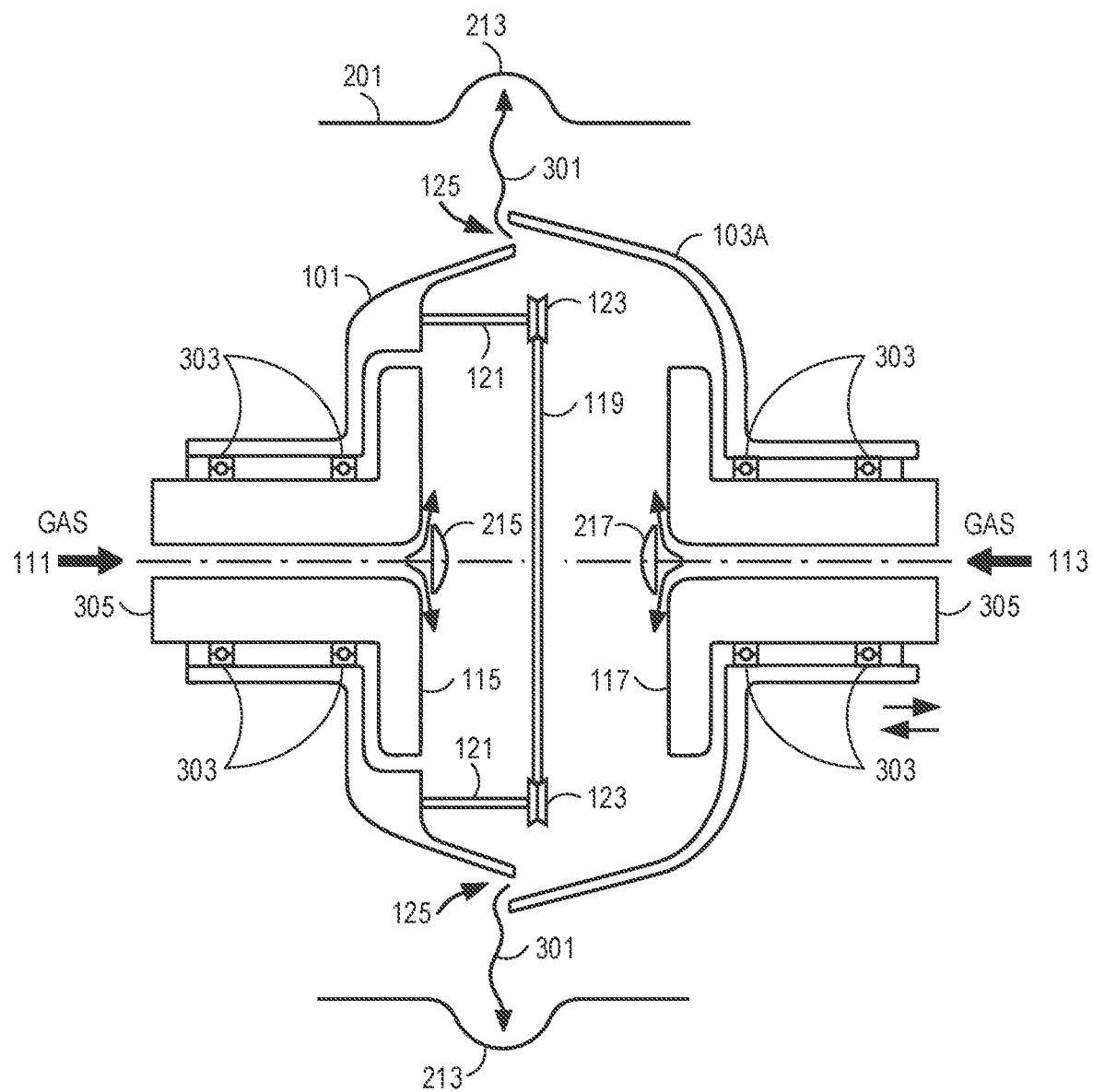
FIG. 3 is a diagram showing additional details of the mechanisms of FIGS. 1 and 2 during a substrate effluent (gases, contaminants, films, particles, etc.) evacuation operation.

FIG. 3 shows additional details of the mechanisms of FIGS. 1 and 2 during a substrate effluent removal operation. As shown in FIG. 3, during the effluent removal operation, gas (e.g., nitrogen, $N_2$) is introduced through the first-side gas inlet 111 and the second-side gas inlet 113 of the first-side array of one or more lasers 115 and the second-side array of one or more lasers 117, respectively. As shown in FIG. 1, the first-side array of one or more lasers 115 and the second-side array of one or more lasers 117 may be considered as mounted on or in static manifolds. Gases are transported through the gas inlets 111, 113. In various embodiment, the array of one or more lasers is located on a gas manifold 305 and may be positioned concentrically or nearly concentrically within the first rotatable shield 101 and the second rotatable shield 103. In various embodiments, the gas manifolds are static (non-rotatable) and are positioned within the optional rotatable shields 101, 103 by a plurality of bearings 303 or other mechanical or electrical devices that are known in the art.

As shown in FIG. 3, there are two gas manifolds 305, one on either side of the substrate 119 with one or more lasers (not shown in FIG. 3) arranged in such a way that they emit laser radiation onto one or both surfaces of the substrate 119, covering the diameter (or other characteristic dimension) of the substrate 119 by various means as noted above. The one or more lasers 115, 117 (see FIG. 1) may also be arranged such that beams of adjacent ones of the one or more lasers (if multiple lasers are used on each side) overlap each other to clean an entire front or back surface of the substrate as well as an edge (or edges in the case of a non-circular substrate). Separate one or more lasers may be directed exclusively to edges of the substrate. By overlapping the one or more lasers, a higher removal of particulates, films, residues, and so can be achieved without reduced laser power or incident intensity. Moreover, the rotation of the substrate 119 during a cleaning operation ensures full substrate (faces and edge(s)) coverage during cleaning.

The gas manifold 305 may be formed or otherwise manufactured from, for example, polyvinylidene fluoride, or polyvinylidene difluoride, (commonly referred to as PVDF) or other non-reactive thermoplastic fluoropolymers, or various metals (e.g., aluminum), metal alloys (e.g., stainless steel), or other materials known in the art. As an example, PVDF material is generally inert to all solvents, bases, and acids.

During the effluent removal operation, the optional first rotatable shield 101, and consequently the finger arm 121 and finger-end cap 123 combinations, and the substrate 119 mechanically coupled to the arm/cap combinations, are either rotating at a predetermined velocity, or are accelerating to a predetermined velocity (or a series or predetermined velocities). The rotational motion expels effluents released from the substrate 119 into the substrate cleaning chamber 100 (see FIG. 1). The introduced gas (e.g., $N_2$) is redirected (to avoid direct impingement onto the substrate 119) by the gas dispersion mechanisms 215, 217 and serves to direct effluents released from the substrate within the substrate cleaning chamber 100. The released effluents are then directed by the introduced gas through the openings 125 between the rotatable shields 101, 103A of the chamber.

After being evacuated from the chamber, the expelled effluents 301 are then directed to the exhaust channel 213 in the outer chamber 200 (see FIG. 2). As explained in more detail below, the exhaust channel 213 is coupled in fluid communication with a facility exhaust in the environment (e.g., a semiconductor fabrication facility). Further, the exhaust channel 213 assists in preparing the outer chamber to be free of effluents, or substantially free of effluents, before further substrate cleaning operations are started.

Figure 4:
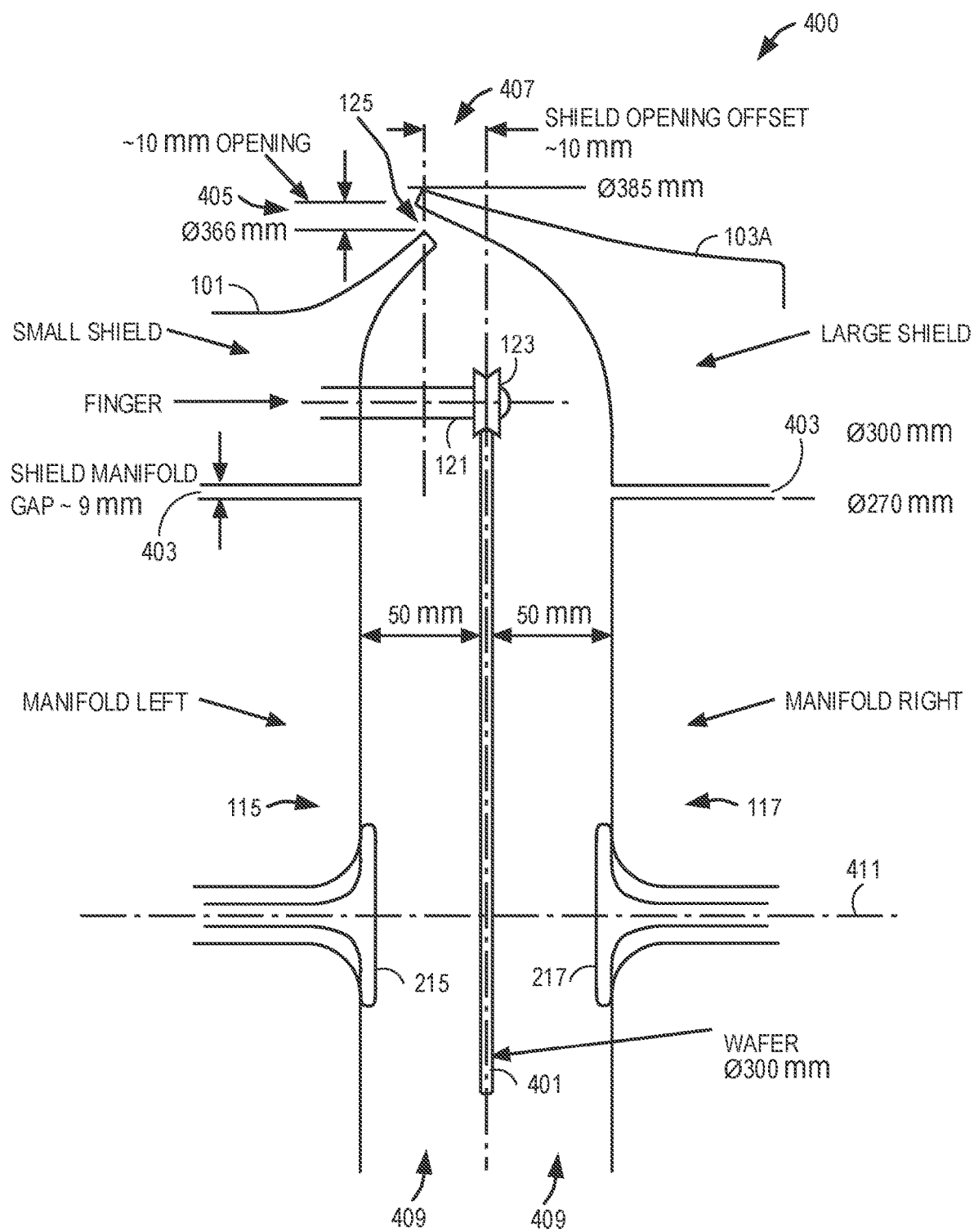
FIG. 4 shows examples of various physical dimensions of a portion of the substrate cleaning chamber mechanism of FIG. 1, when used with a 300 mm wafer.

Referring now to FIG. 4, examples of various physical dimensions of one embodiment of a portion 400 of the substrate cleaning chamber 100 of FIG. 1 when used with a 300 mm wafer is shown. The dimensions are provided merely as an aid in understanding the disclosed subject matter subject matter. As such, the provided dimensions should not be construed to limit the present disclosure in any way.

The chamber of FIG. 4 may be considered a center-exhaust chamber as described herein. The exemplary physical dimensions and layout were also used for various computational fluid dynamic (CFD) analyses described below with regard to FIGS. 18 and 19. In the example of FIG. 4, a 300 mm wafer 401 is shown mounted and mechanically coupled to the first rotatable shield 101. In this example, the 300 mm wafer 401 is mounted by a distance 409 of 50 mm from each of the first rotatable shield 101 and the second rotatable shield 103A. An axial centerline 411 (axis of rotation) is shown to indicate an approximately axial center of the wafer 401. The skilled artisan will recognize that the distance 409 may be adjusted readily based on factors such as a physical size of the substrate undergoing a cleaning operation. For example, a small substrate, such as a 100 mm semiconductor wafer, may be placed closer to the rotatable shields than may be required for a 300 mm wafer. Conversely, a substrate with a higher value of surface roughness, patterned or machined features, or other asperities, may require a distance 409 larger than 50 mm to remove effectively effluents released from the substrate having a rougher or patterned surface.

The first-side array of one or more lasers and the second-side array of one or more lasers are each spaced apart from the respective shields (the first rotatable shield 101 and the second rotatable shield 103) by a shield manifold gap 403 of 9 mm. The shield manifold gap 403 may be readily adjusted based on a number of factors such as anticipated vibrational considerations (e.g., when spinning a non-symmetrical substrate) and overall machining tolerances.

FIG. 4 also shows a shield opening 405 (a vertical distance between the two rotatable shields) of 10 mm. This gap may be adjusted readily for a given application depending on factors such as a volume of effluents expected to be released during cleaning operations and a rate at which effluents are evacuated from the substrate cleaning chamber.

As noted above, the person of ordinary skill in the art will recognize that the physical dimensions provided within FIG. 4 are exemplary only. (As the term is used herein, "exemplary" refers to one example or a set of examples only, and should not necessarily be construed as the preferred or best way to implement portions of the disclosed subject matter described herein.) Consequently, the physical dimensions should be viewed as aiding the skilled artisan in explaining the disclosed subject matter and therefore should not be seeing as limiting the scope of the disclosed subject matter.

Figure 5:
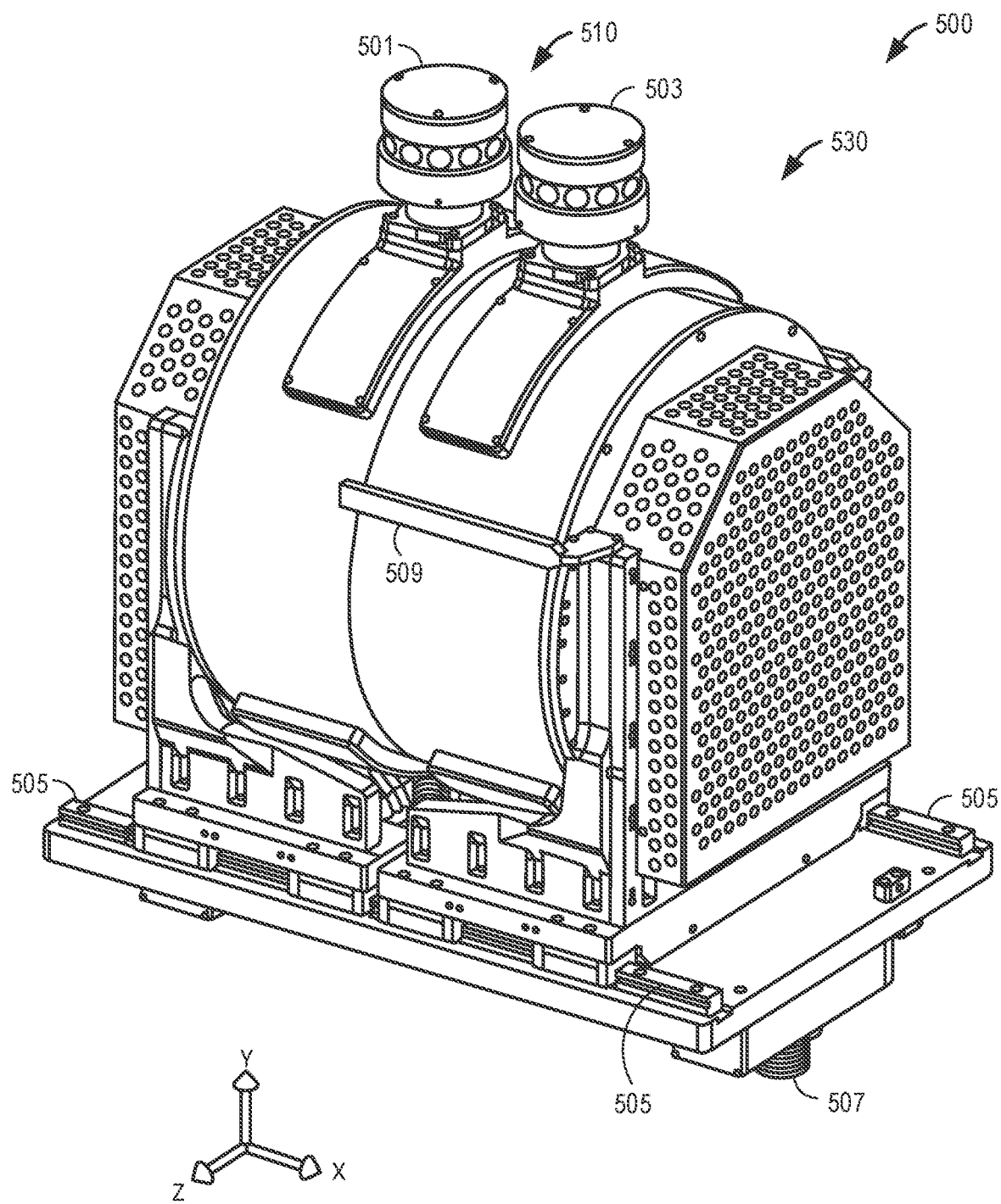
FIG. 5 shows a three-dimensional example of an exterior view of the substrate cleaning chamber mechanism of FIG. 1.

With reference now to FIG. 5, an example of a three-dimensional chamber 500 of the substrate cleaning chamber mechanism of FIG. 1 is shown. The three-dimensional chamber 500 is shown to include a first filter unit 501 mechanically coupled to a first portion 510 of the three-dimensional chamber 500 and a second filter unit 503 coupled to the second portion 530 of the three-dimensional chamber 500. Each of the filter units may contain, for example, a High-Efficiency Particulate Air (HEPA) filter, an Ultra-Low Particulate Air (ULPA) filter, or some other type of air/gas filter known in the art. A choice of the type of filter may be determined by a level of air/gas purity required for a given operation, substrate type, industry, or application. For example, a semiconductor device fabricator making high-density memory devices with small feature sizes (e.g., 65 nm or smaller) may require an ULPA filter whereas a solar-cell manufacturer working with polysilicon wafers with much larger feature sizes (e.g., 2 μm or larger) may only require a filter with a Minimum-Efficiency Reporting Value (MERV) rating of 16 or greater. Such filter designations are well-known in the relevant art.

Regardless of the efficiency rating of a given filter, the first filter unit 501 and the second filter unit 503 provide clean, filtered air to an interior of the chamber 500. For example, the filter units 501, 503 can provide a filtered-air make-up supply to the chamber. One function of the make-up air is to allow a steady flow of clean dry air into the chamber 500 as the chamber evacuates itself during the cleaning operations described herein. The chamber air and other gas (e.g., nitrogen) removal is supplemented by a house exhaust system within a given fabrication facility tied into an exhaust housing below the process chamber through exhaust ports 507, discussed below. The exhaust may be further supplemented by an exhaust fan (not shown) installed in the pump cabinet to prevent a drop in exhaust during the process cycle. Uses of the filtered air are described in more detail, below. Moreover, the first filter unit 501 and the second filter unit 503 can provide a filtered-air supply that can be used on various chamber controls including pneumatics on, for example, various electrical and control systems of the chamber 500. In certain operations (e.g., sub-10 nm semiconductor design rules), ultra-pure grade nitrogen is substituted for filtered air through the filter units 501, 503. In embodiments such as this, the filter units 501, 503 may not be used at all or even added to the chamber 500. In various embodiments, for the lower geometries of features under 10 nm, the disclosed subject matter can be tailored to meet the heightened and more stringent cleaning-requirements. For example, under these embodiments, the one or more lasers is emitted onto all substrate surfaces concurrently (e.g., frontside, backside, and one or more edges) in the sealed process chamber. At the end of the emission cycle, a controlled flow of ultrapure semiconductor-grade nitrogen gas is released into the process chamber via a valve and a mass flow controller to control both the flow and the pressure. The nitrogen gas removes the ejected nano-particles by carrying them into the chamber exhaust system. In embodiments, the process chamber is sealed using, for example, multiple arrays of O-rings or labyrinth seals.

As noted above with reference to FIG. 1, at least one of the rotatable shields 101, 103, is configured to be moved so as to place a substrate between the shields. The shields (not shown in FIG. 5) are located within the chamber 500. Consequently, either the first portion 510 or the second portion 530, or both, are configured to be moved along, for example, linear tracks 505 such that an end effector from a robot (described above) can place a substrate to be cleaned within the chamber 500. The substrate 119 is subsequently mounted within the rotatable shields (that are stationary unless undergoing a cleaning operation) and onto the three or more finger arm 121 and finger-end cap 123 combinations, as described above. A substrate-present sensor 509 aids in ensuring that the substrate (not shown) is present and is properly mounted and gripped by the finger arm 121 and finger-end cap 123 combinations. The substrate-present sensor 509 may be any of a variety of sensors known in the art such as, for example, a laser-based or other optically-based sensor.

For example, in various embodiments, the substrate-present sensor 509 may be an emitter-receiver type of sensor that emits a light beam once the substrate 119 is placed on the finger arm 121 and finger-end cap 123 combinations inside the chamber. A receiver (not shown) installed on an opposing side of the chamber to the substrate-present sensor 509 (e.g., at a backside of the chamber 500) receives the beam emitted by the sensor and provides input to a control processor (not shown but understandable to a skilled artisan) that the substrate is either vertically or horizontally placed and properly oriented in the substrate holding mechanism. If the wafer is not properly placed, the system provides an error message and prevents the machine from running until the substrate is removed and properly reinserted.

Each of the exhaust channels 213 (see FIGS. 2 and 3) may be in fluid communication with an exhaust port 507. The exhaust is, in turn, coupled to an exhaust within the facility in which the chamber 500 is installed.

Figure 6:
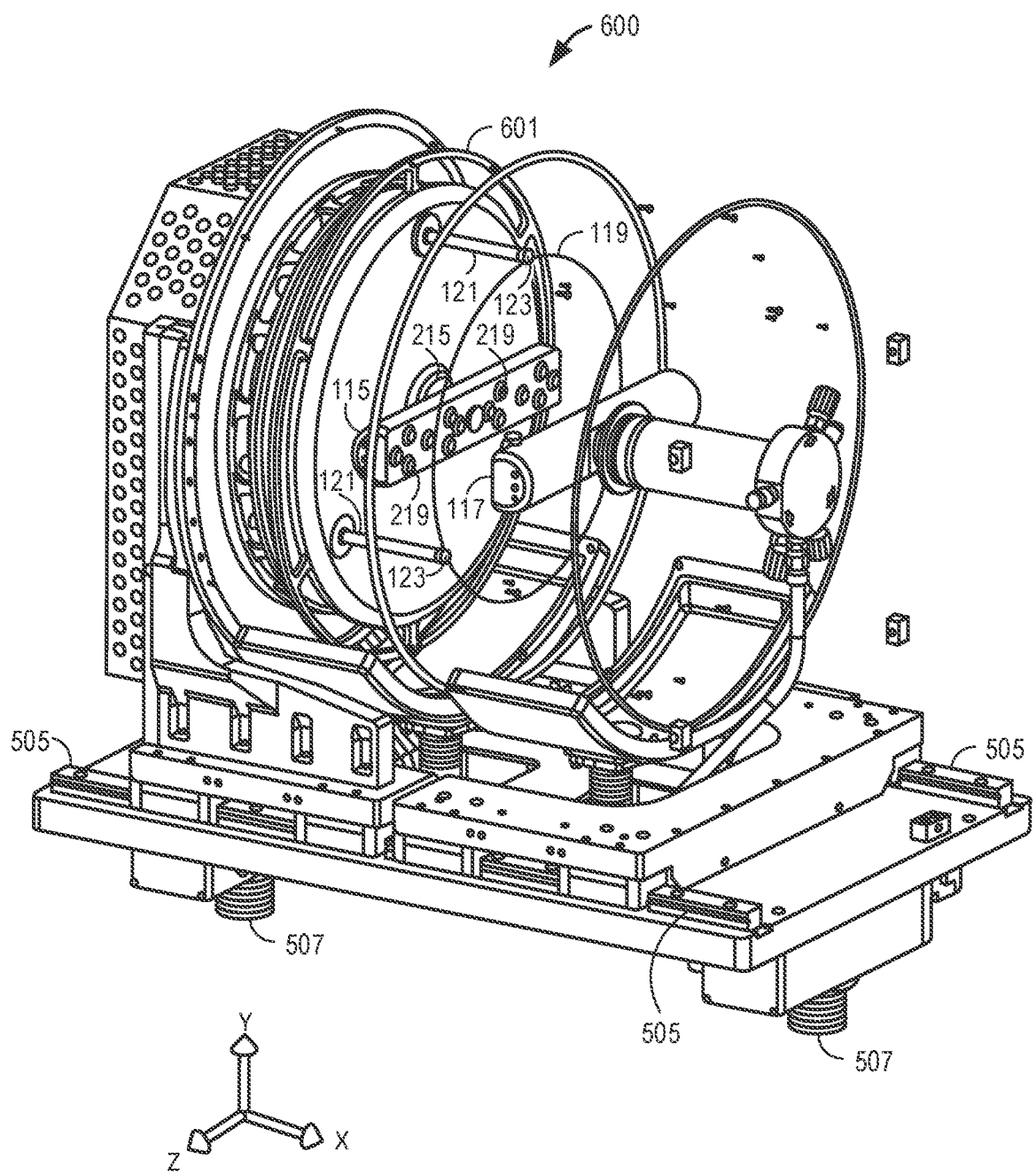
FIG. 6 shows a three-dimensional example of an interior portion of the chamber mechanism of FIG. 5.

FIG. 6 shows a three-dimensional example of an interior portion 600 of the three-dimensional chamber 500 of FIG. 5. The outer chamber and the rotatable shields have been removed in FIG. 6. As described above with reference to FIGS. 1 through 3, various components of the substrate cleaning chamber 100 (see FIG. 1) are shown in a specific exemplary embodiment. For example, the substrate 119 is shown mounted to three (only two are visible in FIG. 6) of the finger arm 121 and finger-end cap 123 combinations and situated apart from and between the first-side array of one or more lasers 115 and the second-side array of one or more lasers 117. Further, various ones of the one or more laser beams 219 are visible on the first-side array of one or more lasers 115.

Evacuation of effluents may be assisted by various types of turbine blade mechanisms 601 configured to withdraw various effluents from the chamber. Various embodiments of the turbine blade mechanisms 601 are described in more detail below, with reference to FIGS. 25A, 25B, and 26A-26C.

Figure 7:
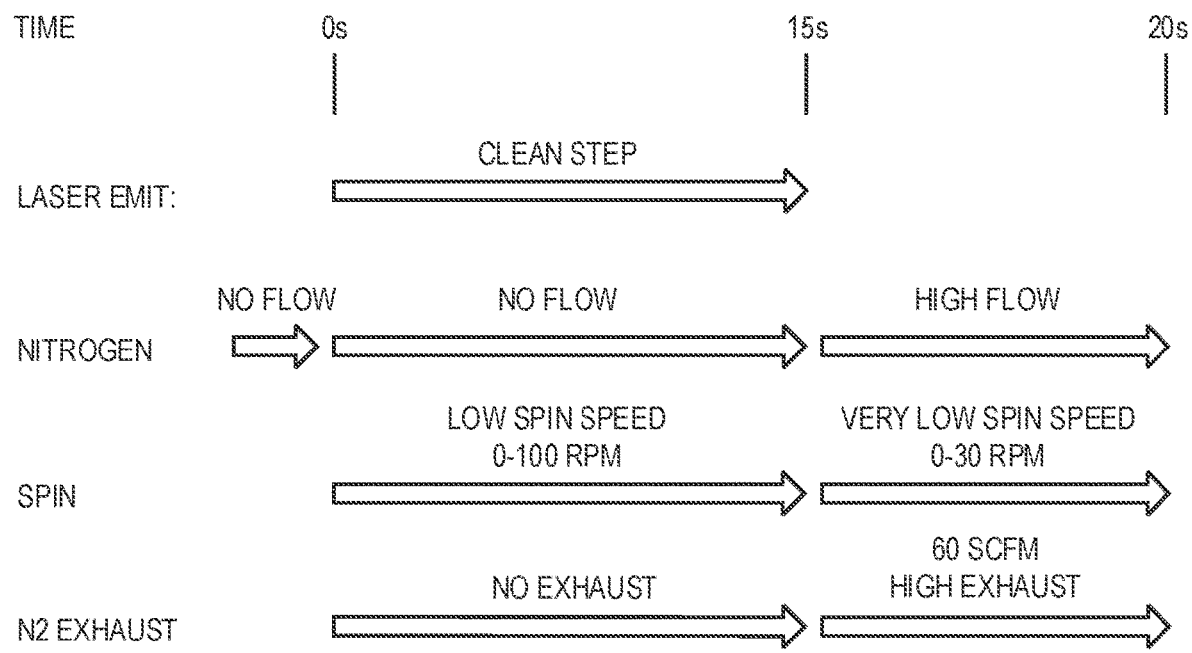
FIG. 7 shows an example of a process recipe for the substrate cleaning mechanism of FIGS. 1 through 6.

FIG. 7 shows an example of a process recipe 700 for the substrate cleaning mechanism of FIGS. 1 through 6. A substrate is placed within the clamping mechanism by an end effector on a robot (not shown). Once the substrate is loaded into the process chamber, the chamber receives a command from a controller or microprocessor (not shown but understandable to the skilled artisan) to start the process.

The one or more lasers may be turned again either before, after, or substantially concurrently with the flow of nitrogen or other high-purity gas as noted above. The one or more lasers are directed, either as a flat beam or scanned across the substrate, on either one or both faces of the substrate. In various embodiments, one or more separate lasers may be directed specifically at the edges of the substrate 119. Further, and as noted above and with concurrent reference to FIGS. 1 and 2, the first motor 105 provides a rotating (spinning) motion at a pre-defined, programmable speed, (described below), that is coupled with the optional first rotatable shield 101. As noted above, the rotating shields need not be employed in all embodiments. The rotating motion is subsequently coupled to the substrate 119. Therefore, as the first rotatable shield 101 rotates, the substrate 119 that is coupled to the rotatable shield also rotates at the same speed. The optional second rotatable shield 103 (now in the first position for the cleaning operation) is coupled to its own motor (i.e., the second motor 107) and also rotates. However, as described above, the speed of the second rotatable shield rotates at a preselected speed and is independent of the first rotatable shield 101, and consequently, the second shield is also independent of the speed of the rotational speed of the substrate 119.

In a specific exemplary embodiment, the skilled artisan can assume that the optional second rotatable shield 103 is rotating at the same speed but in the opposite direction as the optional first rotatable shield 101. In other embodiments, the second shield is rotating in the same direction as the first shield. In still other embodiments, the second shield is rotating in either the same direction or the opposite direction as the first shield and at either a higher or lower speed. Additionally, either the first or the second shields may be rotating at continuously or intermittently variable, programmable speeds and directions. The speeds (fixed or variable) and the directions (the same direction for both shields or having counter-rotations at the same or different times) can each be customized and depend on factors such as the substrate type and shape, laser cleaning powers employed, a level of cleanliness desired for a give substrate type, and other factors discernible to the skilled artisan.

Substantially simultaneously as the substrate rotation and the laser emission begins, the gas flow (e.g., ultra-pure nitrogen) is provided at into the chamber 100 at a relatively low flow rate (e.g., about 283 lpm or approximately 10 scfm). The introduced gas is dispersed within the chamber 100 via the gas dispersion mechanisms 215, 217 (see FIG. 2). The gas dispersion mechanisms create a low-pressure, high-velocity flow of gas (e.g., nitrogen) proximate to the rotating substrate. In specific embodiments, the gas flow rate is maintained at this rate until about the second wetting cycle (at times of about 13 seconds to about 15 seconds) when the gas flow rate increases to about 1700 lpm (approximately 60 scfm) to about 2265 lpm (approximately 80 scfm). The gas flow is also exhausted from the chamber 100 at operation 707 at about the same time (or within several seconds either before or after the introduction of the gas at operation 703).

Continuing with the cleaning operation, a high exhaust is pulled from the fabrication facility that is further augmented by an exhaust fan placed in the pump cabinet (not shown but readily understood by a person of ordinary skill in the art). As shown in various figures, as the exhaust tubes on both sides of the substrate pull exhaust they create a negative flow in the chamber that is balanced by both gas being dispensed from the central manifold and make-up clean dry air being pulled in from the filter units 501, 503 (see FIG. 5) above the chamber. By balancing both systems via pressure and flow control of the gas, an improved or optimum cleaning environment is achieved within the chamber during the cleaning operations.

At approximately the same time that the gas flow rate is increased at about 15 seconds into the cleaning operation, the shields, and consequently the substrate, are ramped down in rotational speed to approximately 0 to about 300 rpm. Effluent removal from the substrate is substantially performed via the spinning of the substrate while the area around the substrate is controlled by the central exhaust and gas dispense systems. Certain values of the exhaust are set as parameters into the control software so if, for example, the exhaust is out of a pre-programmed range, the system may enter into a default mode until corrected.

A skilled artisan will recognize that one limitation of an upper rotational speed is at least partially dependent on an overall dynamic balancing of the components of the inner and outer chambers, coupled with an overall balance of the substrate (e.g., an overall physical symmetry of the substrate, concentricity of mass balance homogeneity of the substrate, and a number of other factors recognizable to a skilled artisan).

As both shields and the substrate rotate at operation 705 during the cleaning operation, effluents coming from the rotating substrate may be evacuated through the opening 125 (see FIG. 1) in the rotatable shields due to a centrifugal effect. In embodiments, one or both of the rotatable shields 101, 103 may now be rotated at a higher speed to further facilitate the evacuation and removal of the various effluents from the substrate and the chamber 100. At substantially the same time, the low-pressure, high-velocity flow of gas substantially or completely removes effluents from faces and edge(s) of (e.g., immediately proximal to) the rotating substrate.

At the end of the cleaning operation, the emission of radiation from the one or more lasers 219 (e.g., see FIG. 6) are stopped, the gas is continued for another time period. The chambers 100, 200 are then opened and the substrate 119 is removed from the clamping mechanism by a separate, clean end-effector (e.g., as opposed to the same end-effector used to place the "dirty" substrate) of the robot (not shown). In the above final step, the substrate is rotated at a high speed, thereby removing all or substantially all of the effluents (e.g., nano-contamination from films, particulates, etc.). The optional shields may continue rotating at high speed, coupled with a high exhaust, yield a clean substrate.

As disclosed herein, in some embodiments, a curvature of the optional shields (see FIGS. 3 and 4) may be designed such that the various effluents move towards the outer edge (i.e., proximate the opening 125) of the shields and is removed via the opening 125 and into the outer chamber 200 and collected by the channel 213 (see FIGS. 2 and 3). In other embodiments, where the shields 101, 103 are straight but angled away from a direction of axial rotation of the shields (e.g., see FIG. 1), effluents are also evacuated from the chamber 100 in a similar fashion as described with regard to the curved shields. A speed of the rotatable shields can be increased to increase evacuation of the effluents from the chamber 100.

As would be recognized by a person of ordinary skill in the art, a high-rotational speed of the two rotatable shields 101, 103 creates a pressure differential between the substrate and the area around it that further facilitates the removal of effluents away from the rotating substrate. The high-speed rotation of the substrate, coupled with the gas flow and rotation of the shields, removes all or substantially all effluents thereby cleaning the substrate. The secondary gas (e.g., nitrogen) flow mechanism, described in more detail below with reference to the computational fluid dynamics (CFD) modeling portion of this disclosure, creates a gas barrier substantially preventing particulate migration into the substrate cleaning chamber 100 from the outer chamber 200.

As will be recognized by the skilled artisan upon reading and understanding the disclosure provided herein, during the cleaning and the effluent removal operations a speed of the rotatable shields can be manipulated to effect a volumetric removal of the effluent. The effective removal of all or substantially all the effluents help to produce a clean substrate at the end of the cleaning operations. In other embodiments, an optional single-sided (or single-faced) cleaning operation may also be employed (with or without edge cleaning of the substrate). In still other embodiments, the substrate may be cleaned on alternate sides rather than cleaning both sides simultaneously.

The skilled artisan will appreciate that many operations, repetitions of operations, sequences of operations, and so on may be employed to develop a process recipe for a given substrate or industry. Therefore, the operations detailed with reference to FIG. 7 are given as an example only, and may vary considerably based on the needs of an end-user of the substrate cleaning mechanism disclosed herein. Further, each of the operations is programmable for a given substrate type and size. Moreover, Each of the Dynamic Process Parameters, Such as Spin Speed, optional shield rotation speed, time of the incident energy and one or more laser wavelengths, the number of lasers, and so on, can be designed for various substrate types, sizes, and applications.

Substrate-Holding Mechanism

Figure 8:
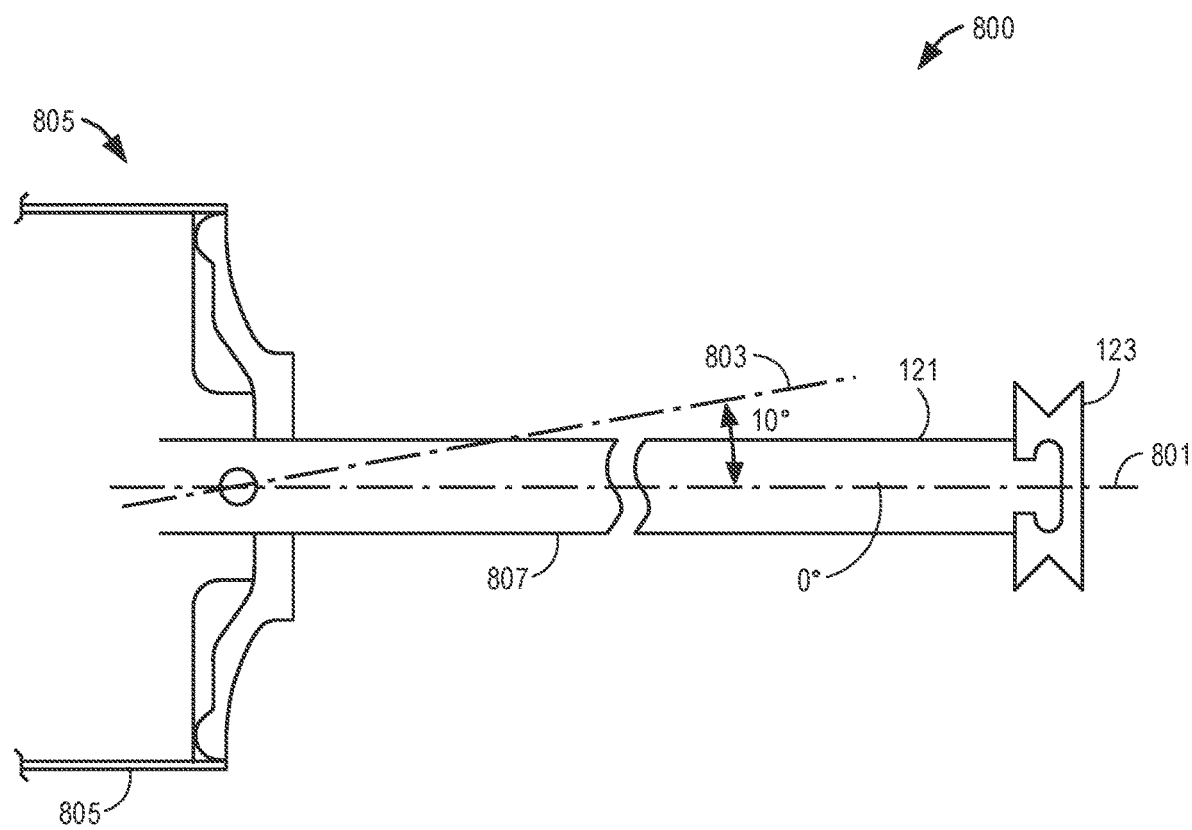
FIG. 8 shows an example of a separation diagram for a finger arm and finger-end cap combination for holding a substrate.

Referring now to FIG. 8, a separation diagram 800 for the finger arm 121 and finger-end cap 123 combination is shown. Depending on a shape of the substrate used in the substrate cleaning mechanism, only one finger/end-cap combination needs to be movable away from the substrate to facilitate load and unload operations. For example, in an embodiment of the finger arm 121 and finger-end cap 123 combinations used for holding and clamping a circular substrate (e.g., a semiconductor wafer), there are three fingers holding the substrate with each of the fingers spaced apart from each other at about 120 degrees. In this example, only one of the finger arm 121 and finger-end cap 123 combinations need to be movable (although more than one finger may be movable to accommodate various combinations of end effectors of a robot (not shown).

As shown in FIG. 8, a movable finger 807 of the finger arm 121 and finger-end cap 123 combinations is coupled to a cam housing 805 (described in more detail below). The movable finger is in a normal operating position 801 of about 0° and in a first separated-position 803, in this example, at about 10°. The normal operating position 801 occurs when the finger arm 121 and finger-end cap 123 combination is in a clamping position (i.e., when a substrate is being held within the finger/cap combinations) or an unloaded position. The separated position 803 occurs when the finger arm 121 and finger-end cap 123 combination is opened (i.e., away from the axial centerline 411 (see FIG. 4)) to facilitate loading or unloading a substrate (not shown in FIG. 8).

In an example where the substrate is non-circular (e.g., square), four or more finger arm 121 and finger-end cap 123 combination may be used to accommodate the substrate. In this example, two of the finger arm 121 and finger-end cap 123 combinations may be movable, gripping fingers to facilitate mounting and removal of the substrate. The other two fingers are fixed (i.e., stationary) in position. In general, any combination of movable, gripping fingers and stationary fingers can be designed to address different applications. One consideration, regardless of the number of fingers, is that the fingers be balanced around the axial centerline 411 (see FIG. 4) when combined with a substrate to reduce or eliminate vibrational effects caused by a rotating substrate during cleaning operations.

Figure 9:
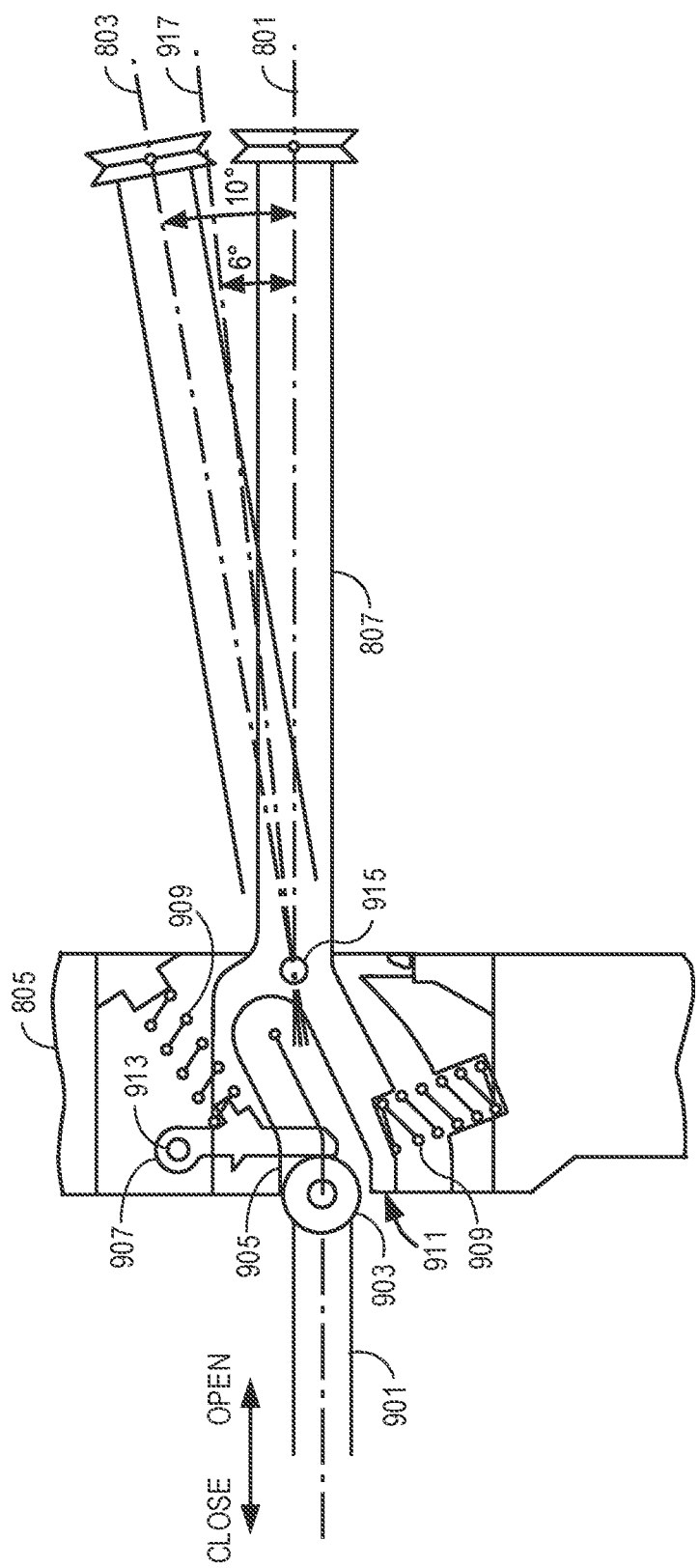
FIG. 9 shows an exemplary embodiment of a finger and cam housing mechanism for the finger arm and finger-end cap combination of FIG. 8.

With reference now to FIG. 9, an embodiment of a finger and cam housing 805 detail is shown that includes a pusher 901, a cam follower 903, a cam-follower surface 905, a cam-return finger 907, one or more cam-return springs 909, and a lower cam-surface structure 911. When a substrate (not shown) is to be either inserted or removed, the cam follower 903 slides over the cam-follower surface 905 and opens the movable finger 807 around a pivot point 915 to the first separated-position 803 of about 10°. In alternative embodiments, the movable finger 807 may be opened to a second separated-position 917 of about 6°. In embodiments, the movable finger 807 may be opened to the first separated-position 803 when inserting a substrate and opened to the second separated-position 917 when removing a substrate (or vice-versa or various combinations of the above). The skilled artisan will recognize that the movable finger 807 may be pivoted to other angles, at least partially depending on an overall size of the shields, the chamber, the substrate, and other factors.

When the pusher 901 and the cam follower 903 retract, the movable finger 807 will be forced by the one or more cam-return springs 909, respectively acting on the cam-return finger 907 and the lower cam-surface structure 911 to close, thereby gripping (clamping) the substrate. An electrical (e.g., proximity or laser-based) or mechanical sensor (not shown) may be used to verify that the substrate is properly inserted into the combination of movable and stationary fingers.

In various process recipes, a substrate may rotate at 2200 rpm (or higher) during an effluent removal operation. Depending on factors such as a physical size (e.g., diameter), mass of the substrate, and rotational speed, any offset of the movable and stationary fingers from being co-axial may create a dangerous wobble and vibration. The one or more cam-return springs 909 may then not be able to hold the substrate in place, thereby potentially resulting in a catastrophic failure (e.g., release and destruction of the substrate). To address this potential problem, a negative locking-mechanism (not shown in FIG. 9) engages an aperture 913 (e.g., an opening or hole) in the cam-return finger 907.

Figure 10A:
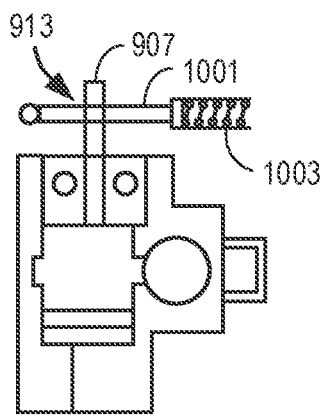
FIG. 10A shows an exemplary actuator mechanism used with the finger and cam housing mechanism of FIG. 9 to lock the substrate in place.
Figure 10B:
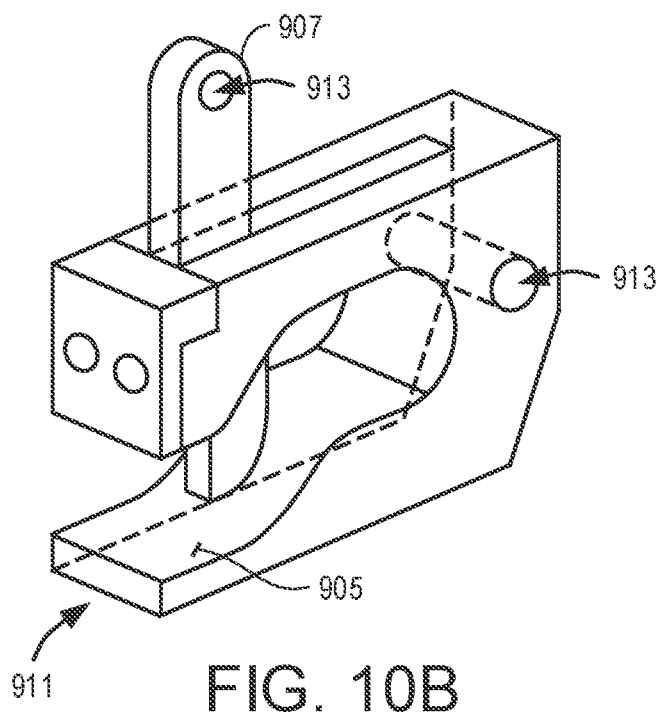
FIG. 10B shows a three-dimensional view of a portion of the cam housing mechanism of FIG. 9.

With concurrent reference to FIG. 9, in one embodiment, an actuator mechanism 1001 of FIG. 10A may engage the aperture 913 in the cam-return finger 907 when the combination of the pusher/cam follower 901, 903 is in the normal operating position 801 (e.g., the closed position), thereby locking the movable finger 807 in the normal operating position 801. The actuator mechanism 1001 may be, for example, operated by a small solenoid (not shown), pneumatic cylinder (not shown), or other linear-actuator mechanism known in the art. The actuator mechanism 1001 may be kept in a locked position by a small spring 1003. FIG. 10B shows a three-dimensional view of a portion of the cam housing mechanism of FIG. 9.

Alternate Embodiments of the Substrate Cleaning Mechanism

Figure 11:
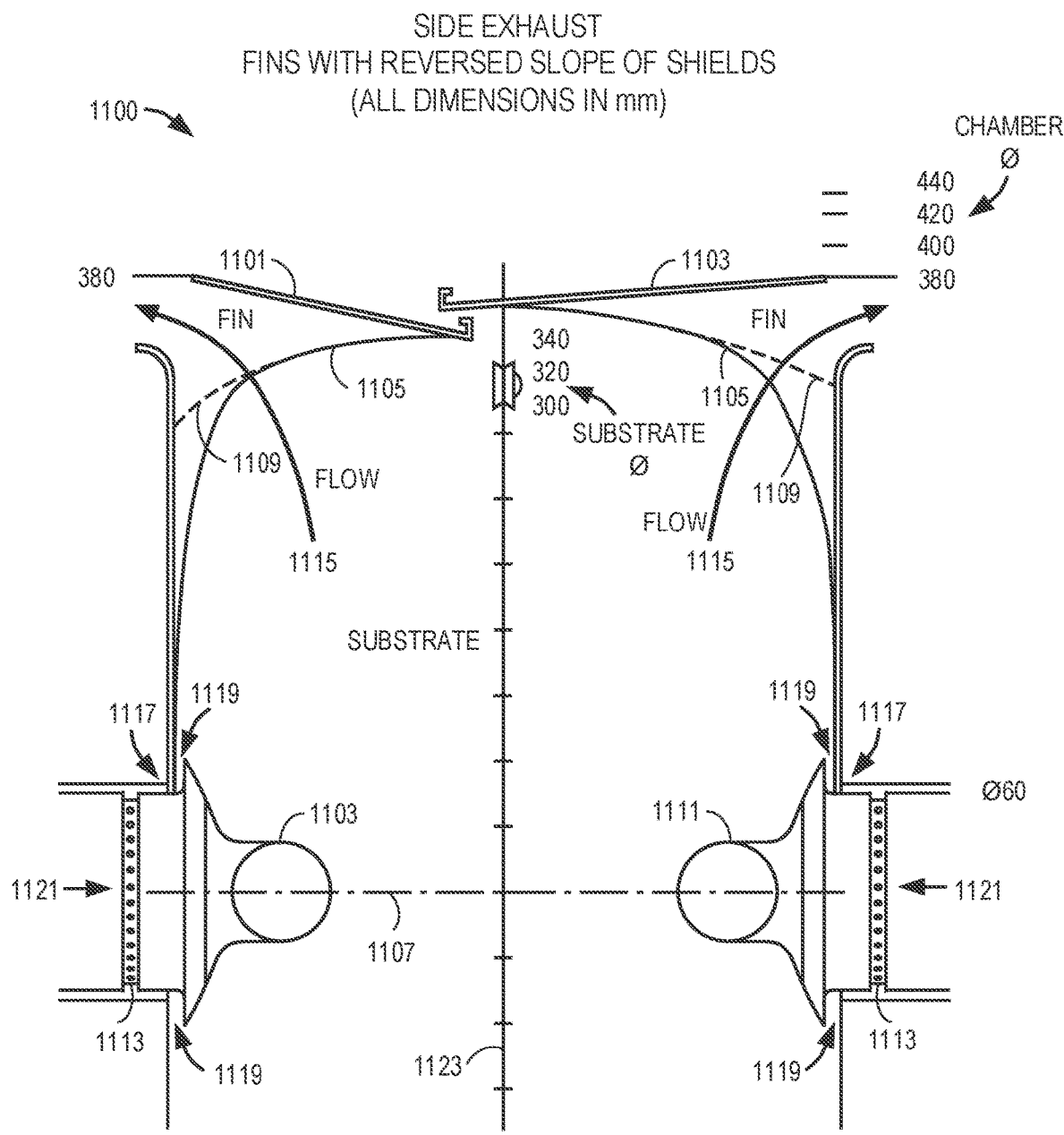
FIG. 11 shows a portion of an exemplary alternative chamber-design of the substrate cleaning chamber of FIG. 1.

FIG. 11 shows an alternative chamber-design 1100 to the substrate cleaning chamber 100 of FIG. 1. FIG. 11 may be considered as a side-exhaust chamber design as described below. FIG. 11 is shown to include, in this embodiment, a master side 1110 and a slave side 1120 (see FIG. 12). As described above with regard to FIG. 1, in one embodiment, the slave side 1120 of the chamber 1100 moves away from the fixed, master side 1110 of the chamber 1100 to facilitate substrate mounting and removal onto the finger arm 121 and finger-end cap 123 combinations. Although many of the fluid mechanical concepts may be similar to chamber of FIG. 1, the alternative chamber-design 1100 relies on having a left-side fin 1101 and a right-side fin 1103 each having a reverse slope as compared with the optional rotatable shields of the chamber of FIG. 1.

For example, an angle of the fins 1101, 1103 (relative to normal of a centerline location 1123 of either a vertical or horizontal position of the substrate (not shown)) may be from about 3° to about 15° or more. The fins may overlap each other as shown, or, alternatively, may touch or nearly touch each other is shown with regard to FIG. 12, described below. If the fins 1101, 1103 actually touch, the skilled artisan will understand that both of the fins 1101, 1103 will rotate in the same direction at the same rotational speed.

The fins 1101, 1103 may be mechanically coupled to a rotational mechanism (not shown but understandable to a skilled artisan and similar to or the same as the rotatable shields of FIG. 1) by a number of support structures 1105. The support structures may be continuous around an entire periphery of the fins 1101, 1103 (with reference to an axial centerline 1107), or may, in another embodiment, comprise separate support arms located at two or more locations around the periphery of the fins 1101, 1103. If the support structures 1105 comprise a continuous structure, an area 1109 near an exhaust area 1115 of the alternative chamber-design 1100 includes a number of apertures, openings, slots, or other non-continuous portions of the support structures 1105 such that gases and effluents released from the substrate during the cleaning operation may readily be exhausted from the chamber 1100. All dimensions are exemplary only and are given in millimeters.

FIG. 11 is also shown to include gas-dispersion devices 1111 that each include a porous area 1113 containing a number of openings to disperse gas around a periphery of an incoming gas (e.g., ultra-pure nitrogen) along a gas inlet channel 1121 (such as a tube having a circular or other cross-section) In various embodiments, the gas-dispersion devices 1111 may be screwed, press-fit, chemically adhered, or otherwise affixed to accept the incoming gas from the gas inlet channel 1121. The gas from the porous area 1119 diverts the incoming gas from impinging onto a face of the substrate (not shown in FIG. 11). Thus, the gas-dispersion devices 1111 may function the same as or similar to the gas-dispersion mechanisms 215, 217 of FIG. 2. The gas dispersion mechanisms are explained in more detail below in the computational fluid dynamics (CFD) analysis portion of this disclosure.

Figure 12:
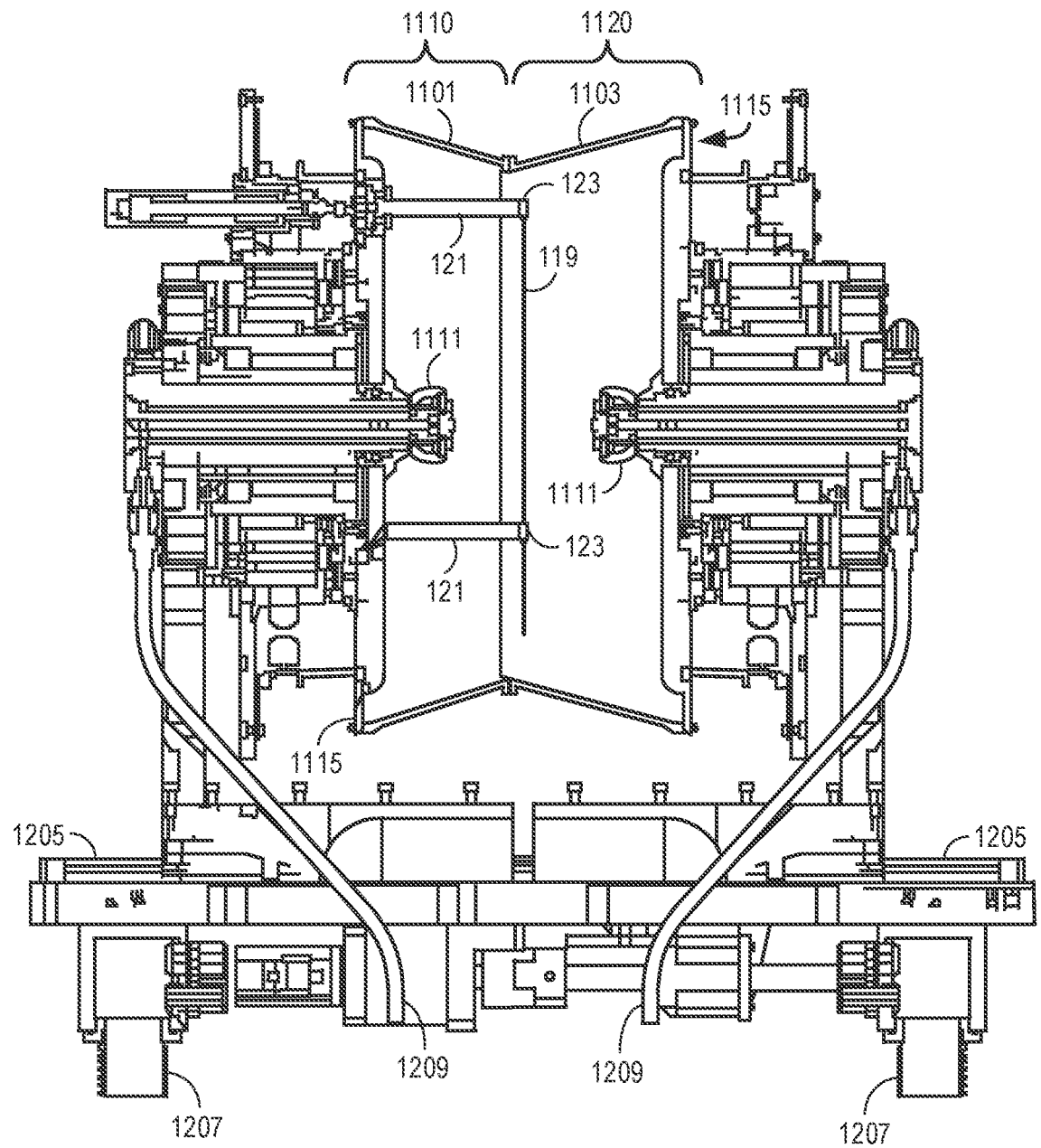
FIG. 12 shows an example of an interior cross-section of the alternative chamber-design of the substrate cleaning chamber mechanism of FIG. 11.
Figure 12:
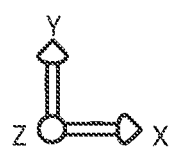

FIG. 12 shows an example of the alternative chamber-design 1100 of the substrate cleaning chamber mechanism of FIG. 11. In FIG. 12, the left-side fin 1101 and the right-side fin 1103 may come into close contact with one another or may optionally touch each other, as noted above. If the fins 1101, 1103 actually touch, the skilled artisan will understand that both of the fins 1101, 1103 will rotate in the same direction at the same rotational speed.

FIG. 12 is also shown to include gas supply lines 1209, a plurality of gas exhaust lines 1207, and linear tracks 1205 to open, for example, the slave side 1120 of the chamber 1100 to facilitate mounting and removal of a substrate 119. Additionally, the alternative chamber-design 1100 may be placed within an outer chamber, such as the outer chamber 200 of FIG. 2. The outer chamber for the alternative chamber-design 1100 may also include an optional exhaust channel 213 (see FIG. 2).

Figure 13:
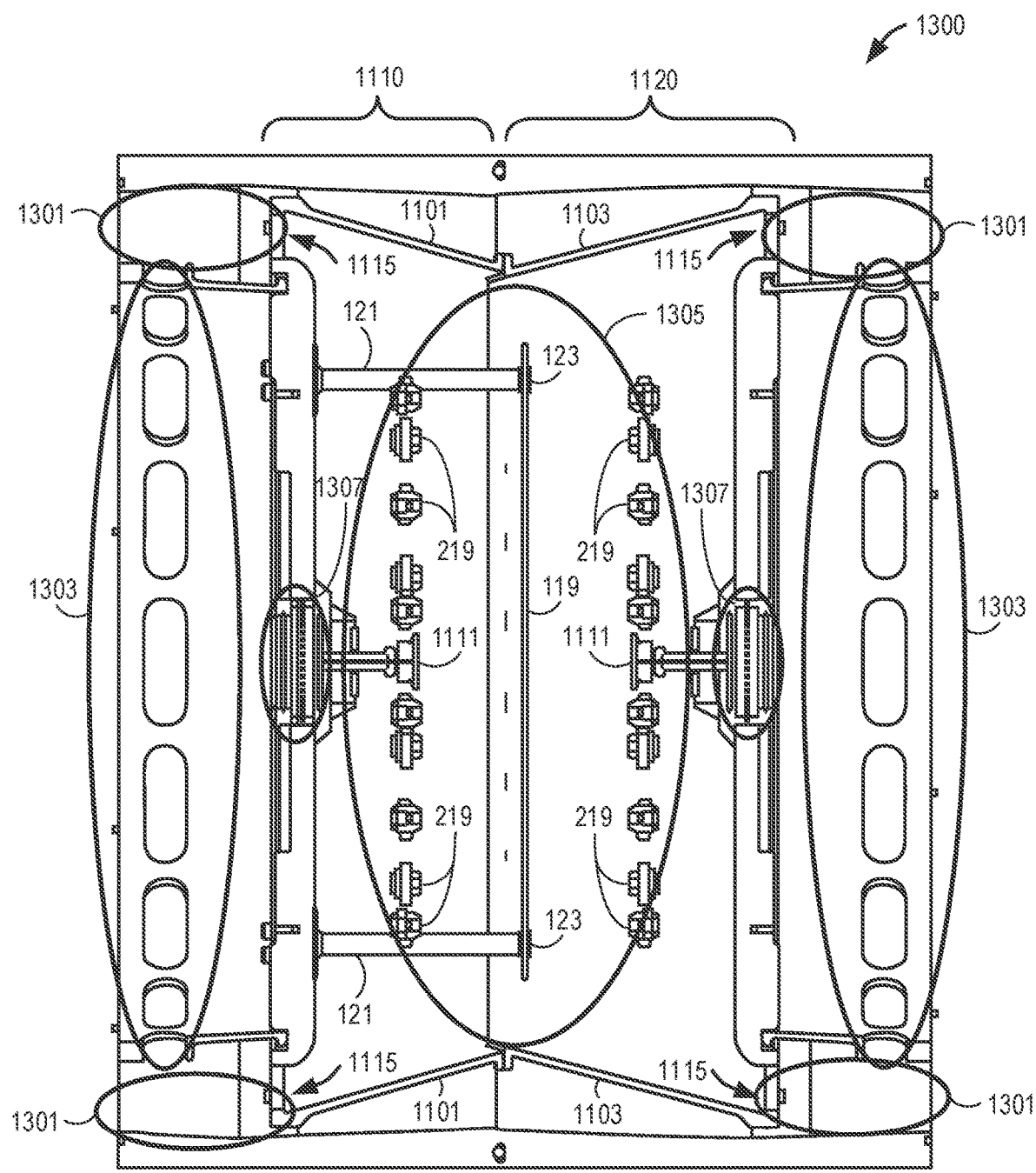
FIG. 13 shows additional details of an example of a cross-sectional inner-chamber view of the alternative chamber-design of FIGS. 11 and 12.

FIG. 13 shows an example of a cross-sectional inner-chamber view 1300 of the alternative chamber-design 1100 of FIGS. 11 and 12. The inner-chamber view 1300 of FIG. 13 is shown to include exhaust areas 1301, effluent and gas-exhaust areas 1303, a chamber inner-core area 1305, and air-knife separation areas 1307 (an inner portion of the gas-dispersion devices 1111 of FIG. 11). The air-knife separation areas 1307 may be balanced with gas inlets 111, 113 (see, e.g., FIG. 3) of the central incoming gas supply system (coming from the center of the gas manifold 305 (FIG. 3) such that these systems do not work against each other during cleaning operations.

FIG. 13 also shows one or more lasers 219, as described above with reference to FIG. 2 and FIG. 6, and their relative placement with regard to the substrate 119. Functions of the various elements are similar to or the same as those described herein with regard to items having similar element numbers. Other elements are described in more detail below.

Figure 14:
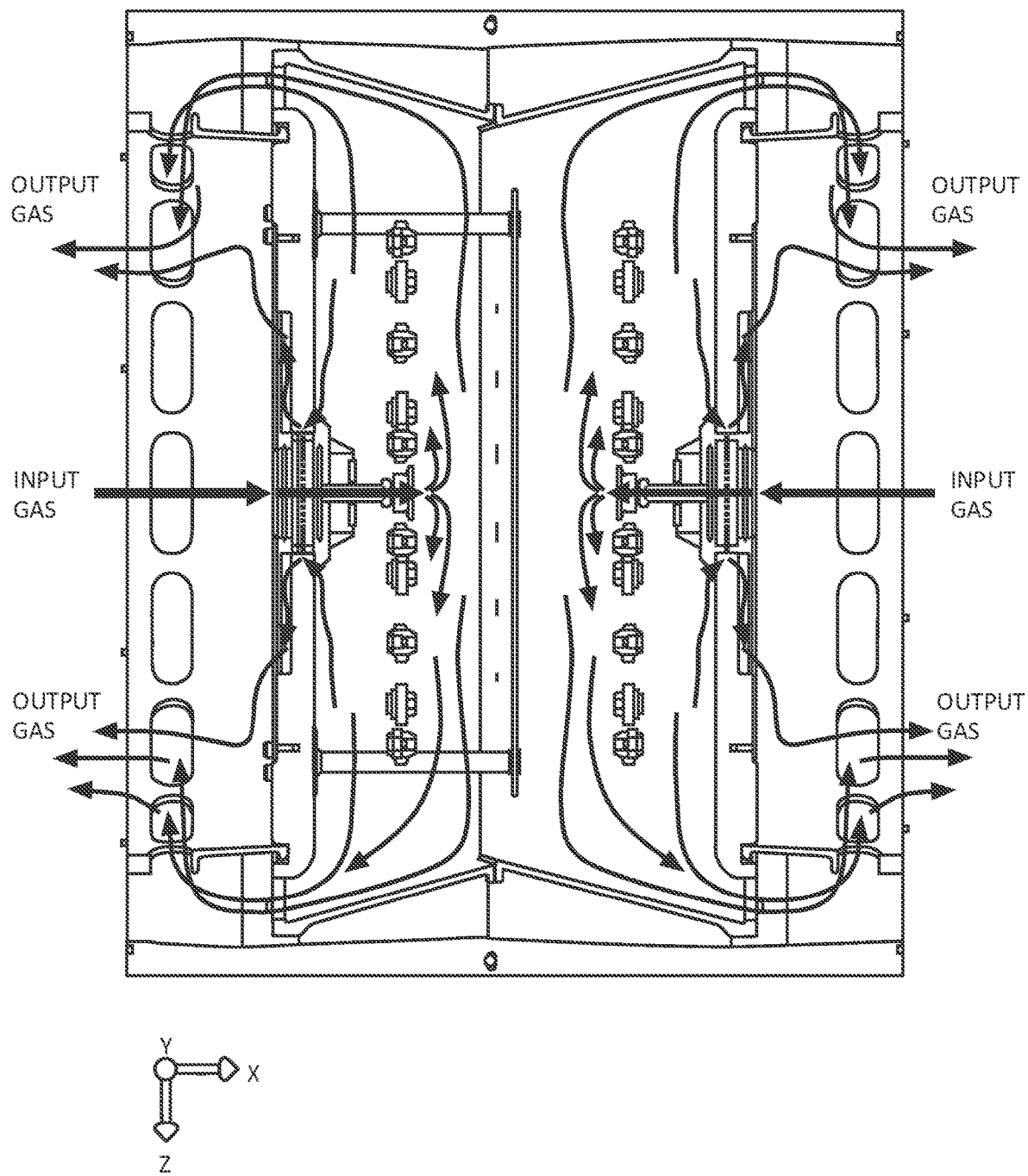
FIG. 14 shows an example of the cross-sectional view of FIG. 13 showing gas stream-lines during a substrate cleaning operation.

For example, with concurrent reference to FIG. 13, FIG. 14 shows the example of a cross-sectional inner-chamber view of FIG. 13 and additionally shows approximate locations of an example gas stream-lines that occur during a substrate cleaning or effluent removal operation. As shown in the specific exemplary embodiment of FIG. 14, gas (e.g., ultra-pure nitrogen) is introduced into the chamber inner-core area 1305 through the gas-dispersion devices 1111 and circulates within the chamber volume to draw effluents away from the substrate 119 and out the exhaust areas 1115. Exhausting the gases, and other effluents, is further aided by turbine fins (see FIG. 6) located within in the gas-exhaust areas 1303. The turbine fins are located on and rotate at the same speed and direction as the fins in the master side 1110 and the slave side 1120 of the chamber 1100.

Figure 15:
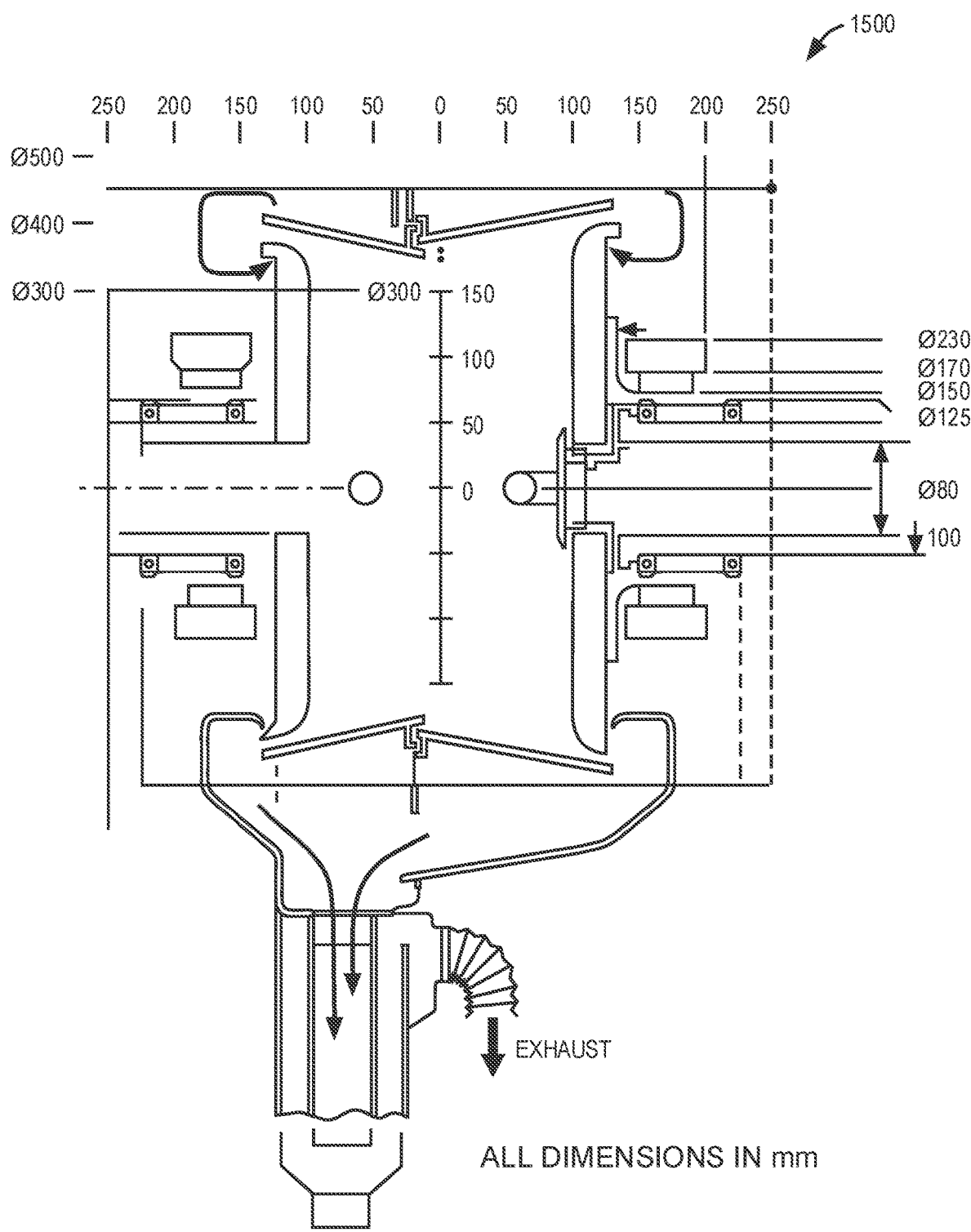
FIG. 15 shows exemplary dimensions of an embodiment of the alternative chamber-design of FIGS. 11 and 12.

FIG. 15 shows exemplary dimensions 1500 of an embodiment of the alternative chamber-design 1100 of FIGS. 11 and 12. For example, FIG. 15 shows an example of a chamber design for a 300 mm semiconductor wafer. However, the skilled artisan will recognize that the exemplary dimensions may be readily modified to accommodate substrate of various sizes and cleanliness requirements for those substrates. Therefore, the person of ordinary skill in the art will recognize that the physical dimensions provided within FIG. 15 are exemplary only. (As noted above, the term as used herein, "exemplary" refers to one example or a set of examples only, and should not necessarily be construed as the preferred or best way to implement portions of the disclosed subject matter disclosed herein.) Consequently, the physical dimensions given by FIG. 15 should be viewed as aiding the skilled artisan in explaining and understanding the disclosed subject matter and therefore should not be seen as limiting the scope of the disclosed subject matter.

Figure 16A:
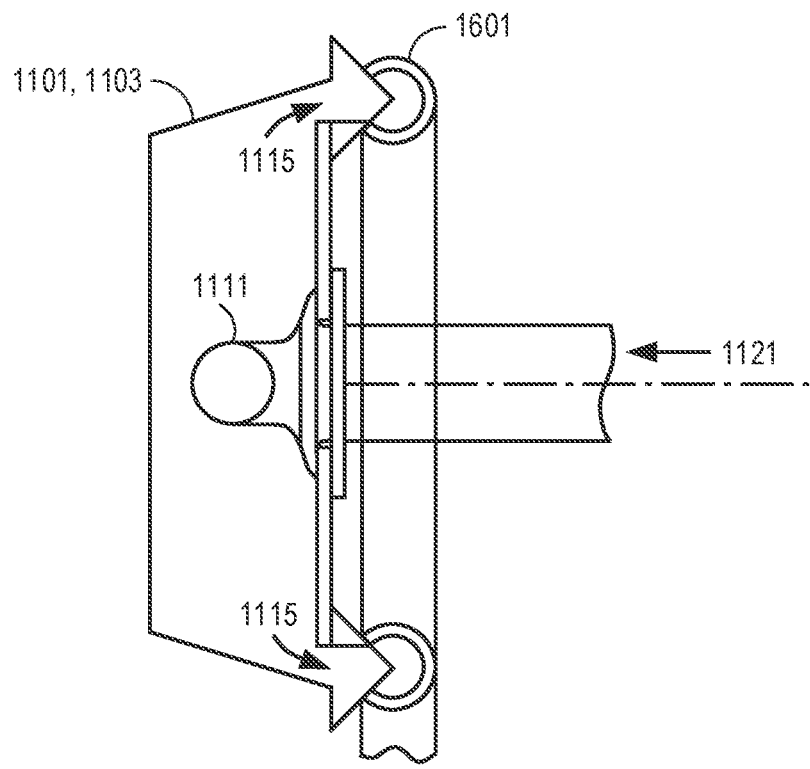
FIGS. 16A and 16B show an alternative or optional embodiment for removing effluents (gases, contaminants, films, particles, etc.) from the chamber-design of FIGS. 11 and 12.
Figure 16B:
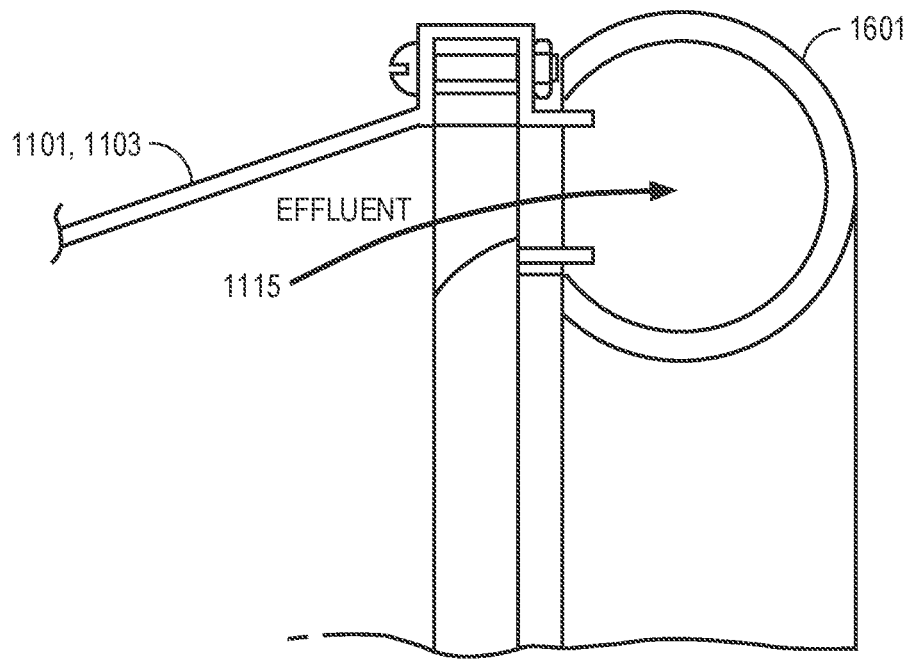

FIGS. 16A and 16B show an alternative or optional embodiment for removing effluents from the chamber-design of FIGS. 11 and 12. For example, instead of or in addition to the various effluent dropping or otherwise settling or adhering directly into the outer chamber 201 (see, for example, FIGS. 2 and 3), the effluents may be directed into an exhaust channel 1601. The exhaust channel 1601 may be constructed of, for example, polyvinyl chloride (PVC) or a number of other materials described herein or known in the art. The exhaust channel 1601 can be considered, in one embodiment, to be a toroid, that exhausts directly into the outer chamber 201 (see FIG. 2) or directly into exhaust ports, such as the gas exhaust port 507 of FIG. 5. In other embodiments, the exhaust channel 1601 may be used in conjunction with the optional exhaust channel 213 of FIG. 2.

Figure 17:
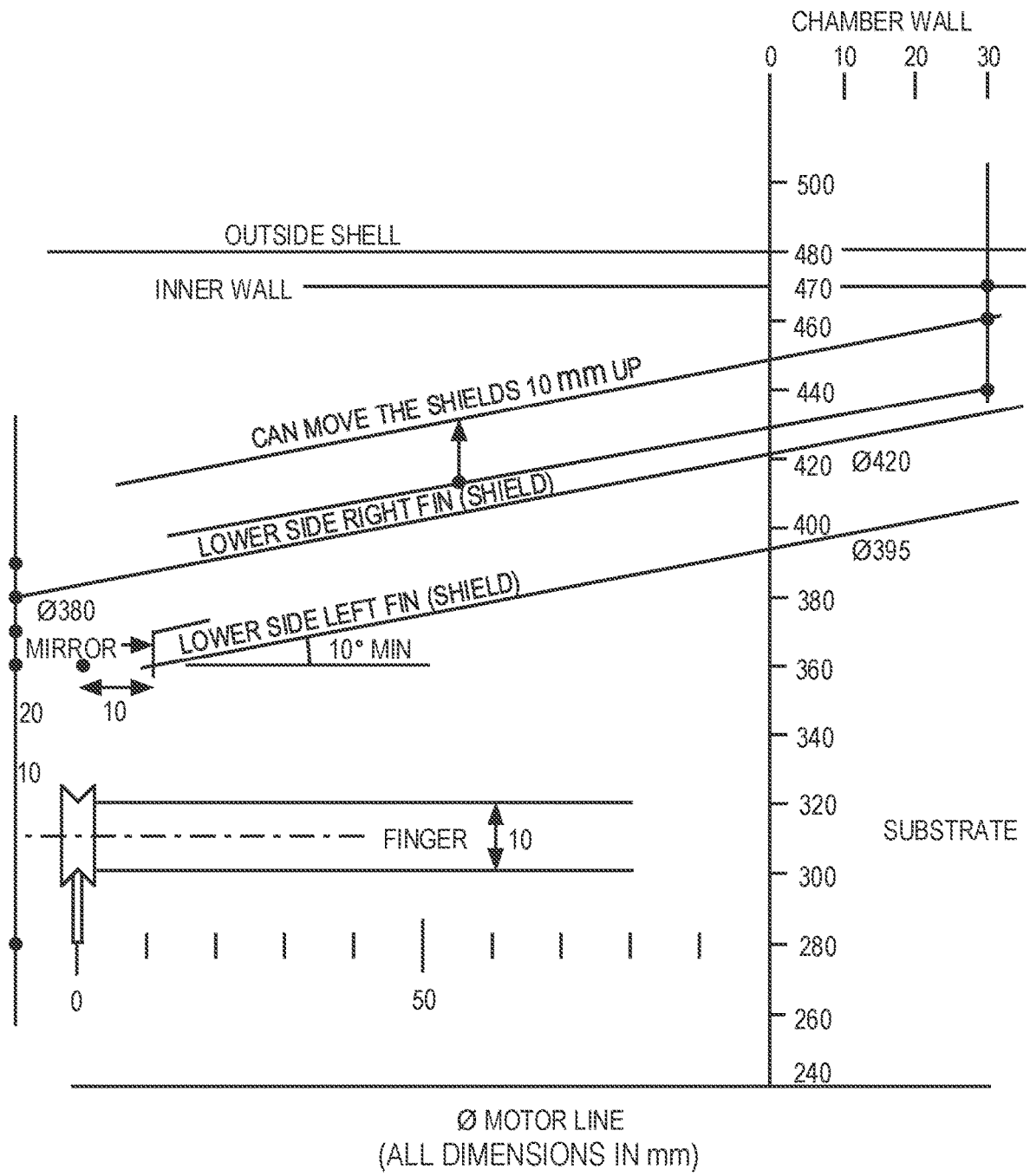
FIG. 17 shows an exemplary embodiment of a nomogram 1100 used to determine a relationship between various physical dimensions of the substrate cleaning mechanism disclosed herein.

With concurrent reference to FIGS. 2 and 3, FIG. 17 shows an embodiment of a nomogram 1700 used to determine a relationship between the outside shell of the chamber, the inner wall of the outside chamber, a lower side of the left-side fin 1101 (left rotatable shield) and right-side fin 1103 (right rotatable shield) at an exemplary angle of 10°, a size of the substrate (e.g., a diameter of a wafer), and a distance from the finger-end caps at various distances from a wall of the chamber. All dimensions are given in millimeters. The skilled artisan, upon reading and understanding the disclosure provided herein, will recognize how to use the nomogram 1700 to design a substrate cleaning chamber for a given substrate geometry.

Examples of Computational Fluid Dynamics (CFD) Analyses

In efforts to direct gas more efficiently and effluent flows within the substrate cleaning chamber, dozens of physical arrangements and dimensions of the chamber were considered with numerous iterations of each of the combinations of arrangements and dimensions conducting simulations using computational fluid dynamic (CFD) analysis using, for example, finite element and finite volume analysis. Initially, the simulations were conducted using a two-dimensional model, later expanding to using three-dimensional (3D) models, and still later, conducting simulations in 3D and adding a fourth dimension, time (thereby producing time-accurate animations to further aid in flow, pressure, vorticity magnitude, Q-criterion, and other fluid parameters of interest known to a skilled artisan). The arrangements and dimensional changes for each of the iterations included varying the diameter of the chamber, changing distances between walls of the chamber (and consequently changes in distances from the substrate to the chamber walls), changing gas flow rates, gas flow directions, and various placements of exhaust paths. Additional details were added to the various designs of the chambers. However, the description below allows the skilled artisan to appreciate the factors to be considered for further CFD modeling, simulation, and analysis for a particular set of shapes and dimensions for a substrate of interest.

Figure 18:
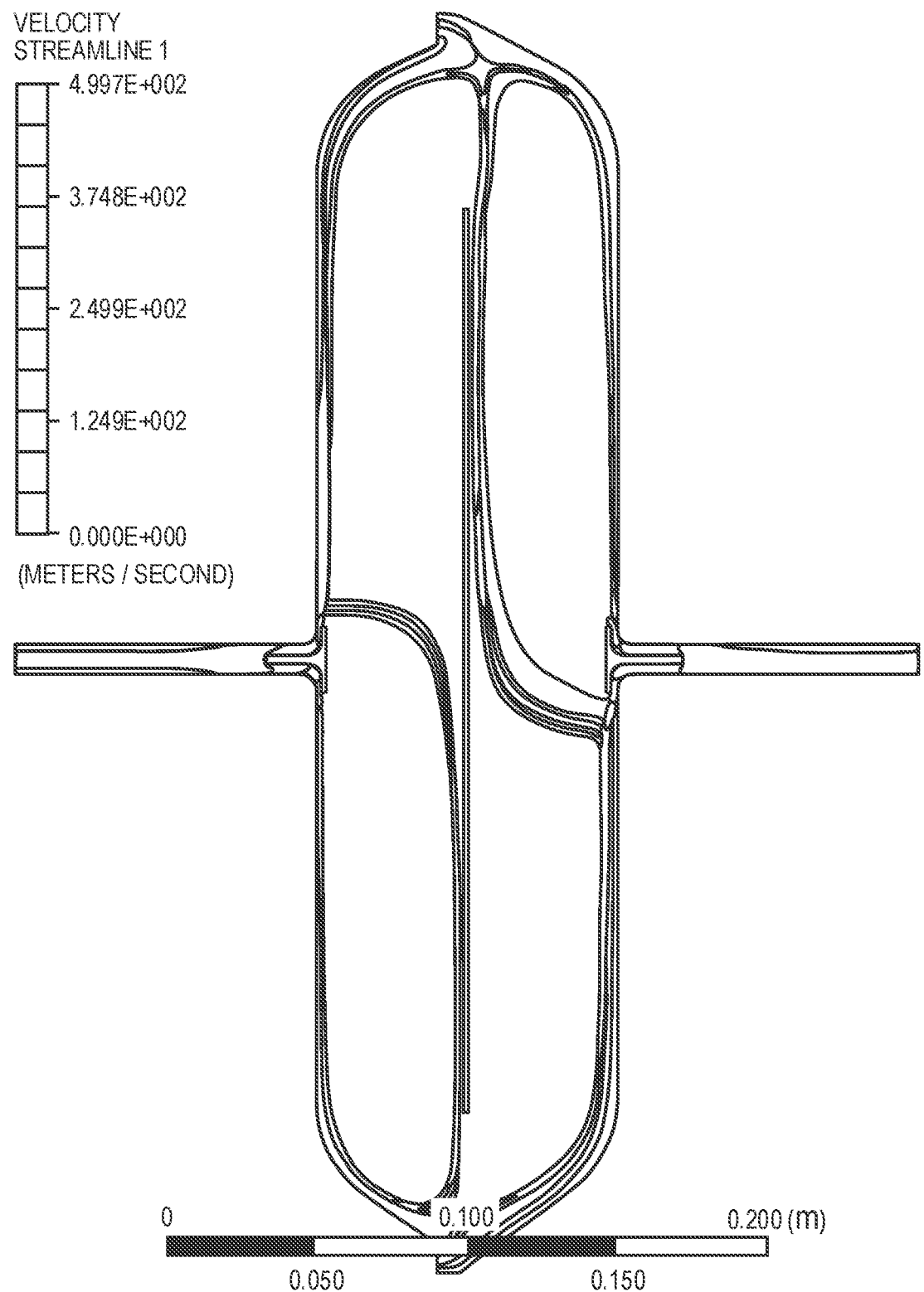
FIG. 18 shows various eddy viscosity contours from an example of a computational fluid dynamic (CFD) analysis based on the various exemplary physical dimensions of a portion of the substrate cleaning chamber mechanism shown in FIG. 4.

For example, with concurrent reference to FIG. 4 (the center-exhaust chamber design described above), FIG. 18 shows gas velocity streamlines (in units of meters/second) from an example of CFD analysis based on the various exemplary physical dimensions of a portion of the substrate cleaning chamber mechanism shown in FIG. 4. FIG. 18 shows good dispersion of the stream lines from the gas inlet streams, across opposing faces of the substrate, to the openings (e.g., gas exhaust areas) of the rotatable shields.

Figure 19:
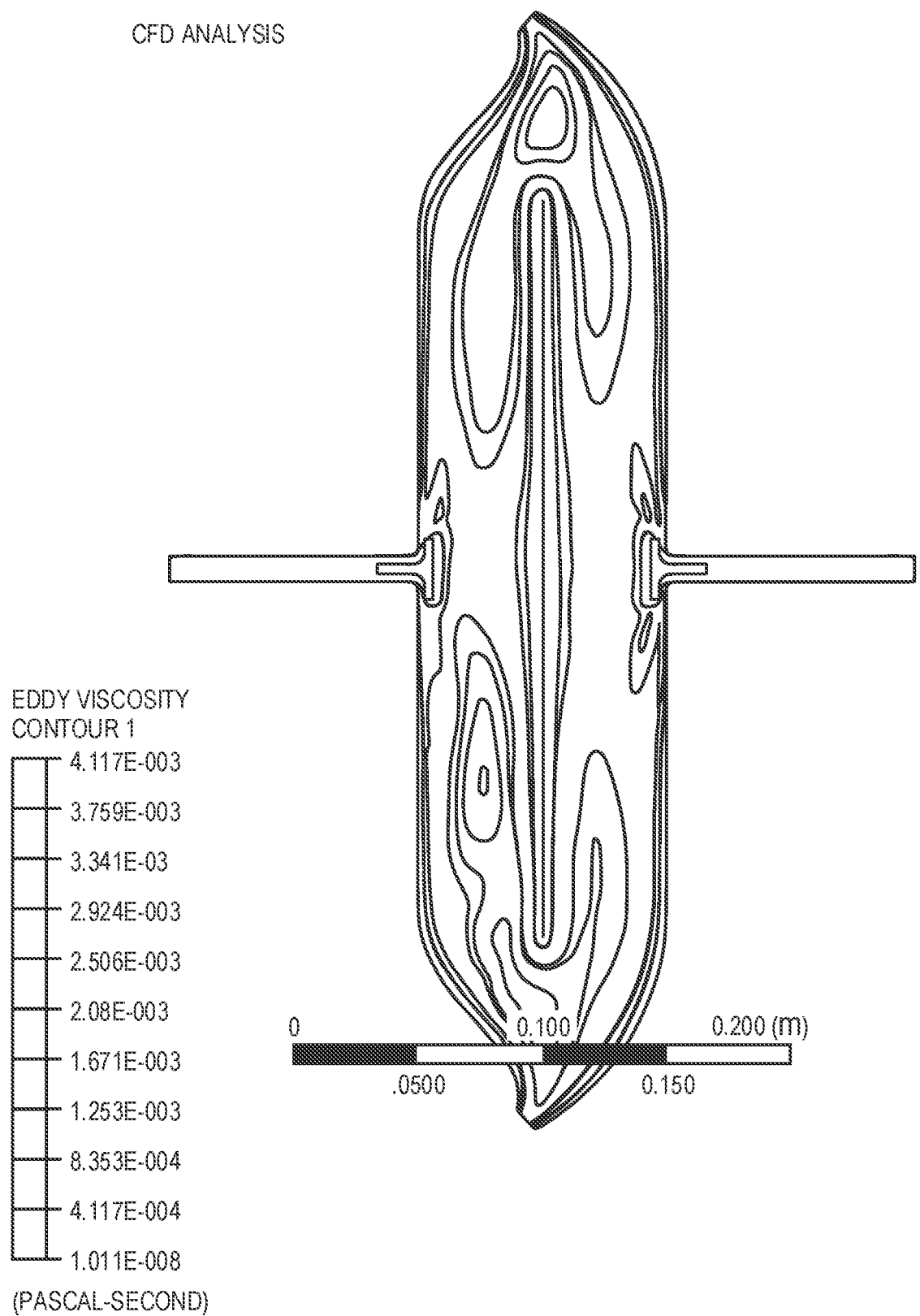
FIG. 19 shows various eddy viscosity contours from an example of CFD analysis based on the various exemplary physical dimensions of a portion of the substrate cleaning chamber mechanism shown in FIG. 4.
Figure 20:
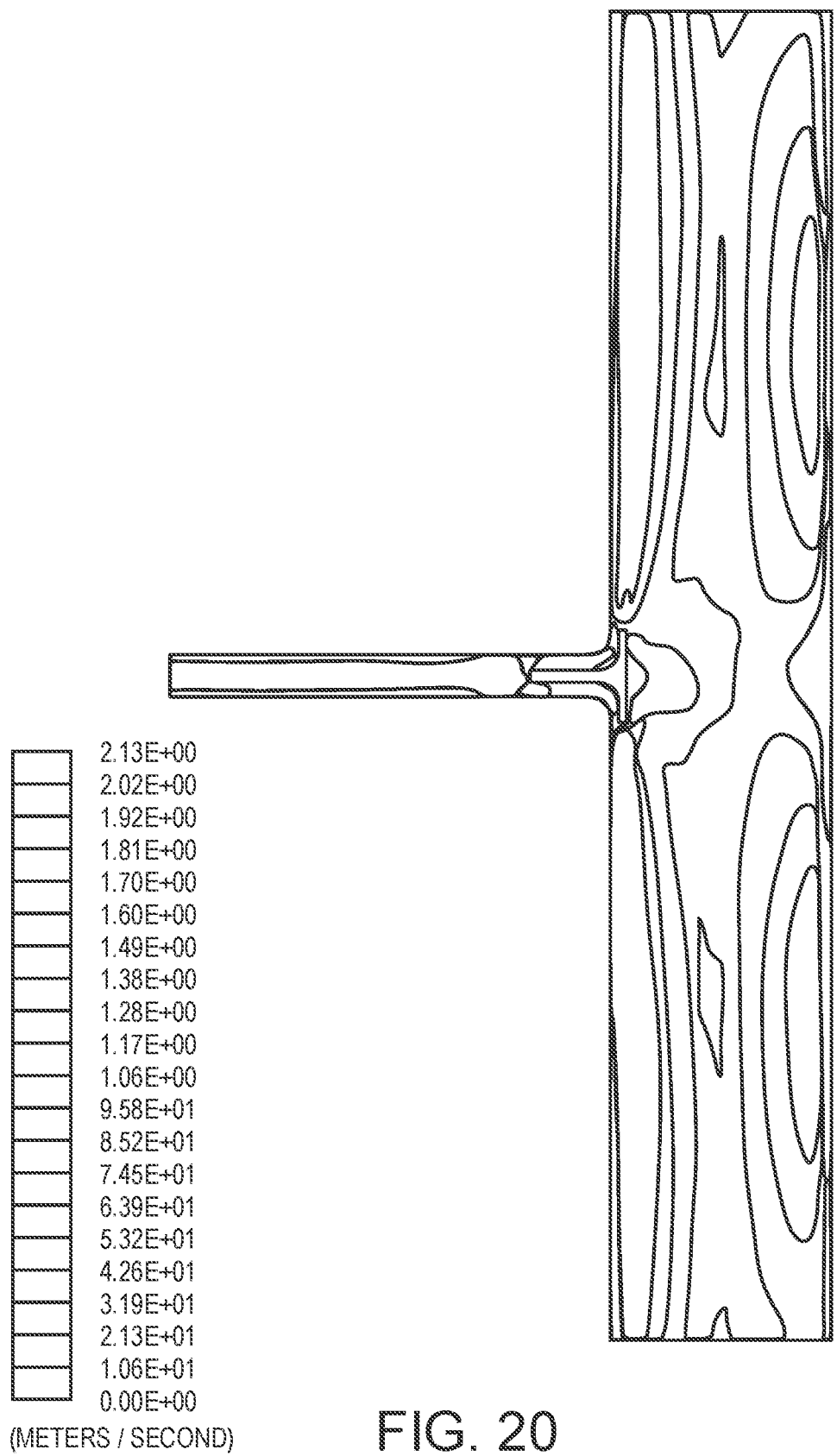
FIG. 20 shows contours of velocity magnitude for a portion of the chamber mechanism shown in FIG. 4.
Figure 21:
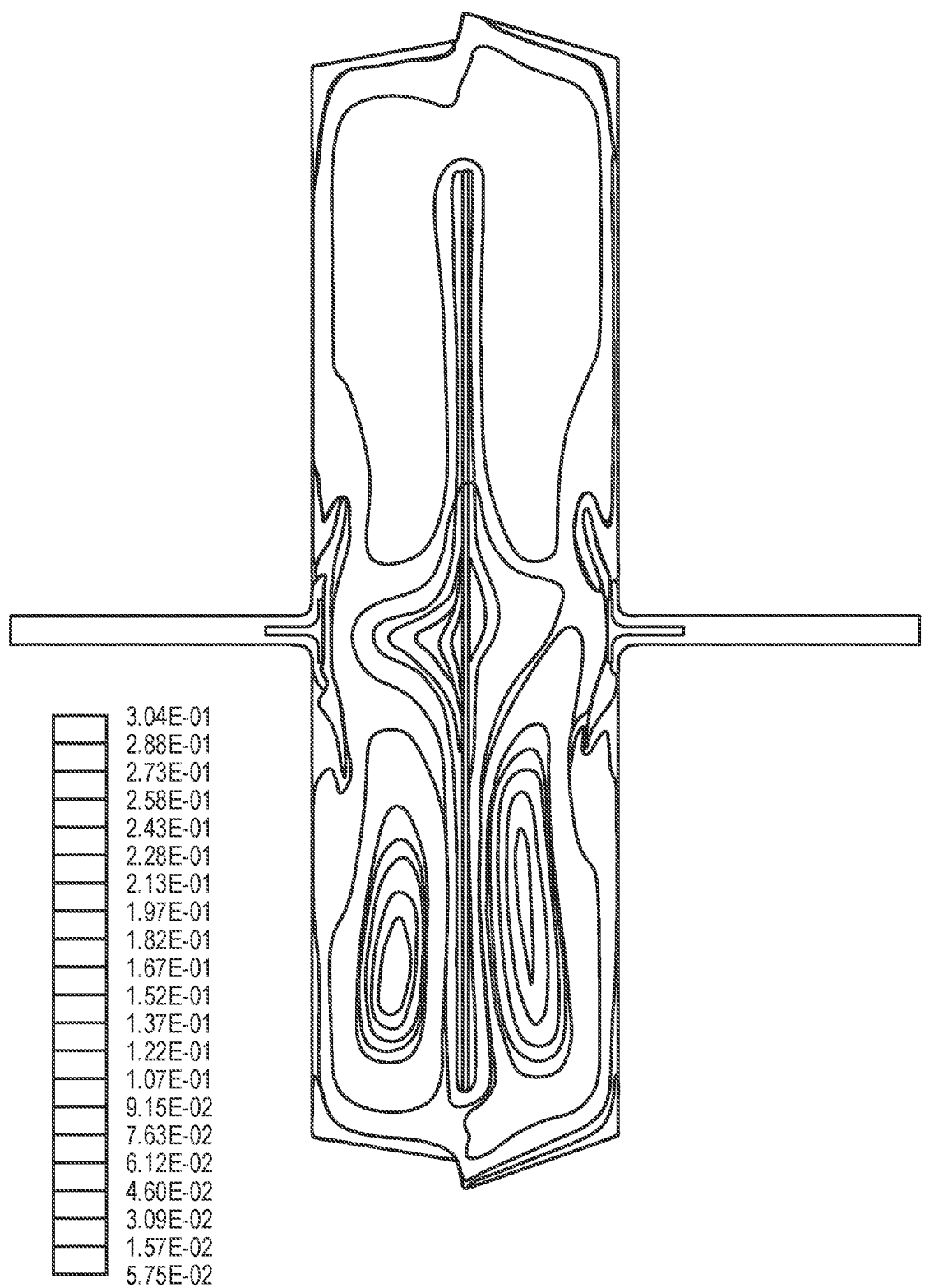
FIG. 21 shows a simplified CFD diagram indicating contours of turbulent viscosity based on another design model.

With continuing reference to FIG. 4, FIG. 19 shows various eddy viscosity contours (in units of Pascal second (also known as Newton second/meter$^2$ or kilogram/meter second)) from an example of CFD analysis based on the various exemplary physical dimensions described above with reference to FIG. 18. Additionally, FIG. 20 shows contours of velocity magnitude (in units of meters/second) for a portion of the chamber mechanism shown in FIG. 4. FIG. 21 shows a simplified CFD diagram indicating contours of turbulent viscosity (also in units of Pascal second) based on another design model (not shown).

Figure 22:
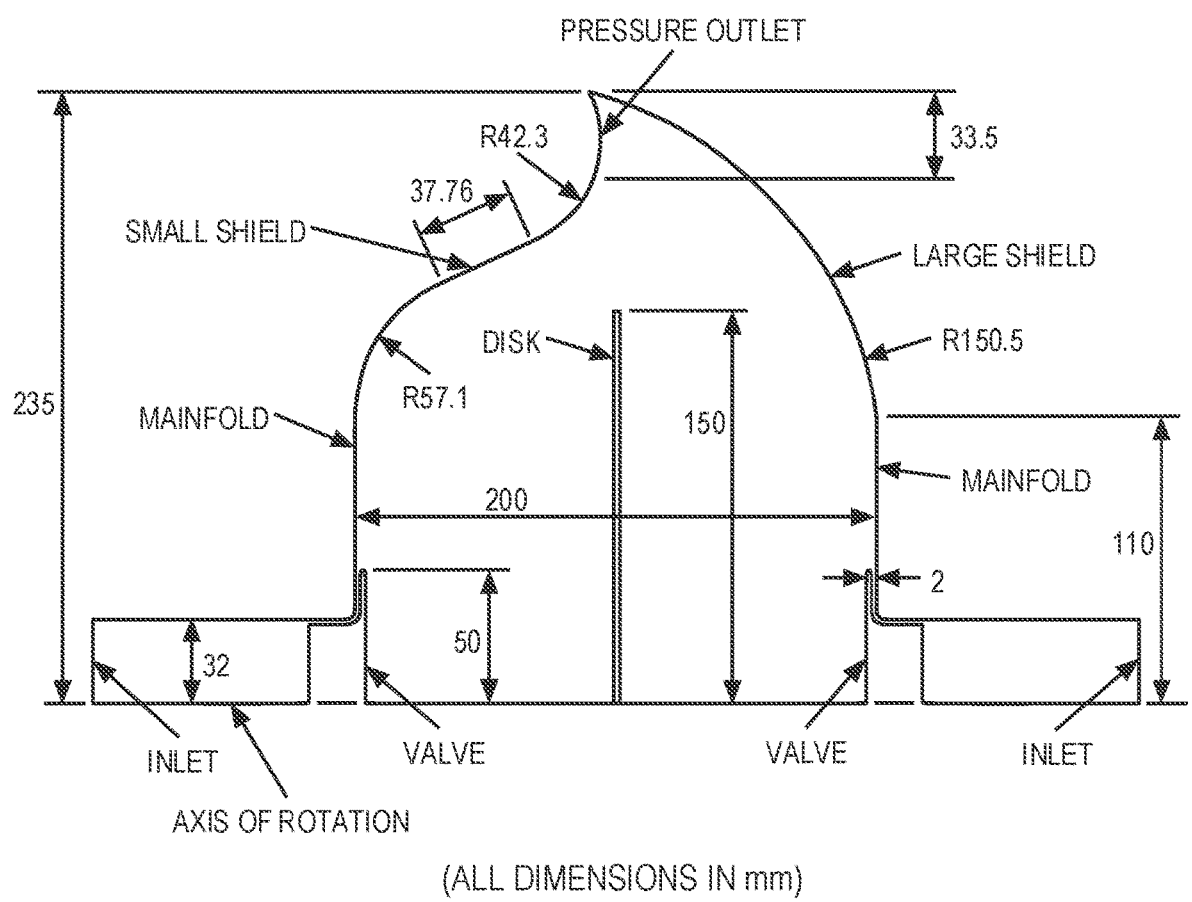
FIG. 22 shows a portion of another exemplary chamber design considered for CFD analysis having a greater distance between chamber sidewalls than the chamber design used in FIG. 4.

Referring now to FIG. 22, a portion of another exemplary chamber design was considered for CFD analysis having a greater distance between chamber sidewalls is shown (all dimensions are in millimeters) to consider any effects on cleaning efficacy. In FIG. 22, the sidewalls are about 200 mm apart, whereas, in FIG. 4, the sidewalls are about 100 mm apart (neglecting a thickness of the substrate in both FIG. 4 and FIG. 22).

Figure 23:
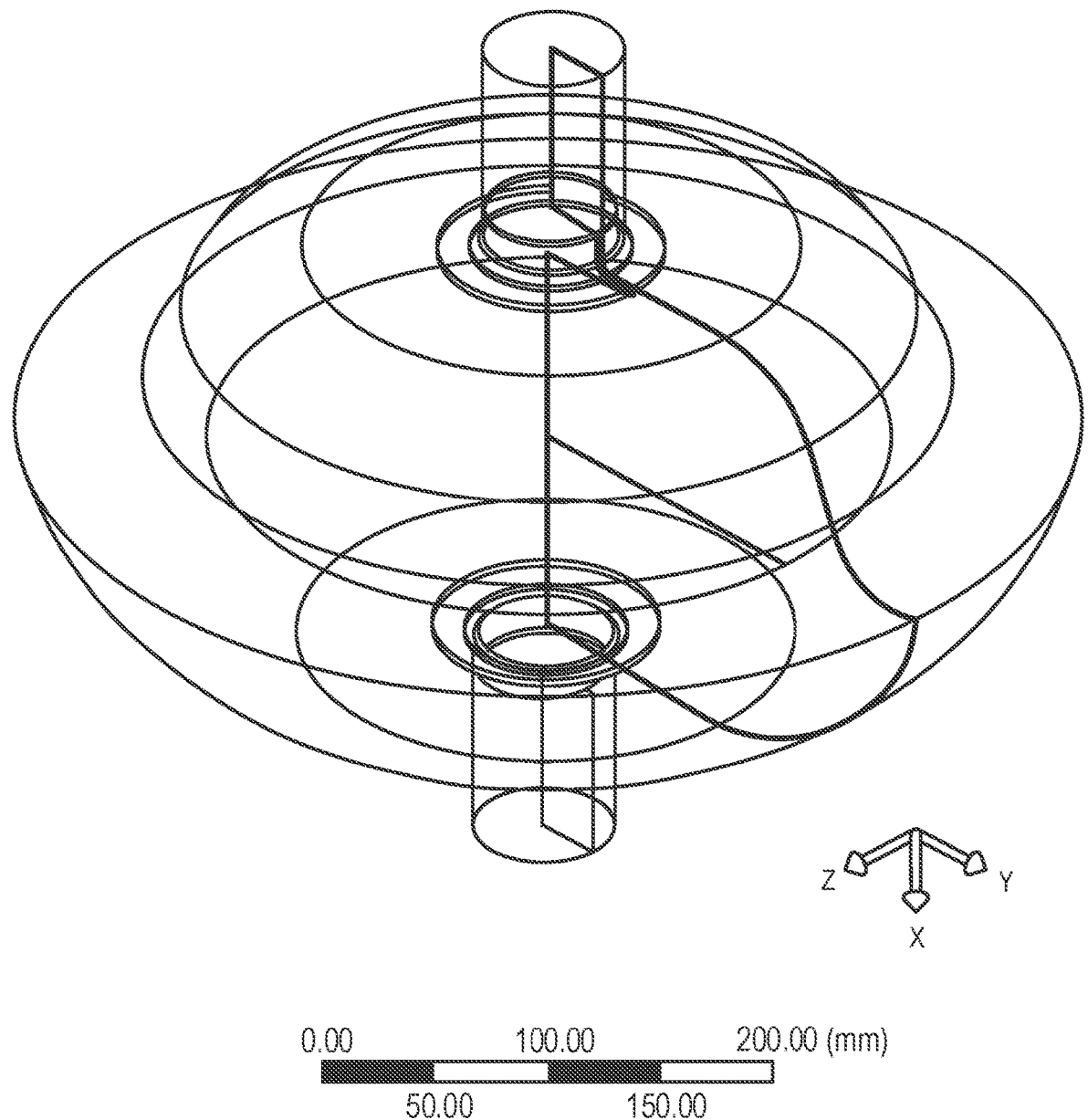
FIG. 23 shows an example of a full 3D simulation basis model for the exemplary chamber design of FIG. 22.

FIG. 23 shows an example of a full 3D simulation basis model for the exemplary chamber design of FIG. 22. Full CFD analyses (not shown) for various fluids (e.g., gases) and various processes (e.g., cleaning operations) were run using the exemplary chamber design of FIG. 22 as well. Numerous other shield and fin designs, sizes (e.g., distance between chamber side walls and overall diameter), angles, and curvatures were considered as well.

Figure 24:
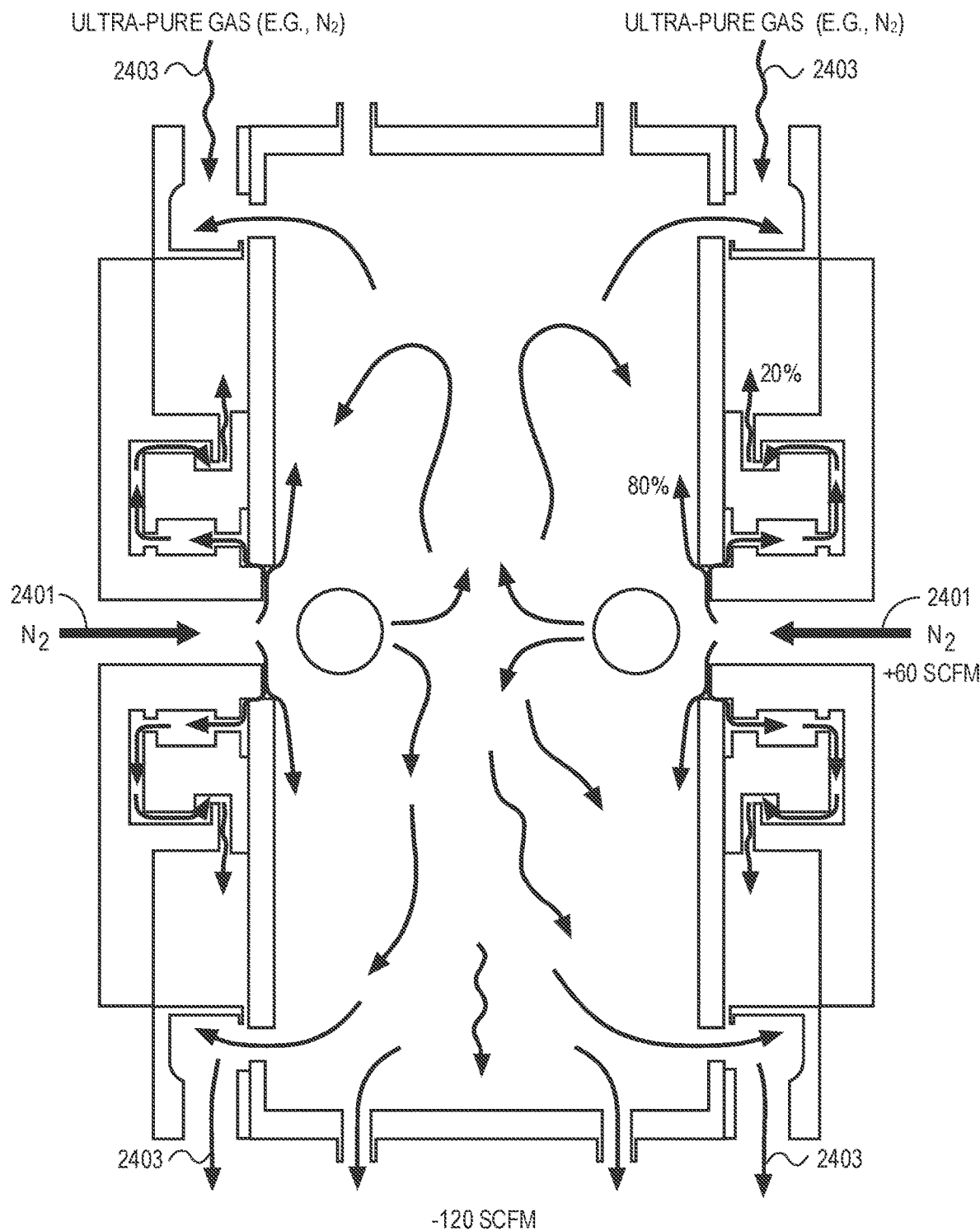
FIG. 24 shows an exemplary gas flow diagram for a modified version of the side-exhaust chamber of FIG. 11.

Additionally, additional CFD analyses were conducted based on modifications of the alternative, side-exhaust chamber design of FIG. 11. For example, FIG. 24 shows an exemplary gas flow diagram for the modified side-exhaust chamber. FIG. 24 shows an exemplary embodiment where nitrogen gas is introduced into the chamber from each side inlet 2401 at about 1700 lpm (approximately 60 scfm). Approximately 80% of the gas enters the main portion of the chamber containing the substrate (not shown) to assist in cleaning the substrate as well as removing effluents from within the chamber. The remaining approximately 20% allows a portion of the incoming nitrogen to prevent or substantially reduce contamination or particulates from various mechanical components (e.g., the bearings 303 of FIG. 3) from migrating into the process chamber through key seal-areas.

The air knife system is balanced with the central nitrogen system (coming from the center of the gas dispense manifold) so that these systems do not work against each other during the cleaning cycle.

Additionally, filtered air 2403 enters by, for example, a venturi effect from the topside provided by the first filter unit 501 and the second filter unit 503 (see FIG. 5). The gas is exhausted through a lower part 2405 of the chamber, carrying effluents from the chamber and the substrate during a cleaning operation. In certain operations (e.g., sub-10 nm semiconductor design rules), ultra-pure grade nitrogen is substituted for filtered air 2403 through the filter units 501, 503. In embodiments such as this, the filter units 501, 503 may not be used at all or even added to the chamber 500. In various embodiments, for the lower geometries of features under 10 nm, the disclosed subject matter can be tailored to meet the heightened and more stringent cleaning-requirements. For example, under these embodiments, the one or more lasers is emitted onto all substrate surfaces concurrently (e.g., frontside, backside, and one or more edges) in the sealed process chamber. At the end of the emission cycle, a controlled flow of ultrapure semiconductor-grade nitrogen gas is released into the process chamber via a valve and a mass flow controller to control both the flow and the pressure. The nitrogen gas removes the ejected nano-particles by carrying them into the chamber exhaust system. In embodiments, the process chamber is sealed using, for example, multiple arrays of O-rings or labyrinth seals.

As noted above with reference to FIG. 13, the inner-chamber view 1300 of FIG. 13 is shown to include exhaust areas 1301 and effluent and gas-exhaust areas 1303. Also as noted above with reference to FIG. 6, the evacuation of effluents may be assisted by various types of turbine blade mechanisms 601 configured to various types of effluents from the chamber.

Figure 25A:
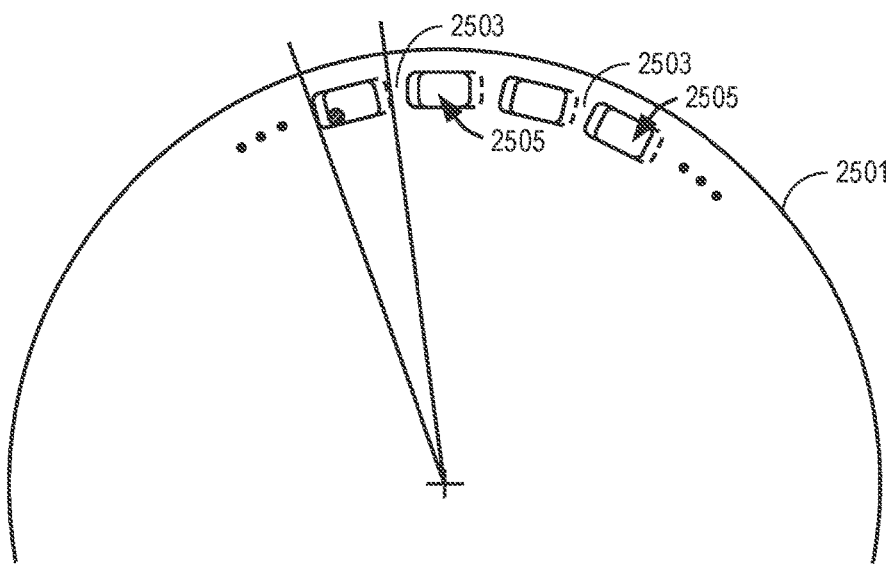
FIG. 25A is an exemplary embodiment of a turbine disk used to assist in removing effluents (gases, contaminants, films, particles, etc.) from the chamber.

Referring now to FIG. 25A, an exemplary embodiment of a turbine disk 2501 is shown to include a number of openings 2505, formed through the turbine disk 2501, and a number of turbine fins 2503. The number and shape of the openings 2505, and the resulting turbine fins 2503, may vary considerably from what is shown in FIG. 25A.

Generally, at least one of the turbine disks 2501 is coupled to each of the rotating shields or other rotational mechanisms (e.g., the first rotatable shield 101 and the second rotatable shield 103A/B of FIG. 1) to remove excess amounts of bulk effluent during the cleaning cycles. As the turbine disks rotate, the various effluents are thrown outward due to centrifugal force and exits through the openings 2505 in the turbine disks 2505 through exhaust areas (e.g., the exhaust areas 1301 of FIG. 13 or channeled to the various exhaust areas as discussed above). The number, size, wall angle, shape, and other parameters may each be manipulated depending on an overall chamber design. Although discussed mainly for removal of various effluents removed from the surface of the substrate, the skilled artisan will immediately recognize the turbine disks 2501 may also be used to remove excess gases from the chamber as well.

Figure 25B:
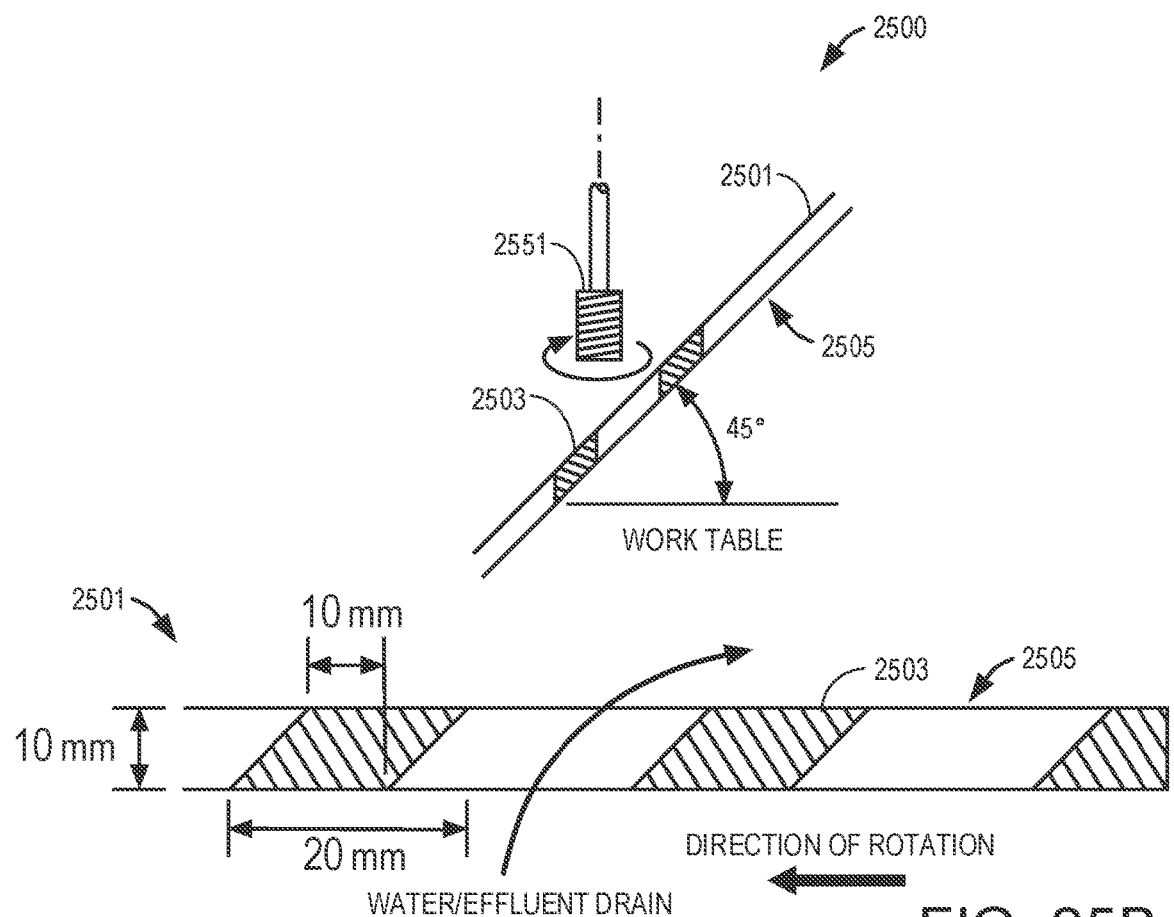
FIG. 25B shows a cross-section of the exemplary turbine disk, and an exemplary method to machine the turbine disk, of FIG. 25A.

With reference now to FIG. 25B, a cross-section of the exemplary turbine disk, and an exemplary method to machine the turbine disk, of FIG. 25A is shown. A person of ordinary skill in the art, upon viewing and understanding FIG. 25B, will understand how effluents can be readily removed from within the chamber based on a direction of rotation as shown. Machining or otherwise forming the openings 2505 may be accomplished by cutting the openings 2505 using, for example, single-point or multipoint tools (multipoint tools can include grinding tools and other abrasive tools). In a specific exemplary embodiment, a thickness of the turbine disk is 10 mm (approximately 0.0394 inches). In this embodiment, one dimension of the cross-section of the turbine fin 2503 (e.g., the short-point to short-point distance) is 10 mm and a dimension of the other dimension (e.g., long-point to long-point distance) is 20 mm (approximately 0.787 inches). From the cross-section of FIG. 25B, With continuing reference to FIG. 25B, in a specific exemplary method used to machine the openings 2505 in the turbine disk 2501, an angle from the work table to the turbine disk is about 45° to form the turbine fins 2503 with about 45° walls. A cutting tool 2551 is substantially perpendicular to the work table. However, in other embodiments, the wall angle may be formed to be greater than about 45° or less than about 45°. For example, in one embodiment, the range of wall angles may be formed to be from about 15° to about 45°. In other embodiments, the range of wall angles may be formed to be from about 45° to about 75°. The skilled artisan will recognize that a determination of the wall angle may be determined based on a rotational speed of the turbine disks 2501, an amount of effluent to be removed from the chamber (not shown in FIG. 25A or FIG. 25B), an amount of time in which all or most of the effluent should be removed, and a number of other factors, at least some of which may be determined from CFD analysis as will be understood by a skilled artisan. Also, the skilled artisan will recognize that, in certain applications, the turbine fins 2503 may be stamped from metals, plastics, or other materials rather than being machined.

Also, in other embodiments, the cutting tool 2551 may be substituted by other forming tools such as a plasma torch, a directional chemical-etch, a laser, electrical discharge machining (EDM), a water jet cutter, or a number of other techniques known in the art.

Figure 26A:
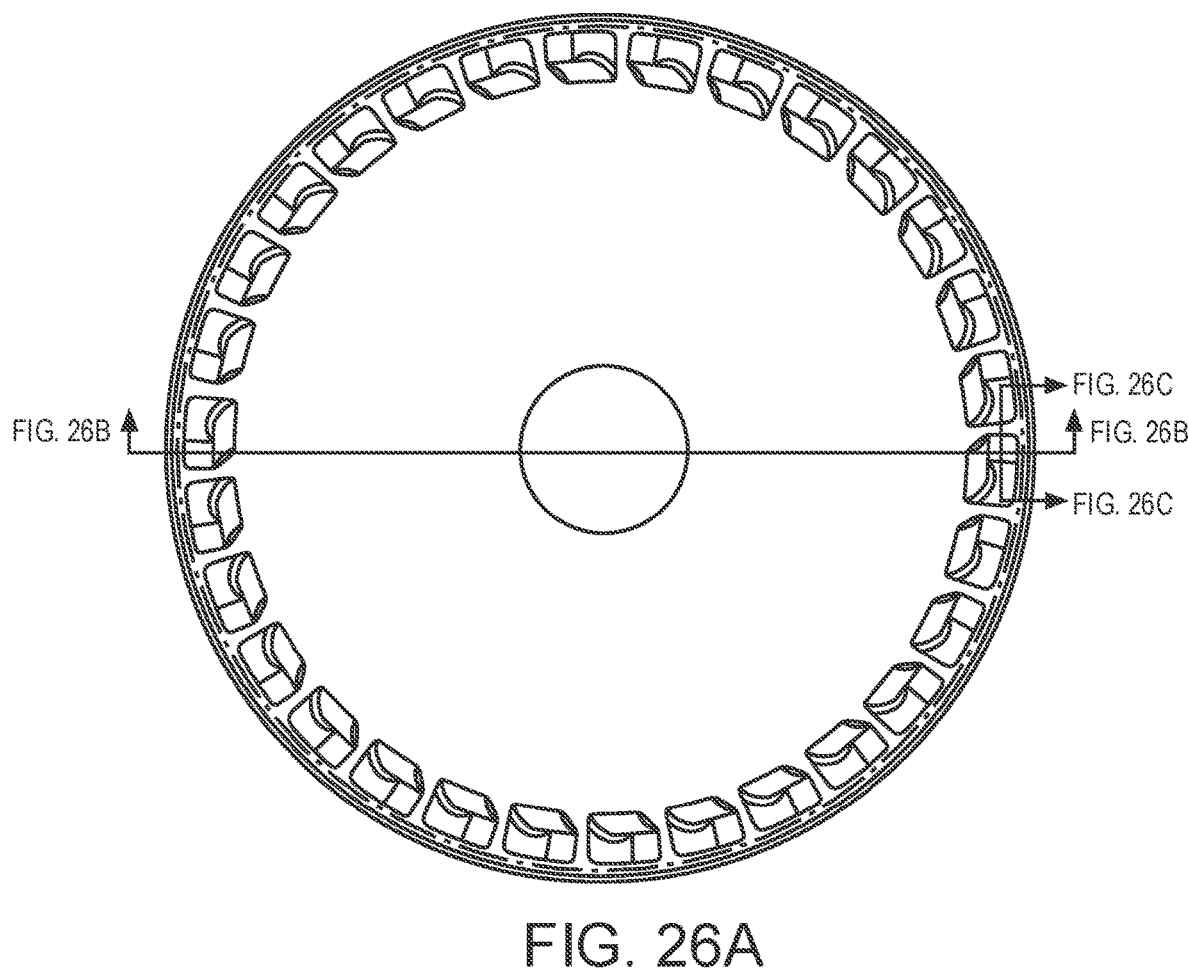
FIG. 26A is a three-dimensional drawing of an exemplary embodiment of a turbine disk.

FIG. 26A is a three-dimensional drawing of an exemplary embodiment of a turbine disk. With concurrent reference to FIGS. 25A and 25B, and as noted above, the skilled artisan will recognize that other sizes of the openings 2505, the turbine fins 2503, an angle of the walls of the turbine fins 2503, and other parameters may be readily employed based on at least the factors discussed herein.

Figure 26B:
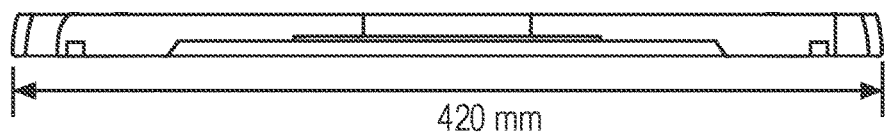
FIG. 26B is a cross-section of the exemplary embodiment of the turbine disk of FIG. 26A, taken along an axis along the diameter of the turbine disk.
Figure 26C:
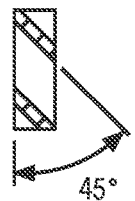
FIG. 26C is a cross-section of the exemplary embodiment of the turbine disk of FIG. 26A, taken near a pair of fins of the turbine disk.

FIG. 26B is a cross-section of the turbine disk of FIG. 26A, taken along an axis along the diameter of the turbine disk. In a specific exemplary embodiment, and with concurrent reference to the turbine blade mechanisms 601 of FIG. 6, the cross-section of FIG. 26B shows an overall diameter of 420 mm (approximately 16.5 inches) to be used in the interior portion 600 of the three-dimensional chamber 500 of FIG. 5. Other chamber designs would, accordingly, utilize other sizes of the turbine disk. FIG. 26C is a cross-section of the turbine disk of FIG. 26A, taken near a pair of fins of the turbine disk.

Overall, based on the descriptions provided above with regard to various physical models and a resulting set of CFD analyses, the skilled artisan will recognize how to apply the various models and simulations for a given substrate shape and dimension to prepare a suitable chamber design.

Figure 27A:
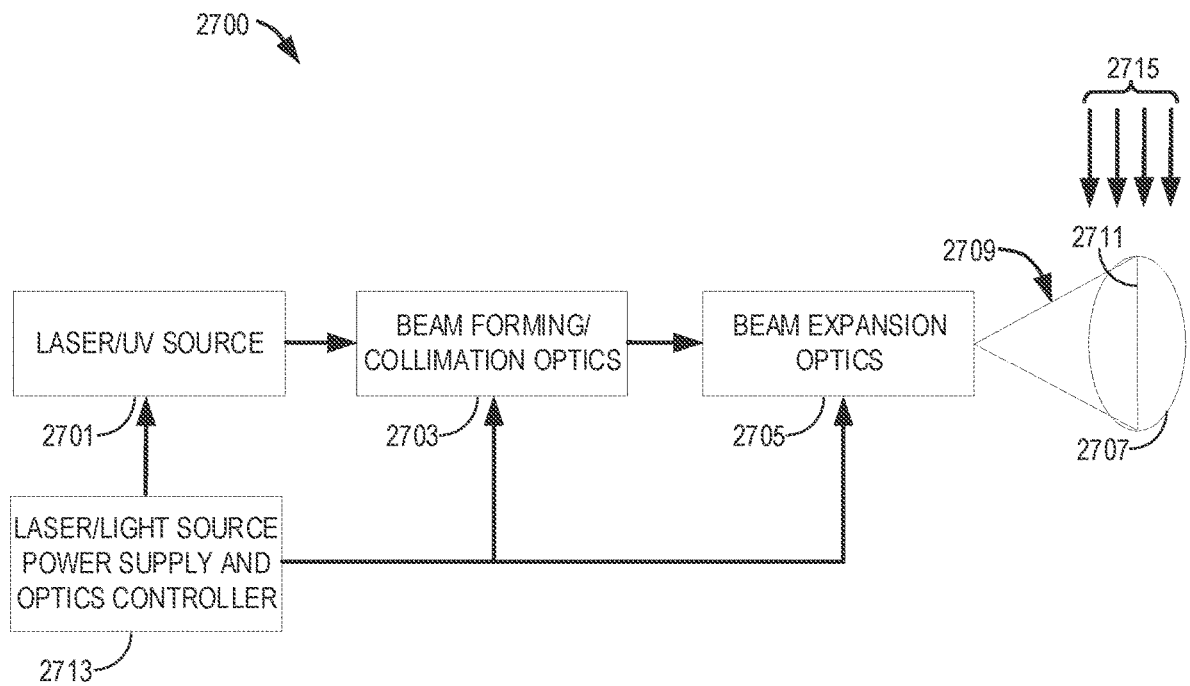
FIG. 27A shows an exemplary embodiment of a laser or light source and a related optics train for directing the laser or light source onto a substrate.

Examples of a Laser/Light Source and Optics Train for Directing the Light onto a Substrate FIG. 27A shows an exemplary embodiment of a laser or light source (also referred to herein as simply "laser") and a related optics train 2700 for directing the laser or light source onto a substrate 2707. The laser and the related optics train 2700 is shown to include a laser or UV source 2701, optional beam forming and/or collimation optics 2703, optional beam expansion optics 2705, and a laser/light source power supply and optional optics controller unit 2713. Each of these components can take a variety of forms but are otherwise known to a person of ordinary skill in the art.

The laser and the related optics train 2700 form a cone 2709 enclosing an area on the substrate (not shown explicitly) or a line 2711 of light across the substrate 2707. A gas flow 2715 (e.g., nitrogen) can be used to assist, along with one or more of the other various gas-flow mechanisms and effluent-removal systems described herein, to carry any, for example, particulate or organic matter away from the substrate 2707. In this embodiment, the substrate 2707 is shown to be situated vertically. However, the skilled artisan will recognize that any other orientation (e.g., horizontal) can be used as well.

In a specific exemplary embodiment, the laser or UV source 2701 may include any of the type or types of laser discussed herein. In one embodiment, the laser or UV source 2701 includes a single laser (e.g., an excimer laser) or UV lamp. In other embodiments, the laser or UV source 2701 contains an array of lasers (e.g., laser diodes or separate UV lamps) mounted to, for example, the first-side array or one or more lasers 115 and the second-side array of one or more lasers 117 as shown and described with reference to FIG. 1, above. Also, as noted herein, one or more separate lasers may be directed specifically at one or more edges of the substrate 2707.

In various embodiments, the gas flow 2715, may be maintained at all times and directed as a laminar flow over a face or faces of the Examiner substrate. In one embodiment, the gas flow 2715 may be from about 0 lpm to about 1274 lpm (approximately 45 scfm). A rotational speed of the substrate may be from about 0 rpm to about 200 rpm (although a much higher rotational speed may be employed in some embodiments). The laser or UV lamp may be impinged on a surface or surfaces (e.g., faces or edges) of the substrate 2707 for various lengths of time. In one embodiment, the laser or UV lamp s operational and impinged on the substrate 2707 for up to 120 seconds.

If an ultra-violet (UV) lamp is used as the light source, in an exemplary embodiment, a UV lamp having a wavelength of, for example, 150 nm to 195 nm may be employed. The UV lamp generates ozone and OH radicals to react with organic matter (e.g., organic contaminants on the surface(s) of the substrate 2707) to break organic matter to a lower-energy state. At the lower-energy state, adhesive bonds between the organic matter and the substrate 2707 are broken. The loosened material is then removed by the gas flow (e.g., nitrogen gas). The imparted energy is much higher than few milli-electron volts for the organic residue removal.

In various embodiments, the substrate 2707 is held in a vertical orientation and a UV lamp is mounted parallel to the substrate surface at a predetermined distance. In one embodiment, a distance from a front face of the UV lamp the substrate 2707 may be within a range from about 12 mm (approximately 0.5 inches) to about 75 mm (approximately 3 inches). In other embodiments, the distance may be within a range from about 25 mm (approximately 1 inch) to about 100 mm (approximately 4 inches). The substrate is then rotated at desired programmable speed while the lamp remains stationary.

In various embodiments, no focusing or collimation optics are used, because the intent is to flood the substrate surface with the UV radiation. Therefore, the beam forming and/or collimation optics 2703 and the beam expansion optics 2705 are optional in these embodiments.

In other embodiments, only half-of the diameter (or other characteristic dimension, such as diagonal dimension of a square substrate) of the substrate 2707 needs to be illuminated by the light source since the substrate 2707 is rotated.

Figure 27B:
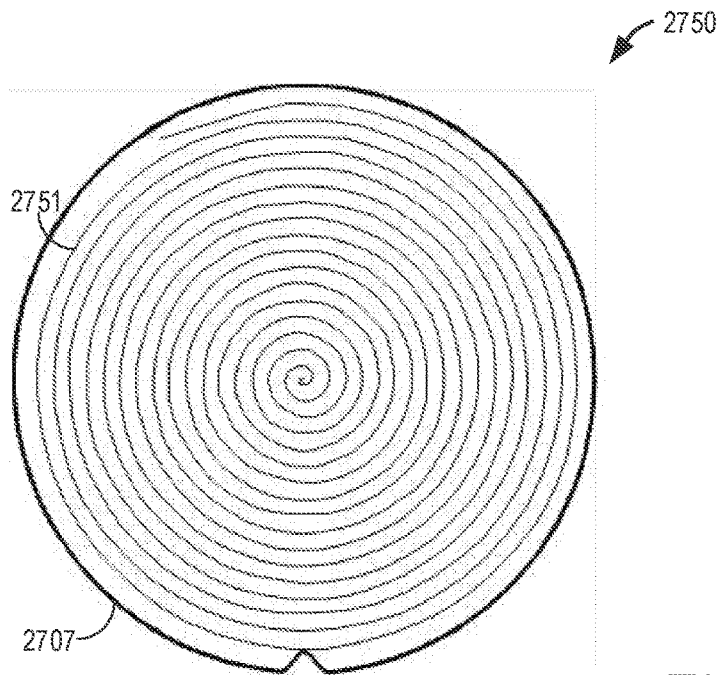
FIG. 27B shows an exemplary embodiment of a laser or light source being scanned across a substrate.

FIG. 27B shows an exemplary embodiment of a laser or light source being scanned 2750 across the substrate 2707. In this embodiment, a long spiral 2751 (also known as an Archimedes) spiral traverses across the substrate 2707. A light source (e.g., a diffraction-limited spot of light) is impinged on a central point of a surface of the substrate 2707. As the substrate 2707 is rotated, the light source is scanned (e.g., moved laterally from the center point of the substrate 2707 and substantially parallel to the face of the substrate 2707) across the substrate 2707, resulting in the long spiral 2751. (The skilled artisan will recognize that forming the long spiral 2751 can be reversed, whereby the light source spot begins at an outer edge of the substrate 2707 is moves laterally toward the center of the substrate 2707). The person of ordinary skill in the art will also recognize myriad other methods for traversing a beam of light across the surface(s) (and edges) of the substrate 2707.

In another exemplary embodiment, a high-energy level may be used to remove particles and other contamination by, for example, laser ablation. However, the skilled artisan will need to consider an energy level for a given substrate that will not cause damage to a surface of the substrate. For example, energy can be imparted is imparted in a range of 20 MeV, or more. This high level of energy can break bonds between contaminants and the surface but may also cause damage to the surface. For certain bulk-contaminant removal applications, ablation may be chosen to be the removal mechanism.

In all cases, formulas for determining an amount of emitted energy can be calculated in all cases. Such calculations, using, for example, an excimer laser and a UV Lamp are known to a person of ordinary skill in the art. For example, known variables include a wavelength (or wavelengths in the case of multiple light sources), in nm, and a frequency of frequencies of the light source or multiple light sources, at the particular wavelength. Also, the angle-of-incidence between the laser and the substrate may be varied (e.g., from about 0° to about 90°). In other embodiments, the angle-of-incidence between the laser and the substrate may be varied (e.g., from about 0° to about 45°).

Equation (1) can be used to calculate the photon energy impinging on the substrate surface from the light source:

$$E = hc/\lambda \quad (1)$$

where: E is the energy in Joules, $\lambda$ is the wavelength in nm, h is Planck's constant ($6.626 \times 10^{-34}$ J·s); and c is the speed of light ($3.00 \times 10^8$ m/s).

Overall, a light source (e.g., a krypton-fluoride excimer laser or 152 nm to 190 nm in wavelength) providing an output of certain desired wavelength is selected. In various embodiments, using a combination of beam formation and beam expansion optics, a final beam output of a single line with extremely small width (e.g., diffraction limited) is obtained. A selection of the beam expansion optics will provide a variety of beam lengths as needed for the size of the substrate to be processed, (e.g., a 100 mm silicon wafer or a 1 meter square substrate for a flat panel display). As noted herein, the substrate can be of any shape (e.g., round, oval, square, rectangular, etc.).

In other embodiments, an entire surface (e.g., both faces as well as edges) of the substrate are flooded with light from an array of light sources. In this embodiment, the substrate is rotated only to assist in removal of contaminants by the gas flow 2715 (e.g., a steady supply of nitrogen flowing across the face(s) of a substrate after the vacuum operations are completed).

As will now be recognizable to a person of ordinary skill in the art, upon reading and understanding the material provided herein, the disclosed subject matter contains multiple advantages over both the prior art as well as contemporaneous techniques used in substrate cleaning processes. In addition to other advantages disclosed herein, additional advantages include, for example, a vertically-oriented or horizontally-oriented substrate allows a configuration of the rotatable shields to remove effluents rapidly from both sides, as well as the edges, of the substrate.

Consequently, for at least the reasons stated above and throughout the disclosure, the disclosed subject matter is both novel and non-obvious since, for example, it provides a laser-based cleaning of the vertically-oriented or horizontally-oriented substrate in the same chamber, without having to move the substrate from one chamber to another thereby saving time and avoiding unnecessary, potentially contaminating, handling steps. The disclosed system is a contactless cleaning system for substrates. Consequently, harsh mechanical substrate cleaning systems of contemporary cleaning systems are completely avoided. Further, the mechanisms defined herein for evacuating effluents from a process chamber are new, novel, and non-obvious.

The disclosed subject matter solves at least two major problems: First, all surfaces of a substrate are cleaned substantially simultaneously (e.g., front, back, and edge(s)) with identical or near-identical efficiency. Currently, there is no contemporaneous mechanism that can do the operations disclosed herein. Secondly, the disclosed subject matter removes extremely small (e.g., nanometer-level particles and other contaminants) from the process chamber. The nanometer-level cleaning capability allows users to achieve sub-25 nm, or smaller, integrated circuit manufacturing with a high single-pass cleaning efficiency.

Additional advantages of the disclosed cleaning chamber include one or more of the added benefits listed below. For example, the chamber can include an additional flexibility to allow for only one side of the substrate cleaned using one or more lasers while the other side can be sprayed with an inert gas to prevent effluents released the substrate from overlapping onto the other side.

In addition, or as a separate operation, while the frontside and backside of the substrate are cleaned with one or more lasers, a special single or multiple array of one or more lasers can be directed separately at edge(s) of the substrate to perform special cleaning functions or enhanced edge cleaning. The edge-directed-laser can also be a different wavelength or energy than the other one or more lasers directed at the surfaces (faces) of the substrate.

The disclosed cleaning chamber may utilize a number of laser power levels or wavelengths thereby providing a variety of cleaning options to remove particles, residues, organic contaminants, inorganic contaminants, and metallic contaminants from all surfaces of the substrate. Further, the disclosed cleaning chamber can include separate, switchable exhaust to facilitate removal of incompatible effluents (e.g., acidic or corrosive elements). Such switchable exhausts are known in the art.

Further, the disclosed cleaning chamber can dispense two or more different gases that can be used to augment substrate cleaning and to eliminate or reduce, for example, static charges in the process chamber.

In various embodiments, the substrate can include, for example, any of various types of substrates used in the semiconductor and allied industries (which may be referred to herein as "semiconductor substrates," or "wafers," or simply "substrates"). Substrate types may therefore include silicon substrates (e.g., wafers) or substrates based on other elemental semiconductors, compound wafers (e.g., from Groups III-V, II-VI, or others), thin film head assemblies, polyethylene-terephthalate (PET) films deposited or otherwise formed with a semiconducting layer, or numerous other types of substrates known independently in the art. Also, the substrate may comprise a region of a semiconductor material formed over a non-semiconductor material, or vice-versa.

For ease of understanding the activities and designs presented herein, the substrate may be considered to be a silicon wafer. Upon reading and understanding the disclosure provided herein, a person of ordinary skill in the art will understand how to modify various component, designs, geometries, and so on to account for other types of substrates.

One of ordinary skill in the art may recognize that the designs may include other components, at least some of which are described herein. However, several of these components are not shown in the figures, so as not to obscure details of the various embodiments described.

The various illustrations of the methods and apparatuses are intended to provide a general understanding of the structure of various embodiments and are not intended to provide a complete description of all the elements, materials, and features of the apparatuses and methods that might make use of the structures, features, and techniques described herein.

The apparatuses and systems of the various embodiments may be suitable for and used in, for example, the fabrications of electronic circuitry used in high-speed computers, communication and signal processing circuitry, single- or multi-processor modules, single or multiple embedded processors, multi-core processors, data switches, and application-specific modules including multilayer, multi-chip modules, or the like. Such devices may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., structure fabrication) disclosed herein, the activities forming part of various methods may be implemented in a differing order, as well as repeated, executed simultaneously, with various elements substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

Also, as used herein, the term "or" may be construed in an inclusive or exclusive sense unless otherwise explicitly noted or operationally defined. Additionally, although various exemplary embodiments described above focus on various general and specific exemplary embodiments, the embodiments are merely given for clarity in disclosure, and thus, are not limited to a particular type or design of a substrate cleaning mechanism or system.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims Thus, the following claims are hereby incorporated into the Detailed Description, with each claim standing on its own as a separate embodiment.

The Following Numbered Examples are Embodiments of the Disclosed Subject Matter

Example 1: A substrate cleaning apparatus includes a substrate holder configured to hold and rotate a substrate at various speeds; and a front-side light source and a back-side light source, each of the front-side light source and the back-side light source being configured to emit at least one wavelength of light onto at least one face of the substrate.

Example 2: The apparatus of Example 1, wherein the cleaning apparatus is configured to operate at atmospheric pressure.

Example 2: The apparatus of Example 1, wherein the cleaning apparatus is configured to operate at some level of vacuum.

Example 3: The apparatus of any one of Examples 1 through 3, wherein the substrate holder is configured to hold the substrate vertically.

Example 4: The apparatus of any one of Examples 1 through Example 4, wherein the front-side light source and the back-side light source each comprise an array of light sources.

Example 5: The apparatus of Example 1 or Example 4, wherein the light source is a laser.

Example 6: The apparatus of Example 1 or Example 4, wherein the light source is an excimer lamp.

Example 6: The apparatus of Example 1 or Example 4, wherein the light source is an ultraviolet lamp.

Example 7: The of any one of Examples 1 through Example 6, wherein the light source is held stationary and the substrate is rotated.

Example 8: The of any one of Examples 1 through Example 6, wherein the light source is scanned across the surface of the substrate and the substrate is rotated.

Example 9: The of any one of Examples 1 through Example 6, wherein the light source includes a plurality of light sources configured to irradiate an entire surface of the substrate concurrently.

Example 10: The of any one of Examples 1 through Example 6, wherein the light source is configured to be formed as a beam of light across at least a radius of the substrate and the substrate is rotated.

Example 11: The of any one of Examples 1 through Example 6, wherein the light source is configured to be formed as a spot of light on the substrate and the substrate is rotated, the light source further being configured to move laterally and substantially parallel to the substrate.

Example 12: The apparatus of any one of Examples 1 through 11, further comprising an inner shield and an outer shield configured to surround the substrate holder during operation of the apparatus, with each of the inner shield and the outer shield being configured to operate independently in at least one of rotational speed and direction from the other shield.

Example 13: The apparatus of any one of Examples 1 through 12, wherein the substrate cleaning apparatus has a center exhaust for removing effluents.

Example 14: The apparatus of any one of Examples 1 through 12, wherein the substrate cleaning apparatus has a side exhaust for removing effluents.

Example 15: The apparatus of any one of the preceding Examples, further comprising an outer chamber to contain process effluents.

Example 16: The apparatus of any one of the preceding Examples, further comprising at least one turbine disk configured to rotate within the substrate cleaning apparatus to remove effluents.

Example 17: The apparatus of Example 16, wherein the at least one turbine disk is configured with slots placed at various points near a periphery of the turbine disk to increase effluent-removal efficiency.

Example 18: The apparatus of Example 16, wherein the at least one turbine disk is configured with slots placed at one or more angles to increase effluent-removal efficiency Example 19: The apparatus of any one of the preceding examples, wherein the apparatus is to clean both faces (sides) of the substrate, as well as the edge(s) of the substrate, simultaneously.

Example 20: The apparatus of any one of the preceding Examples, wherein the front-side light source and the back-side light source are configured to impinge onto both faces (sides) and edge(s) of the substrate simultaneously during a cleaning operation.

Example 21: The apparatus of any of the preceding Examples, wherein a photon-energy level imparted by the front-side light source and the back-side light source is pre-determined.

Example 22: The apparatus of any one of the preceding Examples, further comprising one or more secondary gas flow devices to create a gas barrier to prevent or substantially reduce particulate migration into the inner (process) chamber from the outer chamber.

Example 23: The apparatus of any one of the preceding Examples, further comprising at least an inner shield and an outer shield configured to move laterally away from the other shield to increase an opening between the shields to insert and remove the substrate into or from the substrate cleaning apparatus.

Example 24: The apparatus of Example 23, wherein peripheral edges of the inner shield and the outer shield each have one or more angles.

Example 25: The apparatus of Example 26, wherein the peripheral edges of the inner shield and the outer shield have a plurality of angles comprising various straight portions.

Example 26: The apparatus of Example 24 or Example 25, wherein the peripheral edges of the inner shield and the outer shield have one or more angles from about +3° to about +15°.

Example 27: The apparatus of Example 24 or Example 25, wherein the peripheral edges of the inner shield and the outer shield have one or more angles from about +1° to about +3°.

Example 28: The apparatus of Example 24 or Example 25, wherein the peripheral edges of the inner shield and the outer shield have one or more angles from about ±15° to about ±45° or more.

Example 29: The application of Example 25, wherein each of the straight portions has a different angle.

Example 30: The apparatus of Example 29, wherein the straight portions increase in angle as edges of the shields approach an opening.

Example 31: The apparatus of any one of Examples 23 to Example 30, wherein peripheral edges of the inner shield and the outer shield are curved.

Example 32: The apparatus of any one of Examples 23 to Example 31, wherein a larger of the inner shield and the outer shield extends over the smaller shield.

Example 33: The apparatus of any one of Examples 23 to Example 32, wherein at least one or both of the inner shield and the outer shield includes a labyrinth lip at an outermost peripheral edge to remove most or all effluents.

Example 34: The apparatus of any one of the preceding Examples, wherein the substrate is held within approximately ±0.1 degree to approximately ±1 degree from vertical.

Example 35: The apparatus of any one of Example 1 to Example 33, wherein the substrate is held within approximately ±2 degrees from vertical.

Example 36: The apparatus of any one of Example 1 to Example 33, wherein the substrate is held within approximately ±5 degrees from vertical.

Example 37: The apparatus of any one of Example 1 to Example 33, wherein the substrate is held within approximately ±10 degrees from vertical.

Example 38: The apparatus of any one of the preceding Examples, further comprising finger caps mounted to finger arms to hold the substrate.

Example 39: The apparatus of Example 38, wherein the finger caps are shaped like rollers.

Example 40: The apparatus of either Example 38 or Example 39, wherein the finger caps are non-rotatably mounted to a respective finger arm.

Example 41: The apparatus of any one of Example 38 to Example 40, wherein the finger caps are shaped to have a V-groove into which the substrate is placed during cleaning operations.

Example 42: The apparatus of any one of Example 38 to Example 40, wherein the finger caps are shaped to have a U-groove into which the substrate is placed during cleaning operations.

Example 43: The apparatus of Example 41 or Example 42, wherein a profile of the groove is designed such that it ensures that the substrate can self-align when placed in the grooves by an end-effector of a robot.

Example 44: The apparatus of Example 43, wherein the profile of the groove is shaped and sized such that only edges of the substrate are in contact with portions of the groove such that faces of the substrate are not in contact with the groove.

Example 45: The apparatus of Example 43, wherein the profile of the groove is sized and shaped such that no portion of the faces of the substrate are covered by the groove such that the faces of the substrate are fully exposed to light emitted from the front-side light source and the back-side light source.

Example 46: The apparatus of any one of the preceding Examples, further comprising an edge-directed light source or multiple edge-directed light sources to be directed separately at edge(s) of the substrate to perform special cleaning functions or enhanced edge cleaning.

Example 47: The apparatus of Example 46, wherein the edge-directed light source or the multiple edge-directed light sources can include a plurality of wavelengths.

Example 48: The apparatus of Example 46, wherein the edge-directed light source or the multiple edge-directed light sources can include a plurality of types of light source.

Example 49: The apparatus of any one of the preceding Examples, further comprising a first-side gas dispersion mechanism and a second-side gas dispersion mechanism to direct effluents within the substrate cleaning chamber.

Example 50: The apparatus of Example 49, wherein the first-side gas dispersion mechanism and the second-side gas dispersion mechanism direct the effluents away from the substrate during a cleaning operation.

Example 51: The apparatus of Example 49 or Example 50, wherein the first-side gas dispersion mechanism and the second-side gas dispersion mechanism are configured to disperse and redirect any incoming gas through a first-side gas inlet and a second-side gas inlet.

Example 52: The apparatus of any one of Example 49 to Example 51, wherein the first-side gas dispersion mechanism and the second-side gas dispersion mechanism are configured with an array of apertures or orifices around the periphery of each dispersion mechanism to direct incoming gases in a plane substantially parallel to faces of the substrate.

Example 53: The apparatus of any of the preceding Examples, wherein the front-side light source and the back-side light source are arranged to cover at least the entire diameter of the substrate on each face of the substrate thereby providing an emitted light source onto each entire face once the substrate has been rotated.

Example 54: The apparatus of any of the preceding Examples, wherein a range of wavelengths for the front-side light source and the back-side light source is from 172 nm to 348 nm.

Example 55: The apparatus of any of any one of Example 1 to Example 54, wherein a range of wavelengths for the front-side light source and the back-side light source is from 150 nm to 190 nm.

Example 56: The apparatus of any of the preceding Examples, further comprising selecting a plurality of light sources for the front-side light source and the back-side light source.

Example 57: The apparatus of any of the preceding Examples, wherein the front-side light source and the back-side light source are each located within a range from about 12 mm to about 75 mm away from a location of a face of the substrate.

Example 58: The apparatus of any one of Example 1 to Example 56, wherein the front-side light source and the back-side light source are each located within a range from about 25 mm to about 100 mm away from a location of a face of the substrate.

Example 59: A method for cleaning a substrate in a substrate cleaning mechanism, where the method includes mounting a substrate in the substrate cleaning mechanism; rotating the substrate at a first rotational-velocity; and impinging a light source onto a first face, a second face, and an edge or edges of the substrate to remove particles and organic contaminants from the substrate.

Example 60: The method of Example 59, wherein a beginning of impinging the light source onto the first face, the second face, and the edge or edges of the substrate occurs substantially simultaneously with rotating the substrate.

Example 61: The method of Example 59, wherein a beginning of impinging the light source onto the first face, the second face, and the edge or edges of the substrate occurs after beginning the rotating of the substrate.

Example 62: The method of Example 59, wherein a beginning of impinging the light source onto the first face, the second face, and the edge or edges of the substrate occurs before beginning the rotating of the substrate.

Example 63: The method of any one of Example 59 to Example 62, wherein the impinging of the light source onto the first face, the second face, and the edge or edges of the substrate is a continuous impingement.

Example 64: The method of any one of Example 59 to Example 62, wherein the impinging of the light source onto the first face, the second face, and the edge or edges of the substrate is from a continuous light source.

Example 65: The method of any one of Example 59 to Example 62, wherein the impinging of the light source onto the first face, the second face, and the edge or edges of the substrate is from a pulsed light source.

Example 66: The method of any one of Example 59 to Example 65, further comprising spinning a first rotatable shield, which surrounds the substrate holder, at a first-shield rotational-velocity; and spinning a second rotatable shield, which surrounds the substrate holder, at a second-shield rotational-velocity.

Example 67: The method of Example 66, wherein first-shield rotational-velocity and the second-shield rotational-velocity are about the same as each other.

Example 68: The method of Example 66, wherein the first-shield rotational-velocity and the second-shield rotational-velocity are different from one another.

Example 69: The method of any one of Example 66 to Example 68, wherein a direction of the first-shield rotational-velocity and a direction of the second-shield rotational-velocity are the same as each other.

Example 70: The method of any one of Example 66 to Example 68, wherein a direction of the first-shield rotational-velocity and a direction of the second-shield rotational-velocity are different from one another.

Example 71: The method of any one of Example 59 to Example 70, wherein the front-side light source and the back-side light source each has a plurality of light sources operational as steady-state or pulsed emission sources.

Example 72: The method of Example 71, wherein the front-side light source and the back-side light source alternate between steady-state emissions and pulsed emissions.

Example 73: The method of any one of Example 59 to Example 72, further comprising introducing a gas to disperse within the substrate cleaning mechanism via gas dispersion mechanisms during the cleaning cycle comprising impinging a beam of light onto the substrate from at least one of at least one the front-side light source and the back-side light source.

Example 74: The method of any one of Example 59 to Example 72, further comprising introducing a gas to disperse within the substrate cleaning mechanism via gas dispersion mechanisms after the cleaning cycle comprising impinging a beam of light onto the substrate from at least one of at least one the front-side light source and the back-side light source.

Example 75: The method of either Example 74 or Example 75, wherein the high-purity gas is nitrogen, $N_2$.

Example 76: The method of any one of Example 59 to Example 75, further comprising evacuating effluents by various types of turbine blade mechanisms configured to withdraw effluents from the chamber.

What is claimed is:

1. A substrate cleaning apparatus, the apparatus comprising:
a substrate holder configured to hold and rotate a substrate at various speeds;
a front-side light source and a back-side light source, each of the front-side light source and the back-side light source being configured to clean respective sides of the substrate substantially concurrently and to remove particles and organic contaminants from the respective sides, each of the front-side light source and the back-side light source having an energy level that will clean the substrate of the particles and the organic contaminants and not cause damage to any surface of the substrate; and
at least one turbine disk coupled to the substrate holder and configured to remove effluents produced during a cleaning operation, the at least one turbine disk having a plurality of spaced-apart fins, each of the fins being separated from adjacent fins by an opening formed within and near a periphery of the turbine disk, the fins being arranged to evacuate the effluents away from both the substrate and a volume between an inner shield and an outer shield surrounding the substrate.

2. The substrate cleaning apparatus of claim 1, wherein the front-side light source and the back-side light source are each configured to form a beam of light across at least a radius of the substrate.

3. The substrate cleaning apparatus of claim 1, wherein the front-side light source and the back-side light source are each configured to form a spot of light on the substrate, the front-side light source and the back-side light source further being configured to move laterally and substantially parallel to the substrate while the substrate is rotating.

4. The substrate cleaning apparatus of claim 1, wherein a range of wavelengths for the front-side light source and the back-side light source is from about 172 nm to about 348 nm.

5. The substrate cleaning apparatus of claim 1, wherein a range of wavelengths for the front-side light source and the back-side light source is from about 150 nm to about 190 nm.

6. The substrate cleaning apparatus of claim 1, wherein at least one of the front-side light source and the back-side light source is configured to be projected as a continuous beam on the substrate.

7. The substrate cleaning apparatus of claim 1, wherein at least one of the front-side light source and the back-side light source is configured to be projected as a pulsed beam on the substrate.

8. The substrate cleaning apparatus of claim 1, wherein at least one of the front-side light source and the back-side light source is configured to clean an edge of the substrate substantially concurrently with the respective sides of the substrate.

9. The substrate cleaning apparatus of claim 1, wherein the substrate holder is configured to hold the substrate vertically.

10. The apparatus of claim 1, further comprising an outer chamber to contain process effluents created during a cleaning process.

11. The apparatus of claim 1, wherein each of the front-side light source and the back-side light source comprises a laser.

12. The apparatus of claim 1, wherein each of the front-side light source and the back-side light source comprises an excimer lamp.

13. The apparatus of claim 1, wherein the front-side light source and the back-side light source each comprise an array of light sources.

14. The apparatus of claim 1, wherein the front-side light source and the back-side light source each include a plurality of light sources configured to irradiate an entire surface of the substrate concurrently.

15. The apparatus of claim 1, wherein the front-side light source and the back-side light source are each located within a range from about 12 mm to about 75 mm away from a location of a face of the substrate.

16. The apparatus of claim 1, wherein the front-side light source and the back-side light source are each located within a range from about 25 mm to about 100 mm away from a location of a face of the substrate.

17. A method for cleaning a substrate in a substrate-cleaning mechanism, the method comprising:
mounting a substrate in a substrate holder of the substrate-cleaning mechanism;
rotating the substrate at a first rotational-velocity;
selecting an energy level for one or more light source to clean the substrate and to remove particles and organic contaminants from the substrate and not cause damage to any surface of the substrate;
impinging the one or more light sources onto at least one of a first face and a second face of the substrate by at least a front-side light source and a back-side light source to remove particles and organic contaminants from the substrate;
spinning at least one turbine disk coupled to the substrate holder, the at least one turbine disk being configured to remove effluents produced during a cleaning operation, the at least one turbine disk having a plurality of spaced-apart fins, each of the fins being separated from adjacent fins by an opening formed within and near a periphery of the turbine disk; and
evacuating the effluents away through the plurality of spaced-apart fins from both the substrate and a volume between an inner shield and an outer shield surrounding the substrate.

18. The method of claim 17, further comprising selecting the energy level by pre-determining a photon-energy level imparted by each of the front-side light source and the back-side light source.

19. The method of claim 17, further comprising pumping the substrate cleaning mechanism to vacuum.

20. The method of claim 17, further comprising:
moving at least one of the front-side light source and the back-side light source laterally and substantially parallel to the substrate; and
continuing to rotate the substrate.

21. The method of claim 17, further comprising:
spinning the inner shield at an inner-shield rotational-velocity; and
spinning the outer shield at an outer-shield rotational-velocity.

22. The method of claim 17, further comprising impinging the one or more light sources onto an edge of the substrate.

23. The method of claim 17, further comprising holding the substrate in the substrate holder substantially vertically.

* * * * *